sulant, and second TIVs. The second die is stacked on the

(12) United States Patent
Chen et al.

(10) Patent No.: US 11,373,981 B2
(45) Date of Patent: Jun. 28, 2022

(54) PACKAGE AND MANUFACTURING METHOD THEREOF

(71) Applicant: Taiwan Semiconductor Manufacturing Co., Ltd., Hsinchu (TW)

(72) Inventors: Ming-Fa Chen, Taichung (TW); Sung-Feng Yeh, Taipei (TW); Jian-Wei Hong, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 62 days.

(21) Appl. No.: 16/786,969

(22) Filed: Feb. 10, 2020

(65) Prior Publication Data

US 2021/0066248 A1 Mar. 4, 2021

Related U.S. Application Data

(60) Provisional application No. 62/892,550, filed on Aug. 28, 2019.

(51) Int. Cl.
*H01L 25/065* (2006.01)
*H01L 23/60* (2006.01)
*H01L 21/683* (2006.01)
*H01L 23/00* (2006.01)
*H01L 25/00* (2006.01)

(52) U.S. Cl.
CPC ...... *H01L 25/0657* (2013.01); *H01L 21/6835* (2013.01); *H01L 23/60* (2013.01); *H01L 24/08* (2013.01); *H01L 24/80* (2013.01); *H01L 25/50* (2013.01); *H01L 2221/68331* (2013.01); *H01L 2224/08146* (2013.01); *H01L 2224/80006* (2013.01); *H01L 2224/8013* (2013.01); *H01L 2224/80895* (2013.01); *H01L 2224/80896* (2013.01); *H01L 2225/06524* (2013.01); *H01L 2225/06527* (2013.01); *H01L 2225/06541* (2013.01); *H01L 2225/06548* (2013.01); *H01L 2225/06586* (2013.01); *H01L 2225/06593* (2013.01); *H01L 2924/30205* (2013.01)

(58) Field of Classification Search
CPC ............. H01L 25/0657; H01L 21/6835; H01L 2225/06548; H01L 2224/08146
See application file for complete search history.

(56) References Cited

U.S. PATENT DOCUMENTS

| 8,993,380 | B2 | 3/2015 | Hou et al. |
| 9,281,254 | B2 | 3/2016 | Yu et al. |
| 9,299,649 | B2 | 3/2016 | Chiu et al. |

(Continued)

*Primary Examiner* — Dale E Page
*Assistant Examiner* — Wilner Jean Baptiste
(74) *Attorney, Agent, or Firm* — JCIPRNET

(57) ABSTRACT

A package includes a first die, a second die, a first encapsulant, first through insulating vias (TIV), a second encapsulant, and second TIVs. The second die is stacked on the first die. The first encapsulant laterally encapsulates the first die. The first TIVs are aside the first die. The first TIVs penetrate through the first encapsulant and are electrically floating. The second encapsulant laterally encapsulates the second die. The second TIVs are aside the second die. The second TIVs penetrate through the second encapsulant and are electrically floating. The second TIVs are substantially aligned with the first TIVs.

20 Claims, 44 Drawing Sheets

(56) References Cited

U.S. PATENT DOCUMENTS

| | | |
|---|---|---|
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 2016/0155724 A1* | 6/2016 | Kim et al. .......... H01L 25/0657 |
| 2018/0315620 A1* | 11/2018 | Lee et al. ................ H01L 21/50 |
| 2020/0365488 A1* | 11/2020 | Yu ........................... H01L 25/18 |

* cited by examiner

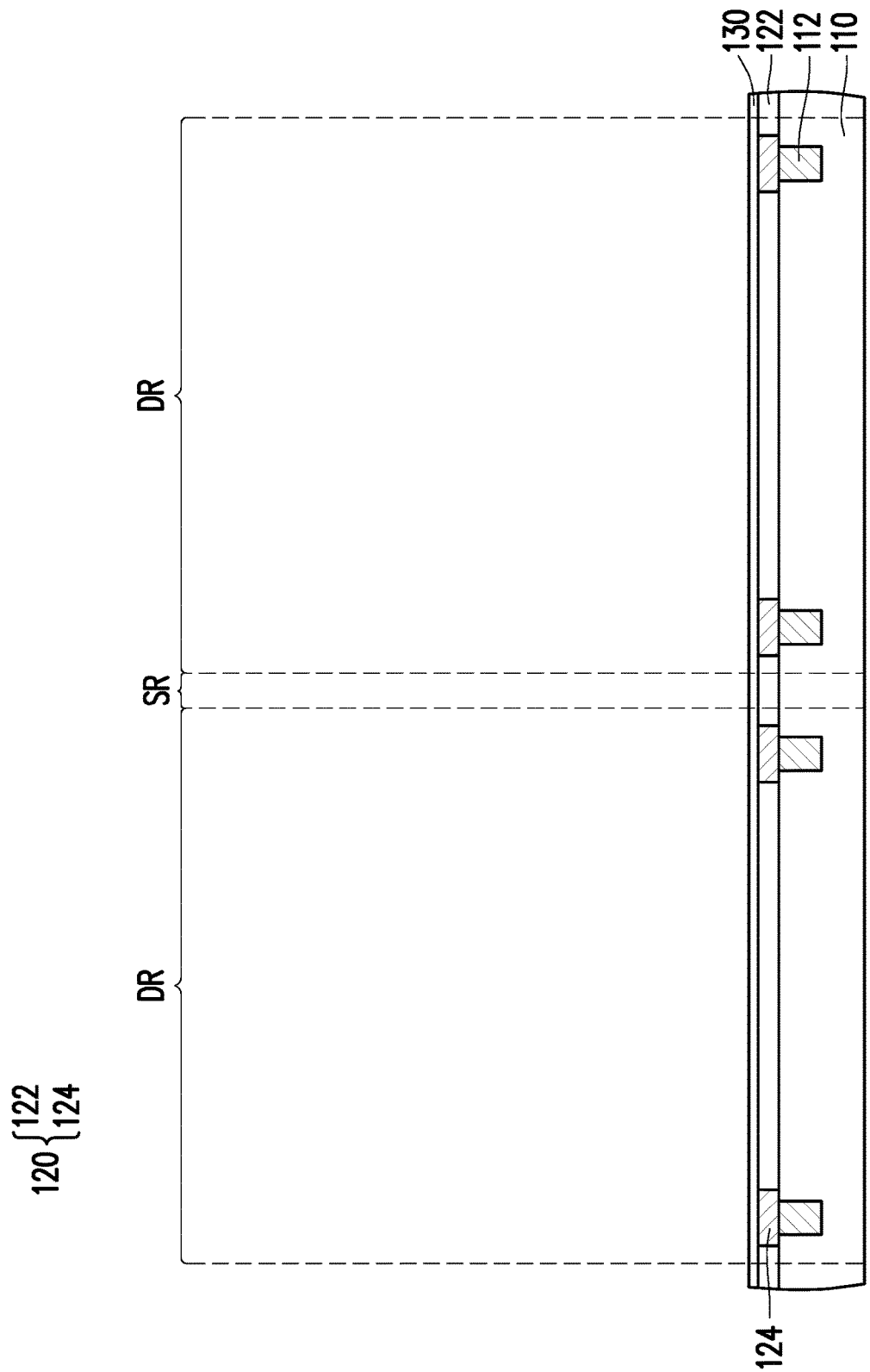

FIG. 3E

PACKAGE AND MANUFACTURING METHOD THEREOF

CROSS-REFERENCE TO RELATED APPLICATION

This application claims the priority benefit of U.S. provisional application Ser. No. 62/892,550, filed on Aug. 28, 2019. The entirety of the above-mentioned patent application is hereby incorporated by reference herein and made a part of this specification.

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices or dies at the wafer level, and various technologies and applications have been developed for the wafer level packaging. Integration of multiple semiconductor devices has become a challenge in the field.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A to FIG. 3E are schematic cross-sectional views illustrating a manufacturing process of a package in accordance with some alternative embodiments of the disclosure.

DETAILED DESCRIPTION

Figure 1B:
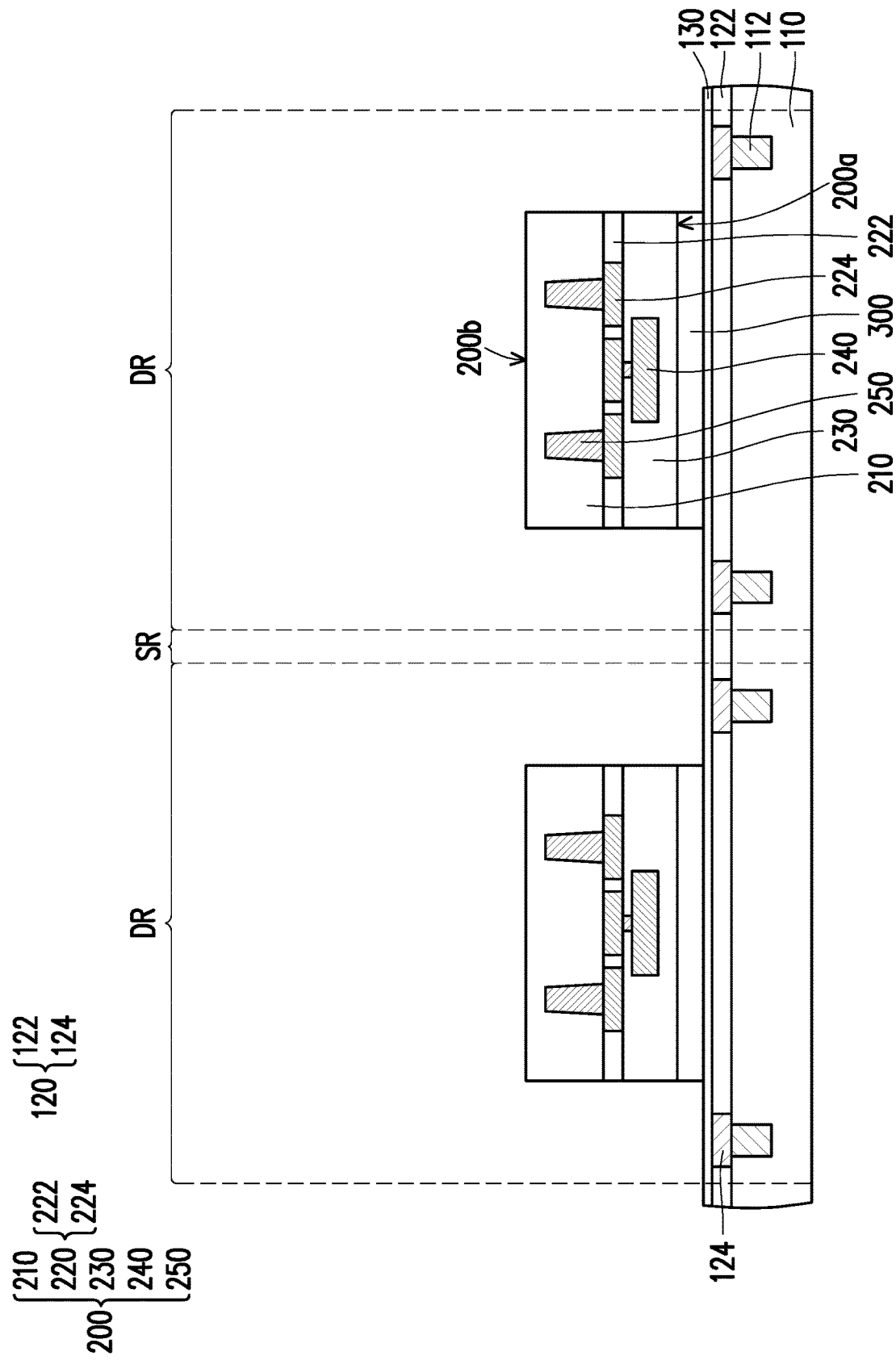
FIG. 1A to FIG. 1P are schematic cross-sectional views illustrating a manufacturing process of a package in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1C:
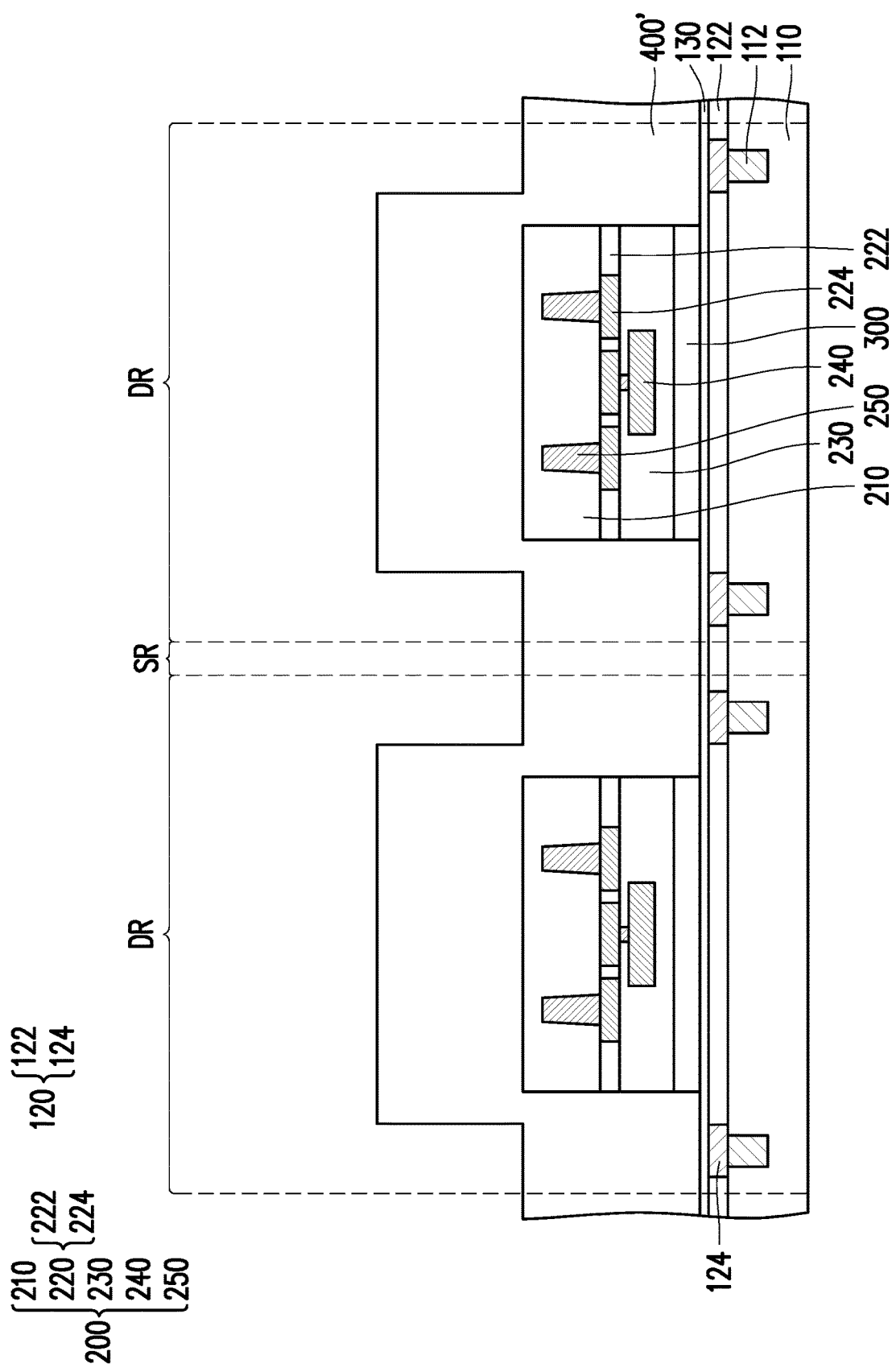
Figure 1D:
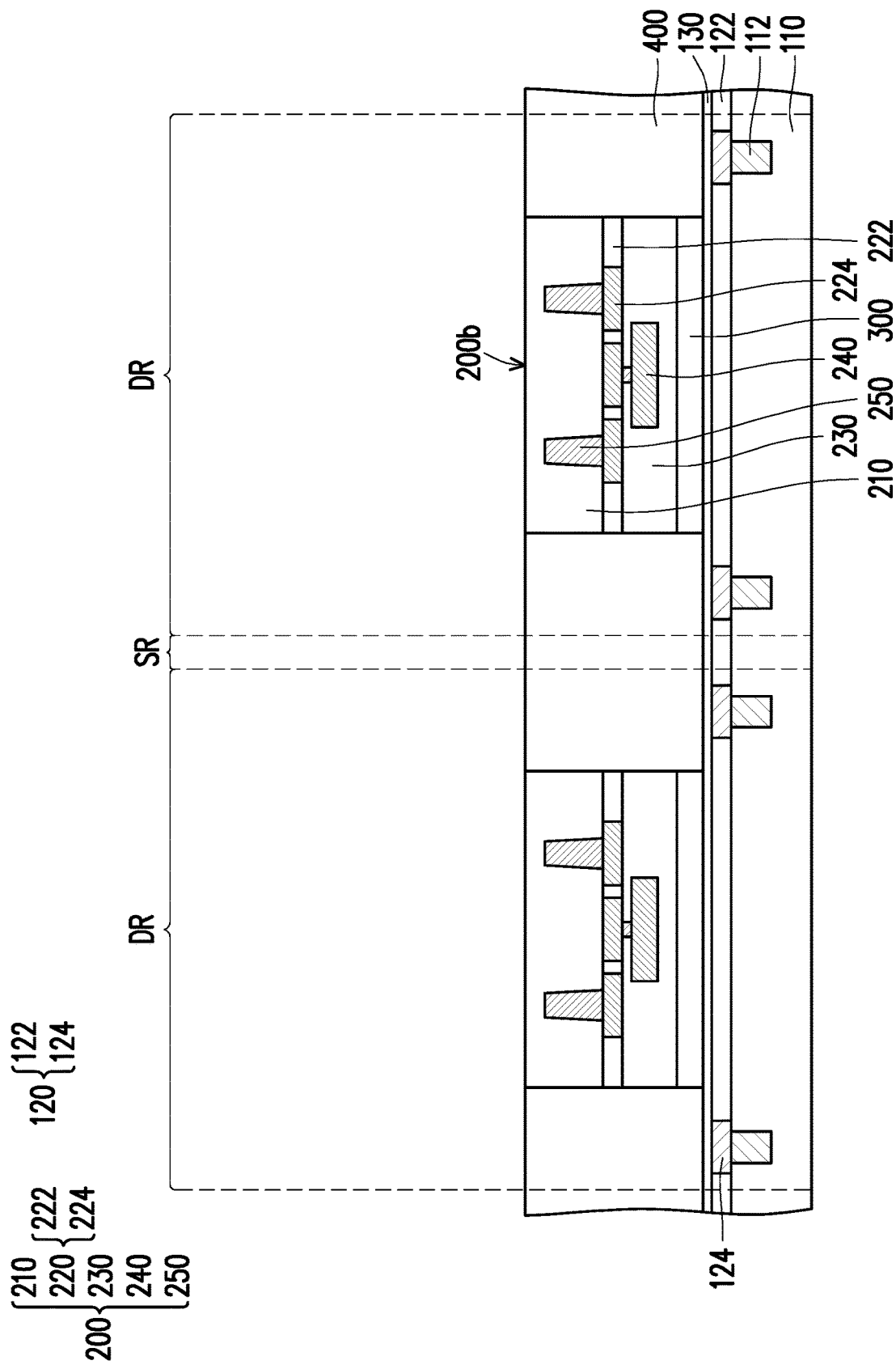
Figure 1E:
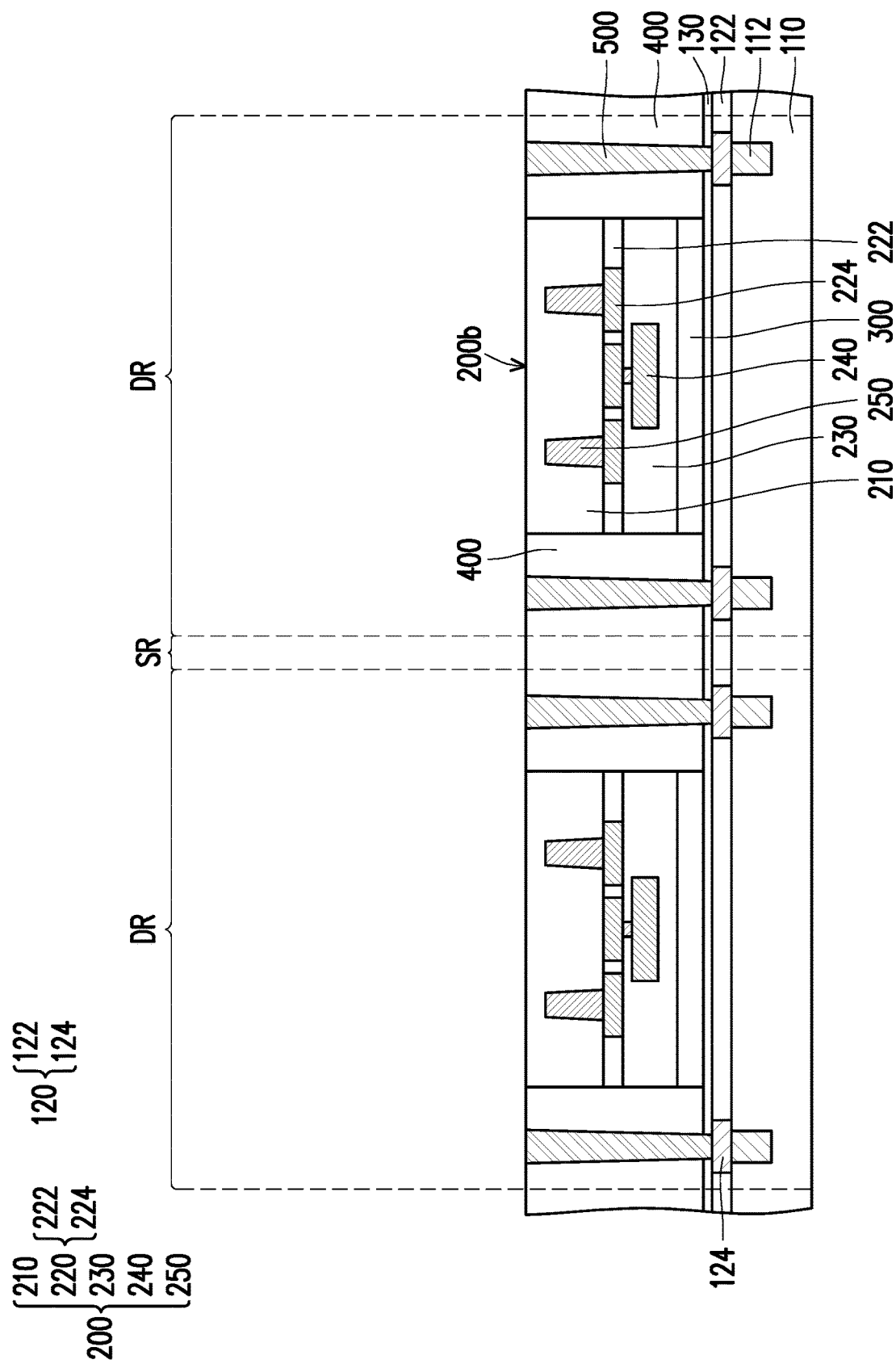
Figure 1F:
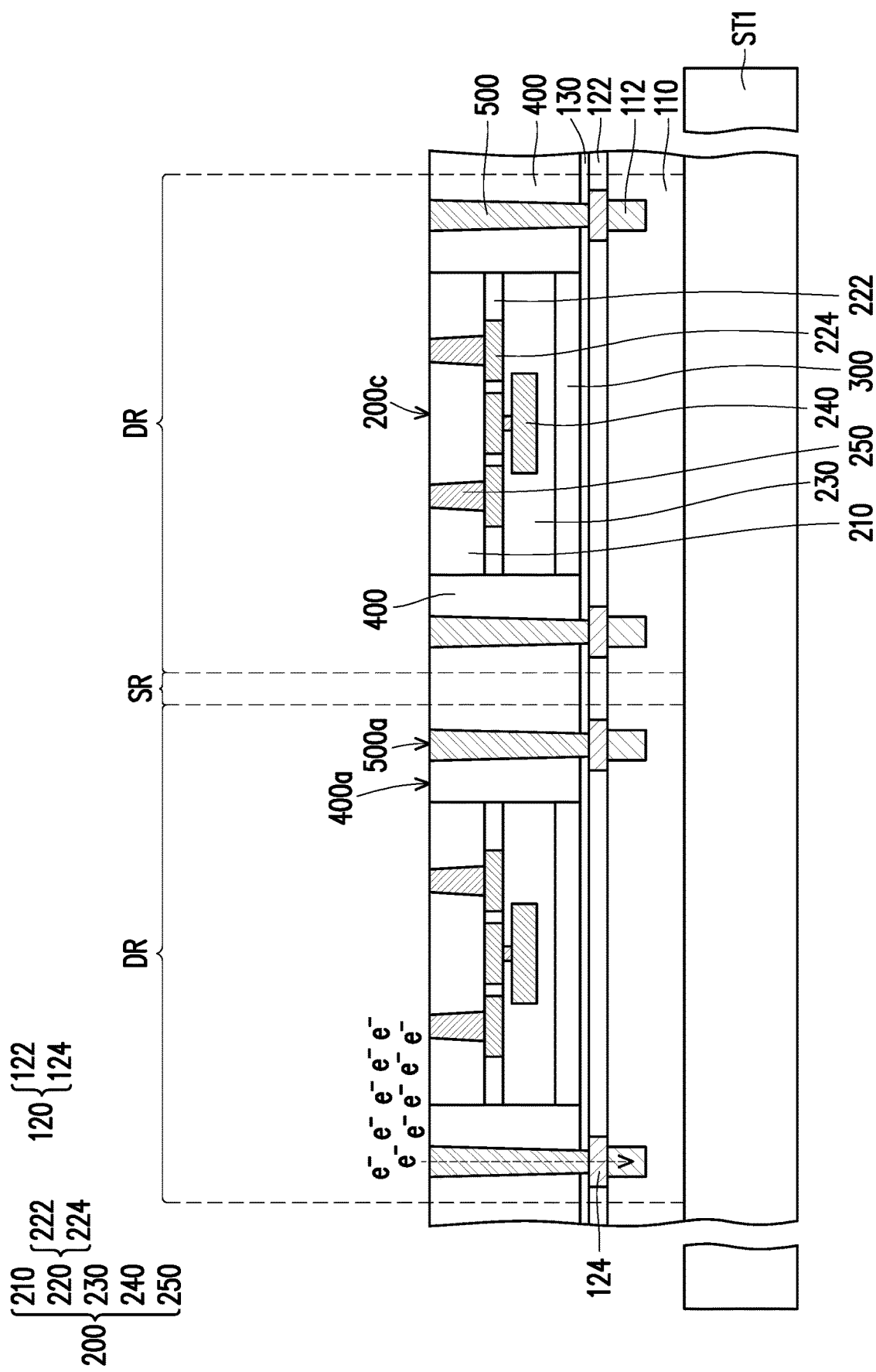
Figure 1G:
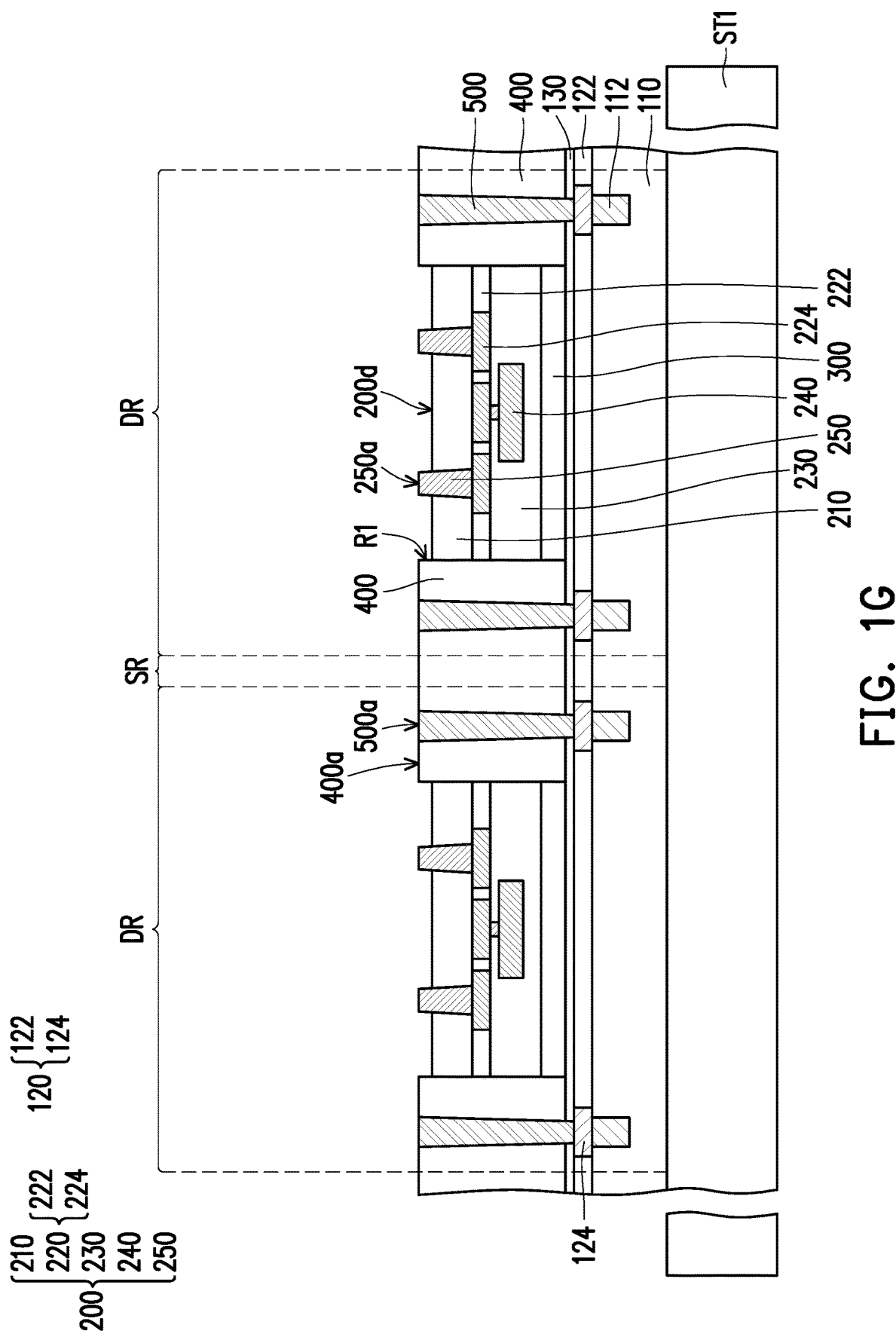
Figure 1H:
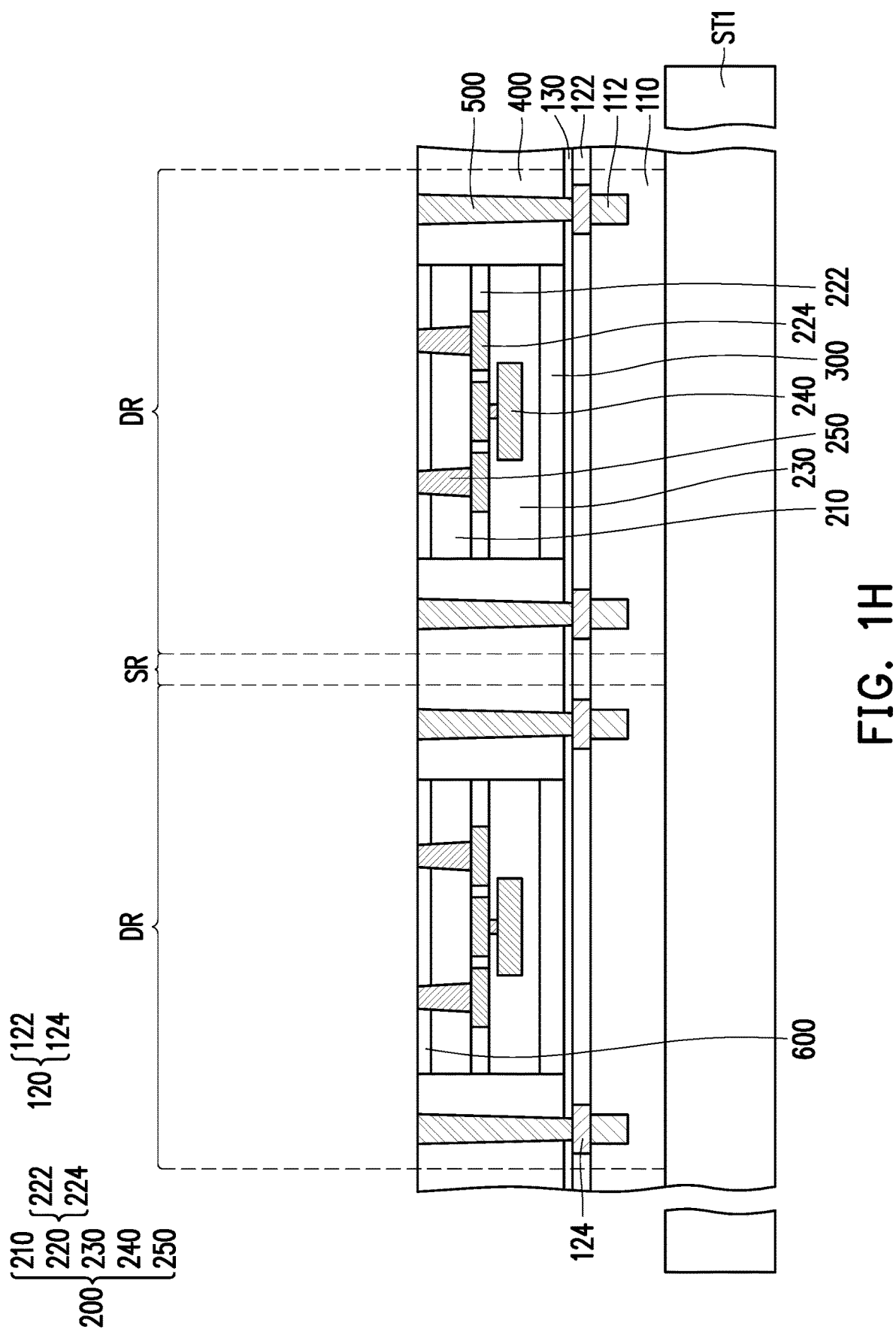
Figure 1I:
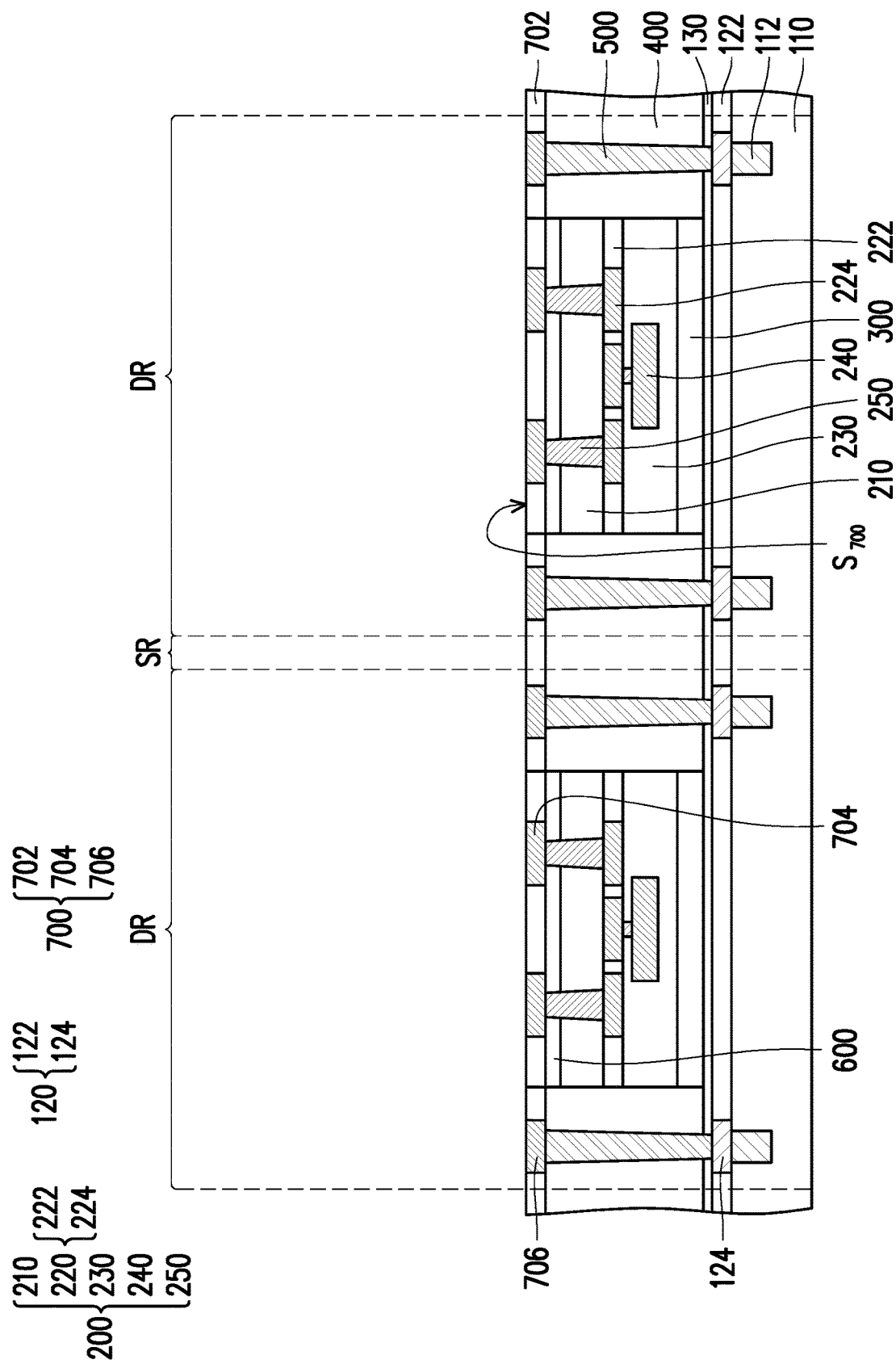
Figure 1J:
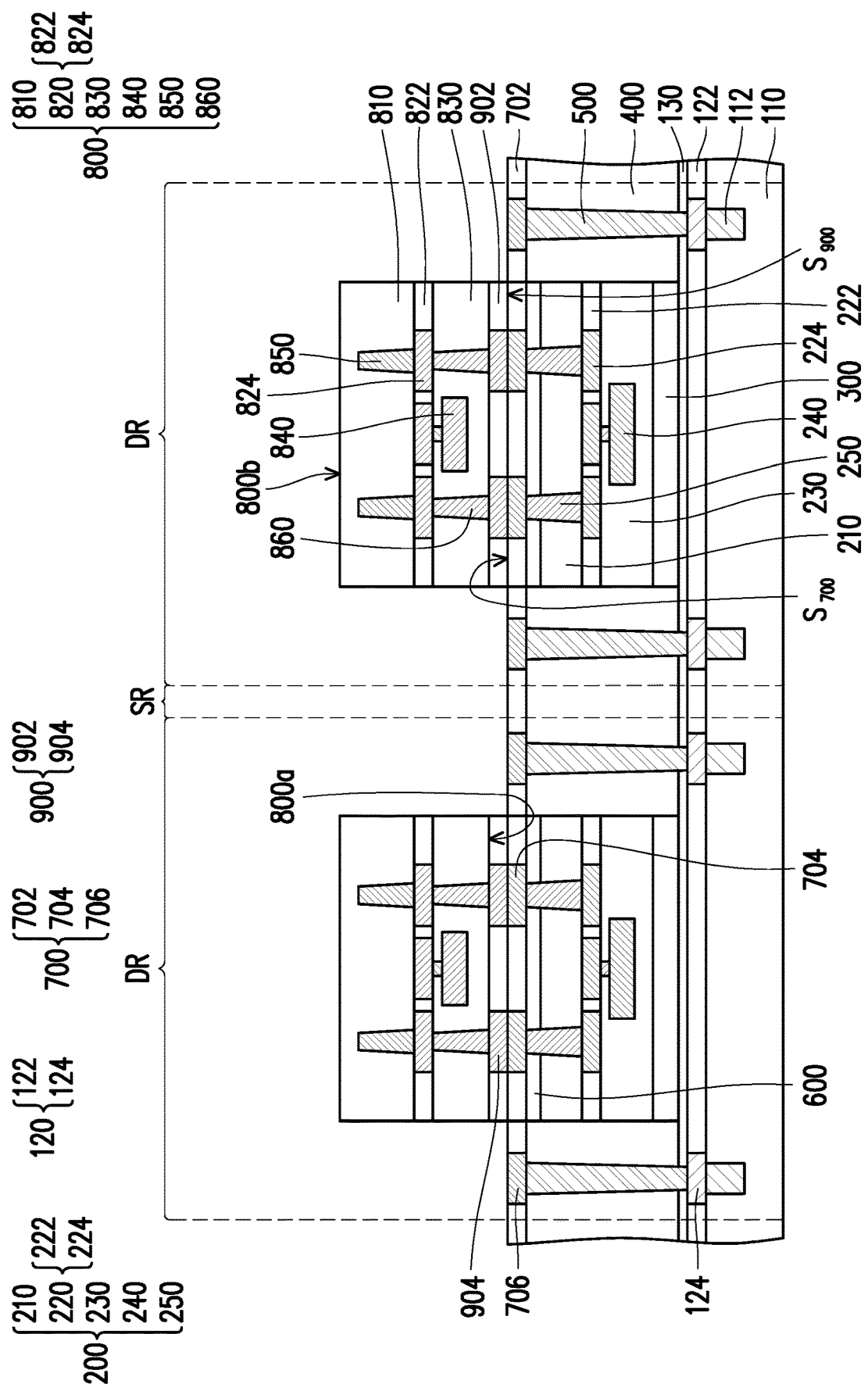
Figure 1K:
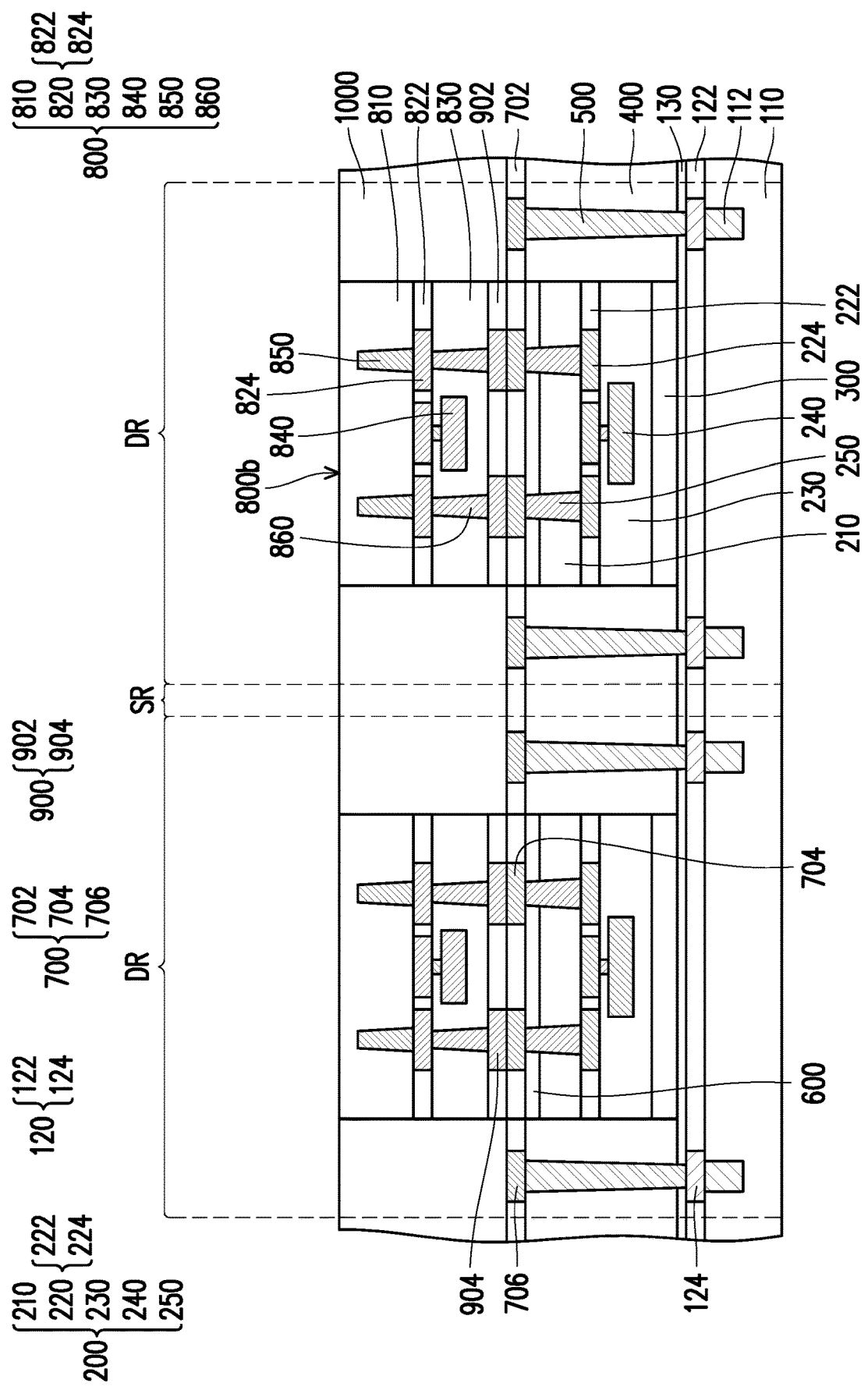
Figure 1L:
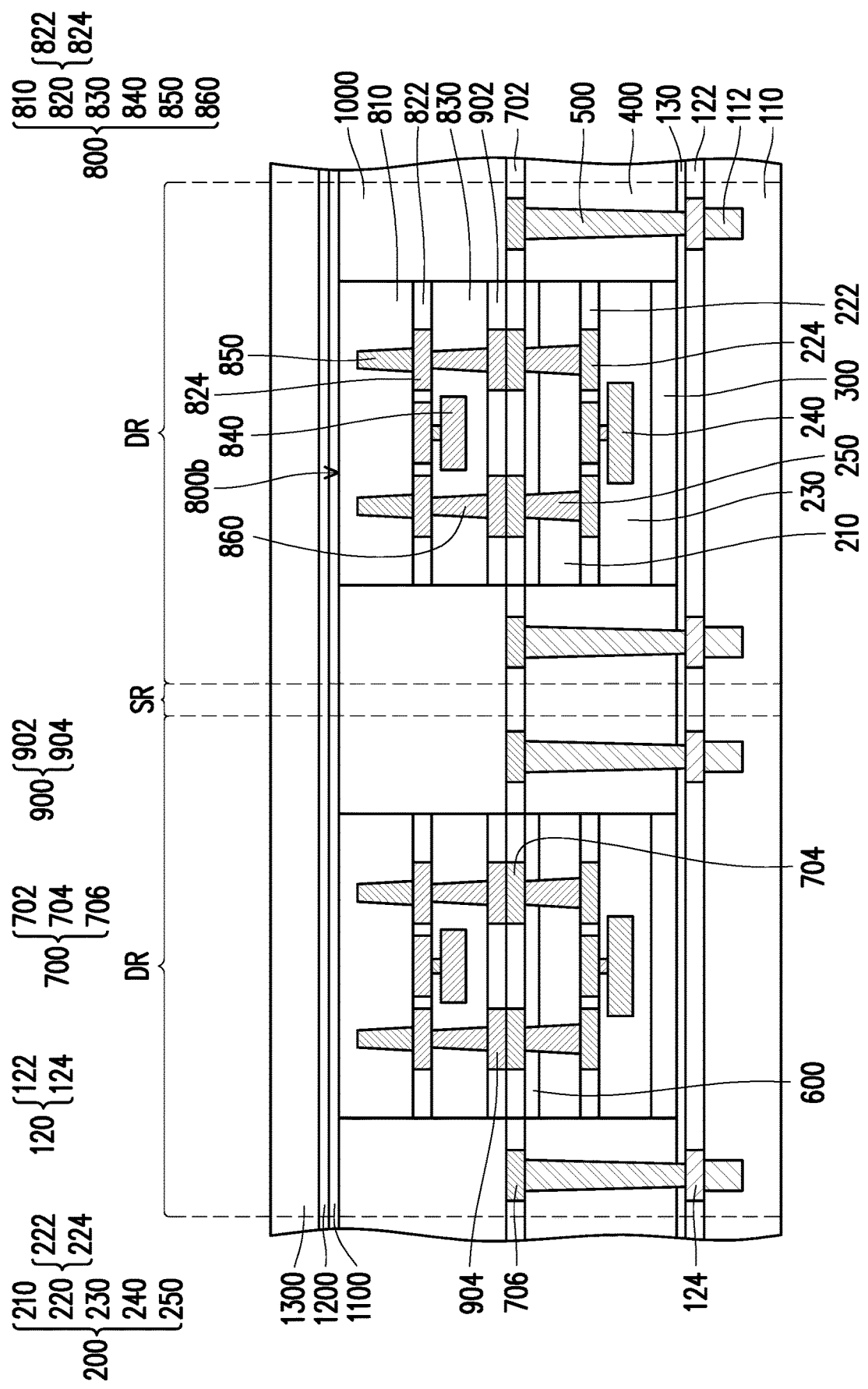
Figure 1M:
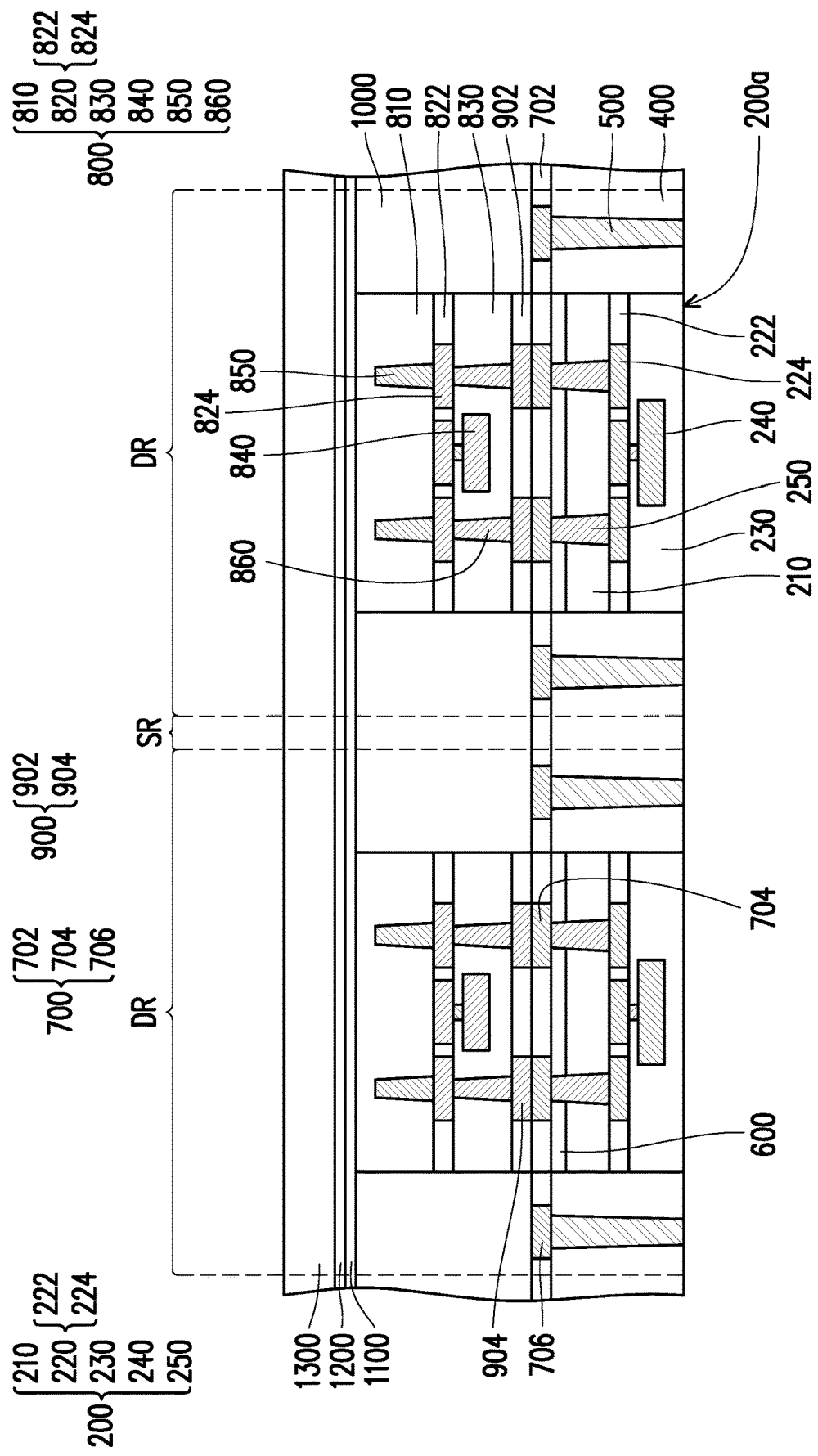
Figure 1N:
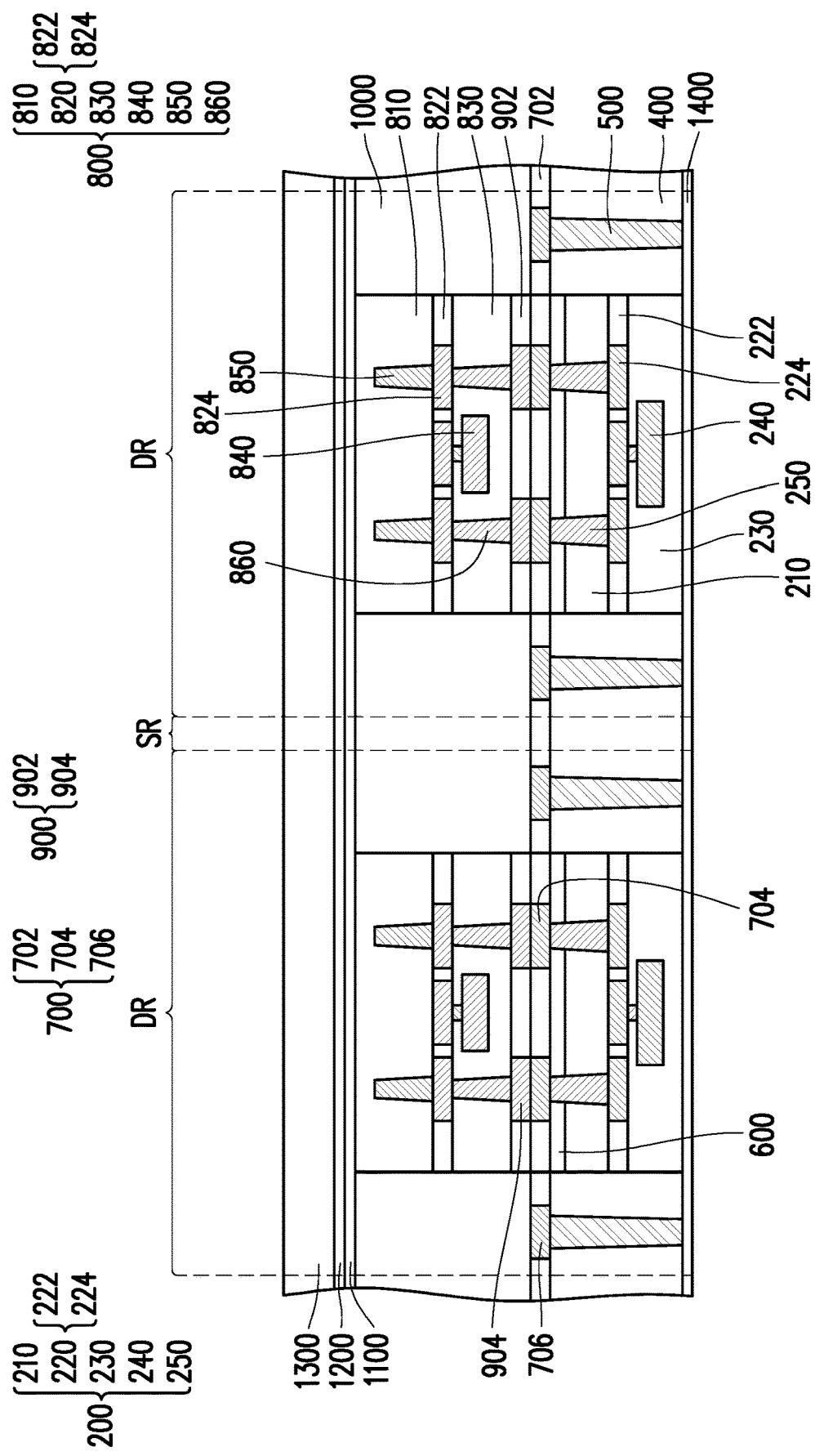
Figure 10:
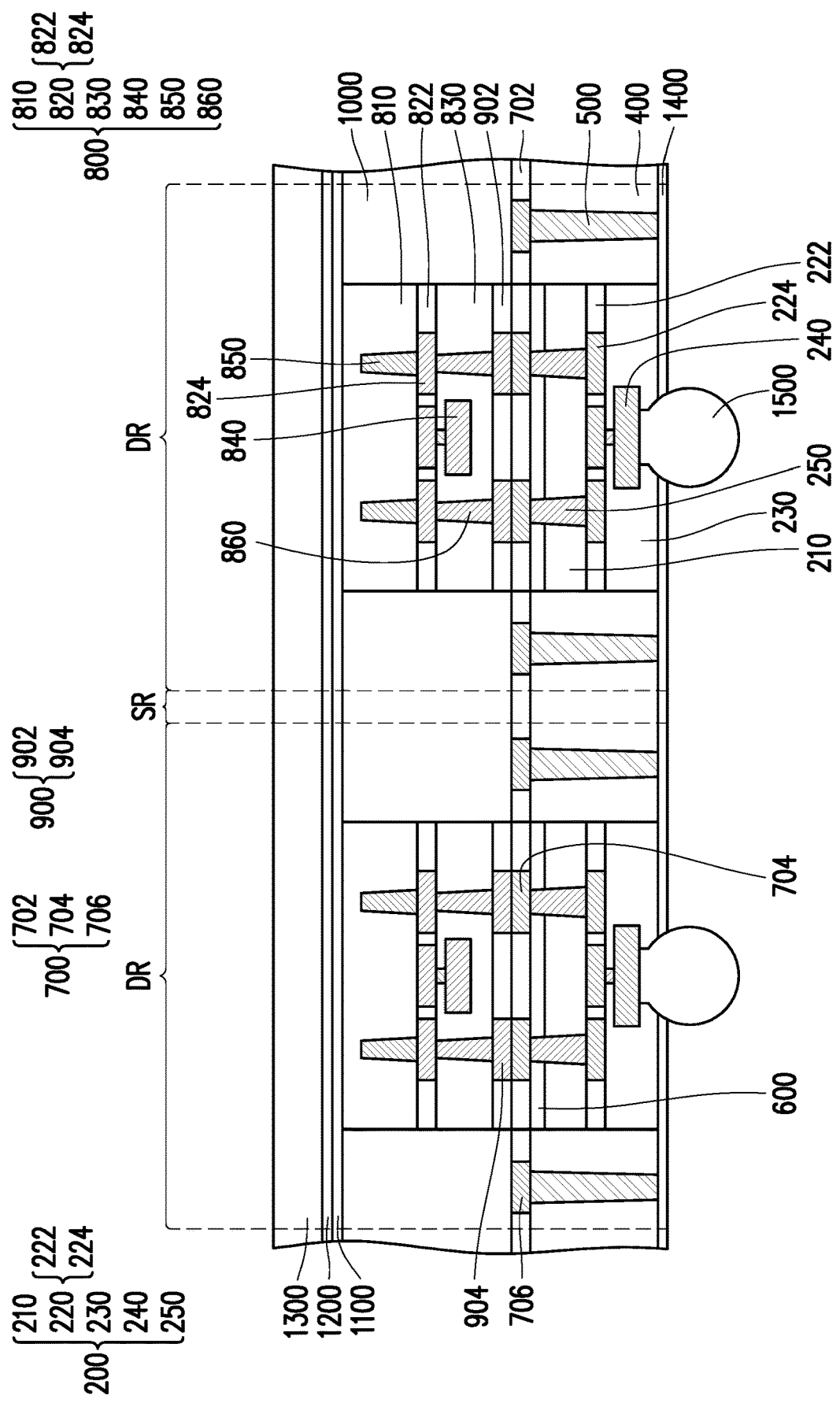
Figure 1P:
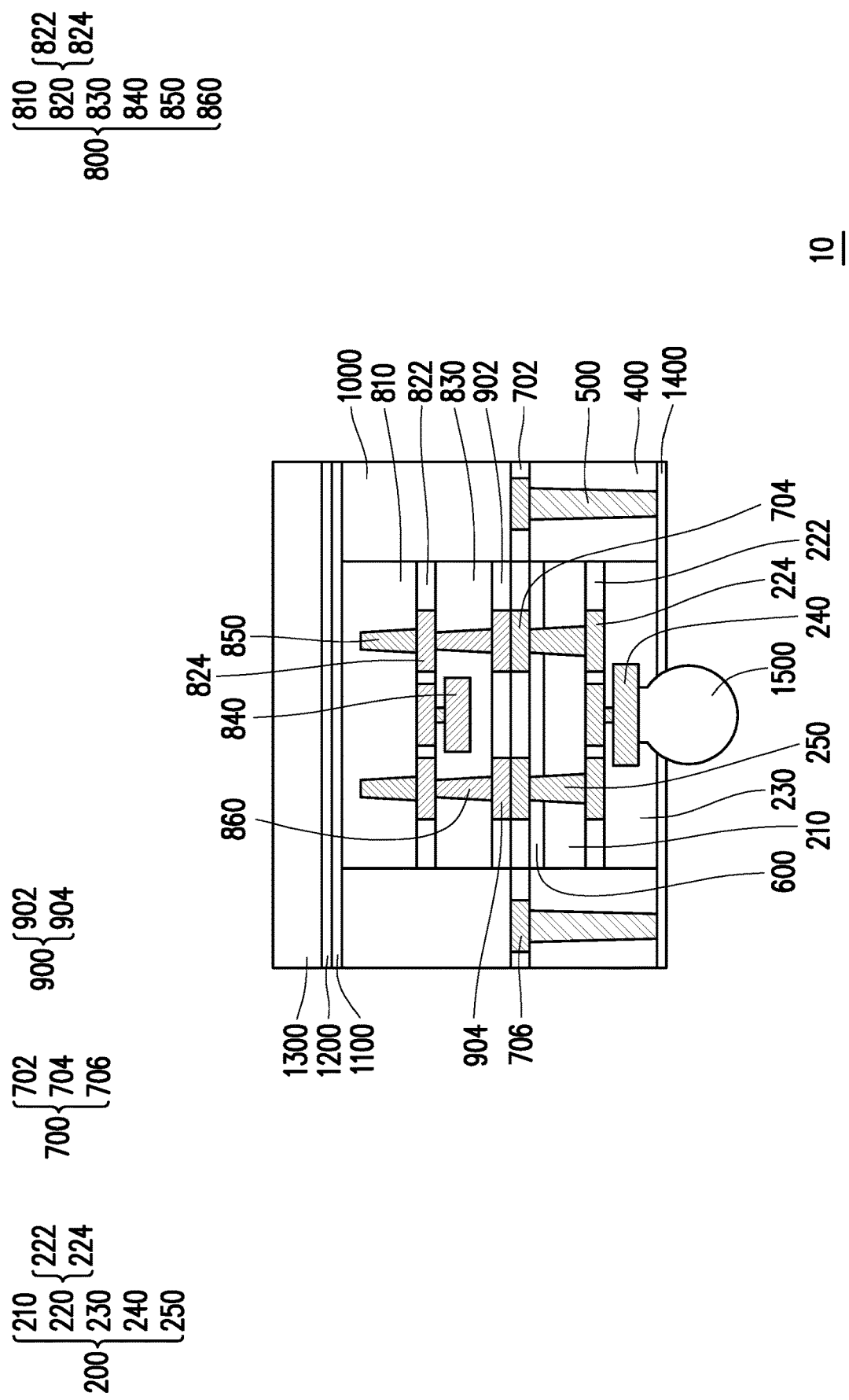

FIG. 1A to FIG. 1P are schematic cross-sectional views illustrating a manufacturing process of a package 10 in accordance with some embodiments of the disclosure. Referring to FIG. 1A, a semiconductor carrier 110 is provided. In some embodiments, the semiconductor carrier 110 may be made of a suitable elemental semiconductor, such as crystalline silicon, diamond, or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. In some embodiments, the semiconductor carrier 110 is free of active components and passive components. In some embodiments, the semiconductor carrier 110 has a plurality of die regions DR and a plurality of scribe line regions SR. Each scribe lien region SR is located between two adjacent die regions DR. For simplicity, two die regions DR and one scribe line region SR is illustrated in FIG. 1A.

In some embodiments, a plurality of contact vias 112 are embedded in the semiconductor carrier 110. In some embodiments, the contact vias 112 are made of metal. For example, the contact vias 112 may include aluminum, titanium, copper, nickel, tungsten, and/or alloys thereof. As illustrated in FIG. 1A, the contact vias 112 are located in the die regions DR. In some embodiments, top surfaces of the contact vias 112 are coplanar with a top surface of the semiconductor carrier 110. In some embodiments, the contact vias 112 are electrically grounded. For example, the contact vias 112 are electrically connected to a ground voltage. In some embodiments, the contact vias 112 are directly in contact with the semiconductor carrier 110. For example, sidewalls and bottom surfaces of the contact vias 112 are directly in contact with the semiconductor carrier 110.

As illustrated in FIG. 1A, an alignment layer 120 and a dielectric layer 130 are sequentially formed over the semiconductor carrier 110. In some embodiment, the alignment layer 120 includes a dielectric layer 122 and a plurality of alignment marks 124 embedded in the dielectric layer 122. For example, the dielectric layer 122 surrounds the alignment marks 124. In some embodiments, the dielectric layer 122 may be formed by suitable fabrication techniques, such as vapor deposition, spin coating, atomic layer deposition (ALD), thermal oxidation, some other suitable deposition or growth process, or a combination thereof. The vapor deposition may include, for example, chemical vapor deposition (CVD), physical vapor deposition (PVD), some other suitable vapor deposition process, or a combination thereof. In some embodiments, materials of the dielectric layer 122 may be polyimide, polybenzoxazole (PBO), benzocyclobutene (BCB), a nitride such as silicon nitride, an oxide such as silicon oxide, undoped silicate glass (USG), phosphosilicate glass (PSG), borosilicate glass (BSG), boron-doped phosphosilicate glass (BPSG), a combination thereof, or the like. In some embodiments, the alignment marks 124 may be a patterned copper layer or other suitable patterned metal layer. In some embodiments, the alignment marks 124 may be formed by electroplating or deposition. It should be noted that the shapes and numbers of the alignment marks 124 are not limited in the disclosure, and may be altered based on the demand and/or design layout. In some embodiments, a top surface of the dielectric layer 122 is substantially levelled with top surfaces of the alignment marks 124. As illustrated in FIG. 1A, the alignment marks 124 are directly in contact with the contact vias 112. In some embodiments, the alignment marks 124 are electrically connected to the contact vias 112. For example, the alignment marks 124 are electrically grounded through the contact vias 112.

In some embodiments, the dielectric layer 130 is a smooth layer having a continuous even surface and overlaid on the dielectric layer 122 and the alignment marks 124. In some embodiments, a material of the dielectric layer 130 may include silicon oxynitride (SiON), silicon oxide, silicon nitride, or the like. In some embodiments, the dielectric layer 130 may be formed by deposition or the like. In some embodiments, the dielectric layer 130 has a substantially uniform and even thickness.

Referring to FIG. 1B, a plurality of dies 200 are placed over the semiconductor carrier 110. In some embodiments, each die 200 includes a semiconductor substrate 210, an interconnection structure 220, a passivation layer 230, a conductive pad 240, and a plurality of through semiconductor vias (TSV) 250. In some embodiments, the interconnection structure 220 is disposed on the semiconductor substrate 210. The semiconductor substrate 210 may be made of a suitable elemental semiconductor, such as crystalline silicon, diamond, or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. In some embodiments, the semiconductor substrate 210 may include active components (e.g., transistors or the like) and/or passive components (e.g., resistors, capacitors, inductors, or the like) formed therein.

In some embodiments, the interconnection structure 220 includes an inter-dielectric layer 222 and a plurality of conductive patterns 224 embedded in the inter-dielectric layer 222. In some embodiments, the conductive patterns 224 of the interconnection structure 220 are electrically connected to the active components and/or the passive components embedded in the semiconductor substrate 210. In some embodiments, a material of the inter-dielectric layers 222 includes polyimide, epoxy resin, acrylic resin, phenol resin, BCB, PBO, combinations thereof, or other suitable dielectric materials. The inter-dielectric layers 222 may be formed by suitable fabrication techniques, such as spin-on coating, lamination, CVD, or the like. In some embodiments, a material of the conductive patterns 224 includes aluminum, titanium, copper, nickel, tungsten, and/or alloys thereof. The conductive patterns 224 may be formed by, for example, electroplating, deposition, and/or photolithography and etching. For simplicity, the interconnection structure 220 is illustrated as having one layer of inter-dielectric layer 222 and one layer of conductive patterns 224 in FIG. 1B. However, the disclosure is not limited thereto. In some alternative embodiments, the number of the layer of the inter-dielectric layer 222 and the number of the layer of the conductive patterns 224 may be adjusted depending on the routing requirements. For example, multiple layers of the inter-dielectric layer 222 and multiple layers of the conductive patterns 224 may be presented in the interconnection structure 220, and the conductive patterns 224 and the inter-dielectric layers 222 may be stacked alternately.

In some embodiments, the conductive pad 240 is disposed over the interconnection structure 220. In some embodiments, the conductive pad 240 is electrically connected to the conductive patterns 224 of the interconnection structure 220. In some embodiments, the conductive pad 240 is used to establish electrical connection with other components (not shown) or dies (not shown) subsequently formed or provided. In some embodiments, the conductive pad 240 may be aluminum pads, copper pads, or other suitable metal pads. It should be noted that the number and shape of the conductive pad 240 may be selected based on demand.

In some embodiments, the passivation layer 230 is formed over the interconnection structure 220 to seal the conductive pad 240. In some embodiments, a material of the passivation layer 230 includes oxides, such as silicon oxide or the like. Alternatively, the passivation layer 230 may include polyimide, epoxy resin, acrylic resin, phenol resin, BCB, PBO, or any other suitable polymer-based dielectric material. The passivation layer 230, for example, may be formed by suitable fabrication techniques, such as spin-on coating, CVD, PECVD, or the like. In some embodiments, the TSVs 250 are embedded in the semiconductor substrate 210. In some embodiments, the TSVs 250 are directly in contact with the conductive patterns 224 to render electrical connection with the interconnection structure 220.

In some embodiments, the dies 200 may be capable of performing logic functions. For example, the dies 200 may be Central Process Unit (CPU) dies, Graphic Process Unit (GPU) dies, Field-Programmable Gate Array (FPGA), or the like.

In some embodiments, each die 200 has an active surface 200a and a rear surface 200b opposite to the active surface 200a. In some embodiments, prior to the placement of the dies 200, a bonding layer 300 is formed on the active surface 200a of each die 200. For example, the bonding layer 300 is formed on the passivation layer 230 of the die 200. In some embodiments, the bonding layer 300 is a smooth layer having a continuous even surface. In some embodiments, a material of the bonding layer 300 may include silicon oxynitride (SiON), silicon oxide, silicon nitride or the like, and the bonding layer 300 may be formed by deposition or the like.

In some embodiments, the dies 200 having the bonding layer 300 formed thereon are picked-and-placed onto the dielectric layer 130 such that the bonding layer 300 is adhered to the dielectric layer 130 through fusion bonding. The fusion bonding process may include a hydrophilic fusion bonding process, where a workable temperature is approximately greater than or substantially equal to about 100° C. and a workable pressure is approximately greater than or substantially equal to about 1 kg/cm$^2$. In some embodiments, the fusion bonding process does not involve metal to metal bonding. As illustrated in FIG. 1B, the dies 200 are bonded to the semiconductor carrier 110 in a face down manner. That is, the active surfaces 200a of the dies 200 face the semiconductor carrier 110. In some embodiments, the dies 200 are placed in the die regions DR. For example, the dies 200 are arranged in an array.

Referring to FIG. 1C, an encapsulant material 400' is formed over the dielectric layer 130 to conformally cover the dies 200. In some embodiments, the encapsulant material 400' includes a molding compound, a polymeric material, such as polyimide, epoxy resin, acrylic resin, phenol resin, BCB, PBO, a combination thereof, or other suitable polymer-based dielectric materials. In some alternative embodiments, the encapsulant material 400' may include silicon oxide and/or silicon nitride. In some embodiments, the encapsulant material 400' further includes fillers. Alternatively, the encapsulant material 400' may be free of fillers. In some embodiments, the encapsulant material 400' may be formed by a molding process (such as a compression molding process), a spin-coating process, a CVD process, a PECVD process, an ALD process, or the like. As illustrated in FIG. 1C, the dies 200 are not revealed and are well protected by the encapsulant material 400'.

Referring to FIG. 1C and FIG. 1D, the encapsulant material 400' is thinned to form an encapsulant 400. That is, the encapsulant material 400' is thinned until the semiconductor substrates 210 of the dies 200 are exposed. As illustrated in FIG. 1D, the dielectric layer 130 is sandwiched between the alignment layer 120 and the encapsulant 400. In some embodiments, after the semiconductor substrates 210 are revealed, the semiconductor substrates 210 and the encapsulant 400 may be further thinned to reduce the overall thickness of the dies 200. In some embodiments, the encapsulant material 400' and the semiconductor substrates 210 may be thinned or planarized through a grinding process, such as a mechanical grinding process, a chemical mechanical polishing (CMP) process, or the like. In some embodiments, the encapsulant 400 laterally encapsulates the dies 200. That is, rear surfaces 200b of the dies 200 are substantially coplanar with a top surface of the encapsulant 400 and the encapsulant 400 covers sidewalls of the dies 200. In some embodiments, the encapsulant 400 may be referred to as "gap fill oxide."

Referring to FIG. 1E, a plurality of through insulating vias (TIV) 500 are formed in the encapsulant 400 and the dielectric layer 130. In some embodiments, the TIVs 500 are formed aside the dies 200. In some embodiments, the TIVs 500 penetrate through the encapsulant 400 and the dielectric layer 130 to be in direct contact with the alignment marks 124. That is, the alignment marks 124 are located between the TIVs 500 and the contact vias 112. In some embodiments, the TIVs 500 are electrically connected to the alignment marks 124 and the contact vias 112. In other words, the TIVs 500 are electrically grounded through the alignment marks 124 and the contact vias 112. In some embodiments, a material of the TIVs 500 includes aluminum, titanium, copper, nickel, tungsten, and/or alloys thereof. In some embodiments, the TIVs 500 may be formed by the following steps. First, a laser drilling or an etching process is performed on the encapsulant 400 and the dielectric layer 130 to form a plurality of openings (not shown). The openings expose at least a portion of each alignment mark 124. Thereafter, a plating process is performed to fill the openings, so as to form the TIVs 500.

Referring to FIG. 1E and FIG. 1F, the structure illustrated in FIG. 1E is placed on a thinning stage ST1. In some embodiment, the thinning stage ST1 may be electrically connected to a ground. Subsequently, the dies 200, the encapsulant 400, and the TIVs 500 are thinned until the TSVs 250 of the dies 200 are exposed. That is, the dies 200 are thinned from the rear surfaces 200b. In some embodiments, the dies 200, the encapsulant 400, and the TIVs 500 may be thinned or planarized through a grinding process, such as a mechanical grinding process, a CMP process, or the like. In some embodiments, after the TSVs 250 are exposed, the dies 200, the encapsulant 400, and the TIVs 500 may be further thinned to reduce the overall thickness of the dies 200. After the thinning process, rear surfaces 200c of the dies 200 are substantially coplanar with a top surface 400a of the encapsulant 400 and top surfaces 500a of the TIVs 500. As illustrated in FIG. 1F, after the thinning process, the TSVs 250 penetrate through the semiconductor substrates 210 of the dies 200.

In some embodiments, during the thinning process, electrons may be generated and accumulated at the grinding surface (i.e. the rear surfaces 200c of the dies 200, the top surface 400a of the encapsulant 400, and the top surfaces 500a of the TIVs 500). The accumulation of the electron would cause corrosion issues to the TSVs 250 and the TIVs 500. Nevertheless, since the TIVs 500 are electrically grounded, the TIVs 500 are able to create a path to deplete the accumulated electrons. In other words, the accumulated electron would be pulled down and travels sequentially through the TIVs 500 and the alignment marks 124 to arrive at the contact vias 112, as illustrated in FIG. 1F. The electrons in the contact vias 112 may be further transfer out of the structure. As such, the issue of corrosion derived from electron accumulation may be resolved.

Referring to FIG. 1G, a portion of each die 200 is removed to form a plurality of recesses R1. For example, a portion of the semiconductor substrate 210 of each die 200 is removed to form the recess R1. As illustrated in FIG. 1G, the TSVs 250 are partially located in the recesses R1. In some embodiments, at least a portion of each TSV 250 protrudes from the semiconductor substrates 210 of the dies 200. That is, top surfaces 250a of the TSVs 250, the top surface 400a of the encapsulant 400, and the top surfaces 500a of the TIVs 500 are located at a level height higher than rear surfaces 200d of the dies 200. In some embodiments, the semiconductor substrates 210 may be partially removed through an etching process. The etching process includes, for example, an isotropic etching process and/or an anisotropic etching process. For example, the semiconductor substrates 210 may be partially removed through a wet etching process, a drying etching process, or a combination thereof.

Referring to FIG. 1H, a protection layer 600 is formed to fill the recesses R1. In some embodiments, the protection layer 600 includes a molding compound, a molding underfill, or the like. Alternatively, the protection layer 600 may be made of a polymeric material, such as polyimide, epoxy resin, acrylic resin, phenol resin, BCB, PBO, or other suitable polymer-based dielectric materials. In some embodiments, the protection layer 600 may include fillers. Alternatively, the protection layer 600 may be free of fillers. As illustrated in FIG. 1H, the protruding portion of each TSV 250 is laterally encapsulated by the protection layer 600. In some embodiments, the protection layer 600 may be formed by the following steps. First, a protection material layer (not shown) is formed in the recesses R1 and over the encapsulant 400 and the TIVs 500. Subsequently, a grinding or thinning process is performed on the protection material layer until the TSVs 250 and the TIVs 500 are revealed. The thinning process includes, for example, a mechanical grinding process, a CMP process, or the like. Similar to the process shown in FIG. 1F, during the thinning process, electrons may be generated and accumulated at the grinding surface. Again, the electrically grounded TIVs 500 are able to create a path to deplete the accumulated electrons, so as to resolve the issue of corrosion derived from electron accumulation.

Referring to FIG. 1H and FIG. 1I, the structure is detached from the thinning stage ST1. Thereafter, a bonding layer 700 is formed over the dies 200, the encapsulant 400, and the TIVs 500. In some embodiments, the bonding layer 700 is formed on the dies 200 opposite to the bonding layer 300. In some embodiments, the bonding layer 700 includes a dielectric layer 702, a plurality of bonding pads 704, and a plurality of connecting pads 706. In some embodiments, the bonding pads 704 and the connecting pads 706 are embedded in the dielectric layer 702. In some embodiments, the bonding pads 704 are formed on the TSVs 250 of the dies 200 while the connecting pads 706 are formed on the TIVs 500. That is, the bonding pads 704 are connected to the TSVs 250 and the connecting pads 706 are connected to the TIVs 500. For example, the connecting pads 706 are electrically grounded through the TIVs 500, the alignment marks 124, and the contact vias 112. In some embodiments, the connecting pads 706 may be optional.

In some embodiments, a material of the dielectric layer 702 includes oxides, such as silicon oxide or the like. Alternatively, the dielectric layer 702 may include polyimide, epoxy resin, acrylic resin, phenol resin, BCB, PBO, or any other suitable polymer-based dielectric material. The dielectric layer 702, for example, may be formed by suitable fabrication techniques, such as spin-on coating, CVD, PECVD, or the like. In some embodiments, the bonding pads 704 and the connecting pads 706 include the same material. Materials for the bonding pads 704 and the connecting pads 706 are, for example, aluminum, titanium, copper, nickel, tungsten, or alloys thereof. In some embodiments, the bonding pads 704 and the connecting pads 706 are simultaneously formed.

In some embodiments, a top surface of the dielectric layer 702, top surfaces of the bonding pads 704, and top surfaces of the connecting pads 706 may be collectively referred to as a bonding surface $S_{700}$. As shown in FIG. 1I, the top surface of the dielectric layer 702, the top surfaces of the bonding pads 704, and the top surfaces of the connecting pads 706 are substantially located at the same level height to provide an appropriate bonding surface $S_{700}$ for hybrid bonding.

Referring to FIG. 1J, a plurality of dies 800 are stacked over the dies 200. In some embodiments, each die 800 includes a semiconductor substrate 810, an interconnection structure 820, a passivation layer 830, a conductive pad 840, a plurality of TSVs 850, and a plurality of bonding vias 860. In some embodiments, the semiconductor substrate 810 in FIG. 1J is similar to the semiconductor substrate 210 in FIG. 1B, so the detailed description thereof is omitted herein. As illustrated in FIG. 1J, the interconnection structure 820 is disposed on the semiconductor substrate 810. In some embodiments, the interconnection structure 820 includes an inter-dielectric layer 822 and a plurality of conductive patterns 824. The inter-dielectric layer 822 and the conductive patterns 824 of the interconnection structure 820 are respectively similar to the inter-dielectric layer 222 and the conductive patterns 224 of the interconnection structure 220, so the detailed descriptions thereof are omitted herein.

In some embodiments, the conductive pad 840 is disposed over and electrically connected to the interconnection structure 820. On the other hand, the passivation layer 830 is formed over the interconnection structure 820 to seal the conductive pads 840. As illustrated in FIG. 1J, the TSVs 850 are embedded in the semiconductor substrate 810. In some embodiments, the TSVs 850 are electrically connected to the conductive patterns 224 of the interconnection structure 820. The passivation layer 830, the conductive pad 840, and the TSVs 850 of the die 800 are respectively similar to the passivation layer 230, the conductive pad 240, and the TSVs 250 of the die 200, so the detailed descriptions thereof are omitted herein.

In some embodiments, the bonding vias 860 penetrate through the passivation layer 830 to establish electrical connection with the conductive patterns 824 of the interconnection structure 820. In some embodiments, a material of the bonding vias 860 may include aluminum, titanium, copper, nickel, tungsten, or alloys thereof. In some embodiments, the bonding vias 860 may be formed by a plating process or the like.

In some embodiments, the dies 800 may be capable of performing storage functions. For example, the dies 800 may be Dynamic Random Access Memory (DRAM), Resistive Random Access Memory (RRAM), Static Random Access Memory (SRAM), or the like. However, the disclosure is not limited thereto. In some alternative embodiments, the dies 800 may be Central Process Unit (CPU) dies, Graphic Process Unit (GPU) dies, Field-Programmable Gate Array (FPGA), or the like.

In some embodiments, each die 800 has an active surface 800a and a rear surface 800b opposite to the active surface 800a. In some embodiments, prior to the placement of the dies 800, a bonding layer 900 is formed on the active surface 800a of each die 800. For example, the bonding layer 900 is formed on the passivation layer 830 and the bonding vias 860 of the die 800. In some embodiments, the bonding layer 900 includes a dielectric layer 902 and a plurality of bonding pads 904 embedded in the dielectric layer 902. In some embodiments, the bonding pads 904 of the bonding layer 900 are electrically connected to the bonding vias 860. That is, the bonding vias 860 electrically connect the interconnection structure 820 and the bonding pads 904 of the bonding layer 900. The dielectric layer 902 and the bonding pads 904 in FIG. 1J are respectively similar to the dielectric layer 702 and the bonding pads 704 in FIG. 1I, so the detailed descriptions thereof are omitted herein.

In some embodiments, a bottom surface of the dielectric layer 902 and bottom surfaces of the bonding pads 904 may be collectively referred to as a bonding surface $S_{900}$. As shown in FIG. 1J, the bottom surface of the dielectric layer 902 and the bottom surfaces of the bonding pads 904 are substantially located at the same level height to provide an appropriate bonding surface $S_{900}$ for hybrid bonding.

As illustrated in FIG. 1J, the dies 800 are individually placed over the corresponding dies 200 such that each die 800 is bonded to the corresponding die 200 through the bonding layers 700 and 900. For example, the bonding layers 900 are sandwiched between the bonding layer 700 and the dies 800. In some embodiments, the bonding layer 700 is bonded to the bonding layer 900 through a hybrid bonding process. In some embodiments, a temperature of the hybrid bonding process ranges from about 150° C. to about 400° C. The hybrid bonding process will be described in detail below.

In some embodiments, the dies 800 having the bonding layer 900 formed thereon may be picked-and-placed onto the bonding surface $S_{700}$ of the bonding layer 700 such that the dies 800 are electrically connected to the dies 200. In some embodiments, the bonding surface $S_{900}$ of the bonding layer 900 is in contact with the bonding surface $S_{700}$ of the bonding layer 700. For example, the bonding pads 904 of the bonding layer 900 are substantially aligned and in direct contact with the corresponding bonding pads 704 of the bonding layer 700. In some embodiments, to facilitate the hybrid bonding between the bonding layer 700 and the bonding layer 900, surface preparation for bonding surfaces (i.e. the bonding surface $S_{700}$ and the bonding surface $S_{900}$) of the bonding layer 700 and the bonding layer 900 may be performed. The surface preparation may include surface cleaning and activation, for example. Surface cleaning may be performed on the bonding surfaces $S_{700}$ and $S_{900}$ to remove particles on the bonding surface of the dielectric layer 702, the bonding surfaces of the bonding pads 704, the bonding surface of the dielectric layer 902, and the bonding surfaces of the bonding pads 904. In some embodiments, the bonding surfaces $S_{700}$ and $S_{900}$ may be cleaned by wet cleaning, for example. Not only particles are removed, but also native oxide formed on the bonding surfaces of the bonding pads 704 and the bonding pads 904 may be removed. The native oxide formed on the bonding surfaces of the bonding pads 704 and the bonding pads 904 may be removed by chemicals used in wet cleaning processes, for example.

After cleaning the bonding surface $S_{700}$ of the bonding layer 700 and the bonding surface $S_{900}$ of the bonding surface 900, activation of the bonding surfaces of the dielectric layer 702 and the dielectric layer 902 may be performed for development of high bonding strength. In some embodiments, plasma activation may be performed to treat the bonding surfaces of the dielectric layer 702 and the dielectric layer 902. When the activated bonding surface of the dielectric layer 702 is in contact with the activated bonding surface of the dielectric layer 902, the dielectric layer 702 of the bonding layer 700 and the dielectric layer 902 of the bonding layer 900 are pre-bonded.

After pre-bonding the bonding layer 900 onto the bonding layer 700, hybrid bonding of the bonding layer 700 and the bonding layer 900 are performed. The hybrid bonding of the bonding layer 700 and the bonding layer 900 may include a thermal treatment for dielectric bonding and a thermal annealing for conductor bonding. In some embodiments, the thermal treatment for dielectric bonding is performed to strengthen the bonding between the dielectric layer 702 and the dielectric layer 902. For example, the thermal treatment for dielectric bonding may be performed at temperature ranging from about 200° C. to about 400° C. After performing the thermal treatment for dielectric bonding, the thermal annealing for conductor bonding is performed to facilitate the bonding between the bonding pads 704 and the bonding pads 904. For example, the thermal annealing for conductor bonding may be performed at temperature ranging from about 150° C. to about 400° C. After performing the thermal annealing for conductor bonding, the dielectric layer 702 is hybrid bonded to the dielectric layer 902 and the bonding pads 704 are hybrid bonded to the bonding pads 904. For example, the dielectric layer 702 is directly in contact with the dielectric layer 902. Similarly, the bonding pads 704 are directly in contact with the bonding pads 904. As such, the bonding layer 700 is hybrid bonded to the bonding layer 900. Although FIG. 1J illustrated that the bonding pads 704 and the bonding pads 904 have sharp corners (the sidewalls are perpendicular to the top/bottom surfaces), the disclosure is not limited thereto. In some alternative embodiments, after the bonding pads 704 are hybrid bonded to the bonding pads 904, corner rounding of the bonding pads may occur. For example, the corners of the bonding pads 704 facing the bonding pads 904 are rounded. Similarly, the corners of the bonding pads 904 facing the bonding pads 704 are also rounded. That is, edges of the top surface of each bonding pad 704 are rounded. Similarly, edges of the bottom surface of each bonding pad 904 are also rounded. Moreover, although FIG. 1J illustrated that the bonding pads 704 and the bonding pads 904 have the same width and sidewalls of the bonding pads 704 are aligned with sidewalls of the bonding pads 904, the disclosure is not limited thereto. In some alternative embodiments, the width of each bonding pad 704 may be smaller than or larger than the width of each bonding pad 904.

In some embodiments, since the structure in FIG. 1I is in wafer form and the dies 800 having the bonding layer 900 formed thereon are in chip form, the hybrid bonding process in FIG. 1J may be referred to as a "chip-on-wafer bonding process."

Referring to FIG. 1K, an encapsulant 1000 is formed over the bonding layer 700 to laterally encapsulate the dies 800 and the bonding layer 900. That is, rear surfaces 800b of the dies 800 are substantially coplanar with a top surface of the encapsulant 1000 and the encapsulant 1000 covers sidewalls of the dies 800 and the bonding layers 900. In some embodiments, the encapsulant 1000 may be referred to as "gap fill oxide." In some embodiments, a material and a formation method of the encapsulant 1000 in FIG. 1K is similar to the encapsulant 400 in FIG. 1D, so the detailed descriptions thereof is omitted herein.

Referring to FIG. 1L, a dielectric layers 1100, a bonding layer 1200, and a carrier substrate 1300 are sequentially formed over the dies 800 and the encapsulant 1000. In some embodiments, the dielectric layer 1100 may be formed by suitable fabrication techniques, such as vapor deposition, spin coating, ALD, thermal oxidation, some other suitable deposition or growth process, or a combination thereof. The vapor deposition may include, for example, CVD, PVD, some other suitable vapor deposition process, or a combination thereof. In some embodiments, a material of the dielectric layer 1100 may be polyimide, PBO, BCB, a nitride such as silicon nitride, an oxide such as silicon oxide, USG, PSG, BSG, BPSG, a combination thereof, or the like. In some embodiments, the dielectric layer 1100 is able to control the warpage during subsequent processes.

In some embodiments, the bonding layer 1200 is a smooth layer having a continuous even surface. In some embodiments, a material of the bonding layer 1200 may include silicon oxynitride (SiON), silicon oxide, silicon nitride or the like, and the bonding layer 1200 may be formed by deposition or the like. In some embodiments, the bonding layer 1200 has a substantially uniform and even thickness.

In some embodiments, the carrier substrate 1300 is bonded to the bonding layer 1200. In some embodiments, the carrier substrate 1300 includes semiconductor materials. For example, the carrier substrate 1300 may be made of a suitable elemental semiconductor, such as crystalline silicon, diamond, or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. However, the disclosure is not limited thereto. In some alternative embodiments, the carrier substrate 1300 may be a glass substrate. In some embodiments, the carrier substrate 1300 is free of active components and passive components. In some embodiments, the carrier substrate 1300 is also free of wire routings. For example, the carrier substrate 1300 may be a blank substrate which purely functions as a supporting element without serving any signal transmission function. In some embodiments, since the carrier substrate 1300 is in wafer form, the process illustrated in FIG. 1L may be referred to as "wafer-to-wafer bonding."

Referring to FIG. 1L and FIG. 1M, the semiconductor substrate 110, the contact vias 112, the alignment layer 120, the dielectric layer 130, the bonding layer 300, a portion of each TIV 500, and a portion of the encapsulant 400 are removed such that the encapsulant 400, the TIVs 500, and the active surface 200a of the die 200 are exposed. In some embodiments, these elements may be removed through a mechanical grinding process, a CMP process, or an etching process. In some embodiments, after the contact vias 112 are removed, the TIVs 500 and the connecting pads 706 are no longer connected to a ground voltage. That is, after the contact vias 112 are removed, the TIVs 500 and the connecting pads 706 are electrically floating.

Referring to FIG. 1N, a dielectric layer 1400 is formed over the dies 200, the TIVs 500, and the encapsulant 400. In some embodiments, the dielectric layer 1400 may be formed by suitable fabrication techniques, such as vapor deposition, spin coating, ALD, thermal oxidation, some other suitable deposition or growth process, or a combination thereof. The vapor deposition may include, for example, CVD, PVD, some other suitable vapor deposition process, or a combination thereof. In some embodiments, a material of the dielectric layer 1400 may be polyimide, PBO, BCB, a nitride such as silicon nitride, an oxide such as silicon oxide, USG, PSG, BSG, BPSG, a combination thereof, or the like.

Referring to FIG. 1O, a plurality of conductive terminals 1500 is formed over the dielectric layer 1400. In some embodiments, the conductive terminals 1500 are, for example, solder balls, ball grid array (BGA) balls, or controlled collapse chip connection (C4) bumps. In some embodiments, the conductive terminals 1500 are made of a conductive material with low resistivity, such as Sn, Pb, Ag, Cu, Ni, Bi, or an alloy thereof. In some embodiments, the conductive terminals 1500 are formed by the following steps. First, a plurality of openings (not shown) is formed in the dielectric layer 1400 and the passivation layer 230 of the dies 200 to expose the conductive pads 240 of the dies 200. Subsequently, the conductive terminals 1500 are formed over the dielectric layer 1400 through a ball placement process or the like. In some embodiments, the conductive terminals 1500 extend into the openings to be in direct contact with the conductive pads 240 of the dies 200. In other words, the conductive terminals 1500 are electrically connected to the conductive pads 240 of the dies 200.

Referring to FIG. 1O and FIG. 1P, a singulation process is performed on the scribe line regions SR to form a plurality of packages 10. In some embodiments, the dicing process or the singulation process typically involves dicing with a rotating blade or a laser beam. In other words, the dicing or singulation process is, for example, a laser cutting process, a mechanical cutting process, or other suitable processes. As illustrated in FIG. 1P, the die 800 is stacked on the die 200. In other words, multiple dies 200 and 800 are integrated into a single package 10. As such, the package 10 may be referred to as a "system on integrated circuit (SOIC) package." In some embodiments, the package 10 may be utilized in other modules/applications, such as chip on wafer on substrate (CoWoS) packaging, flip-chip packaging, integrated fan-out (InFO) packaging, fan-out wafer level packaging (WLP), or the like.

Figure 2A:
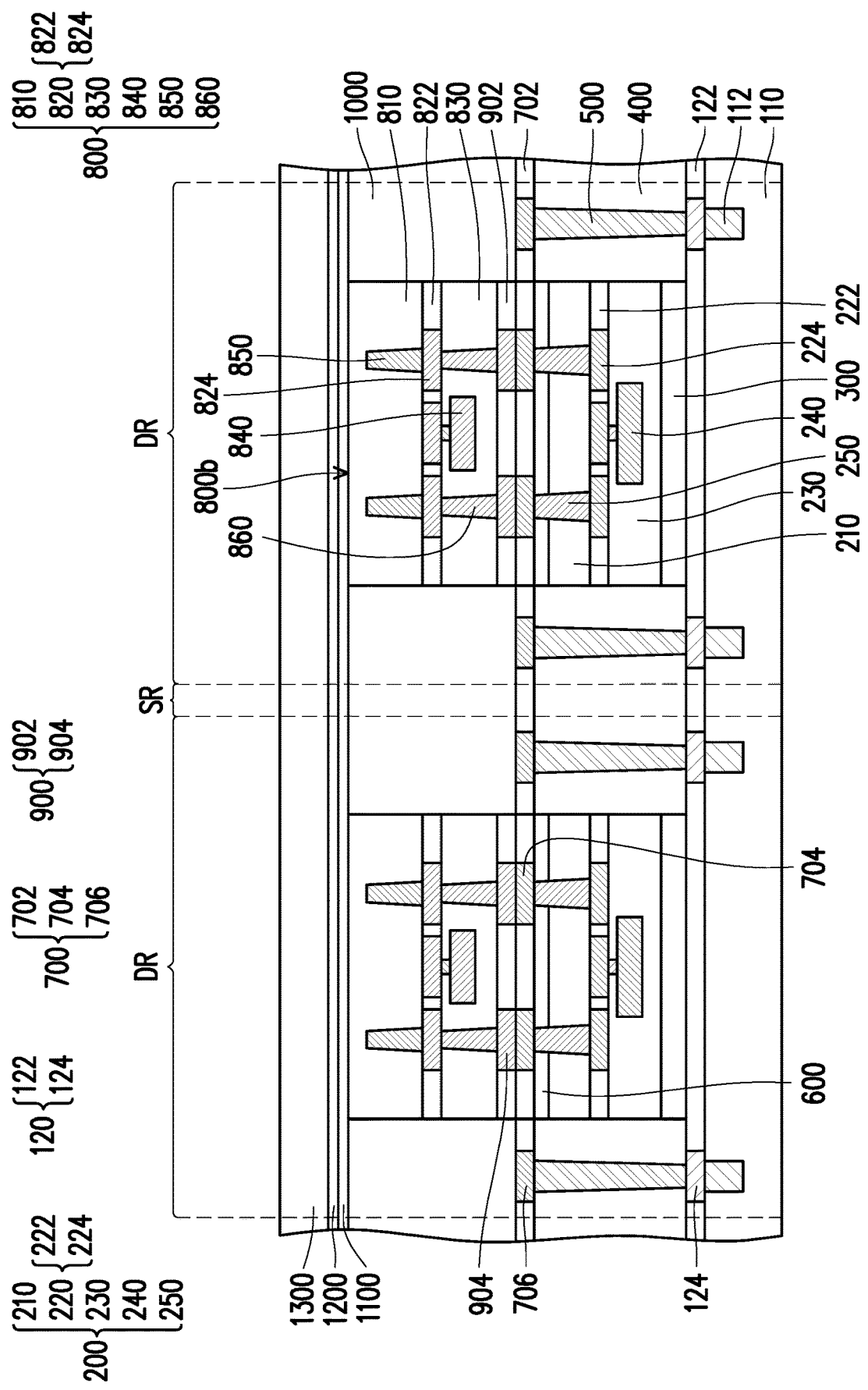
FIG. 2A to FIG. 2E are schematic cross-sectional views illustrating a manufacturing process of a package in accordance with some alternative embodiments of the disclosure.
Figure 2B:
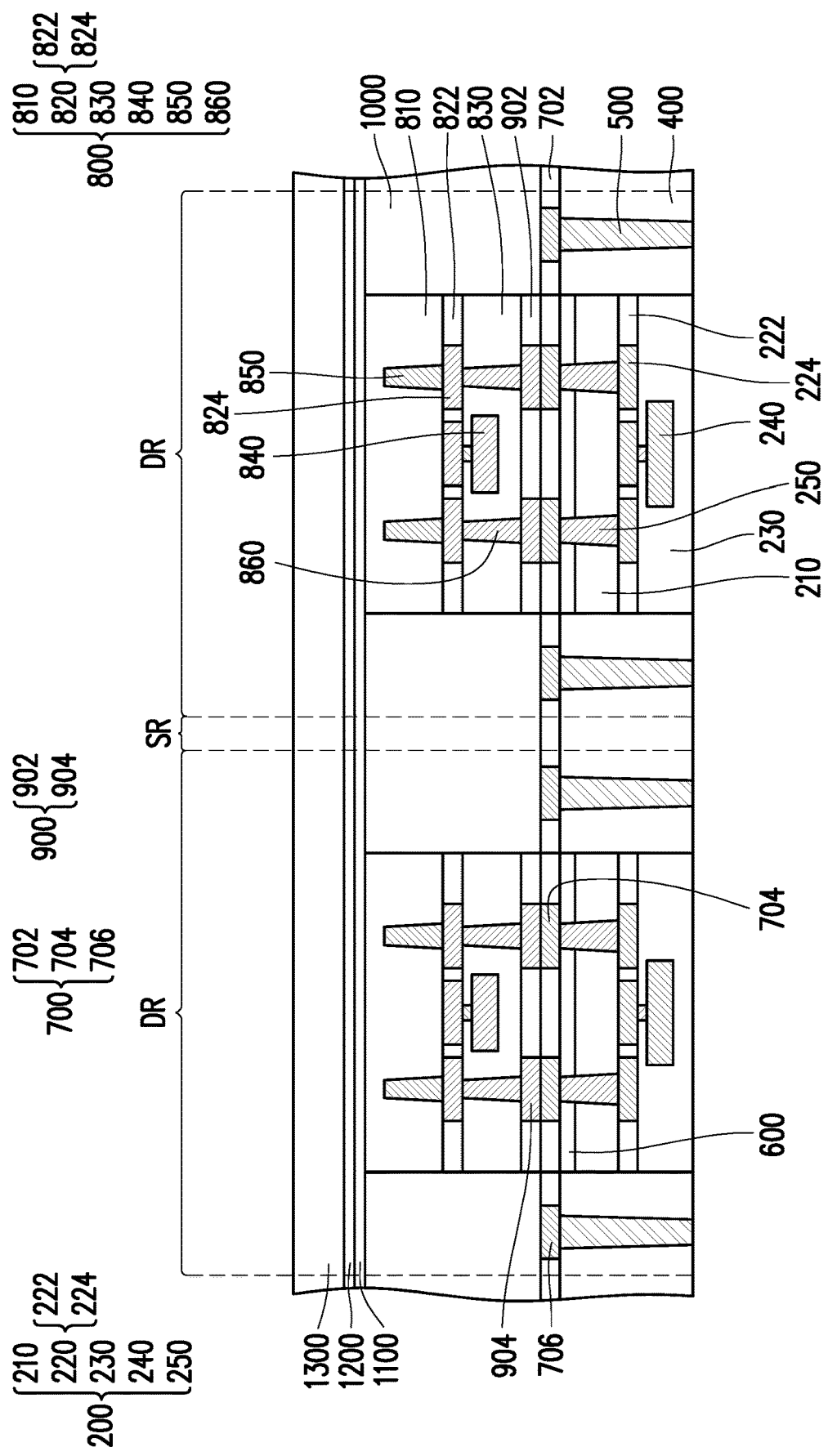
Figure 2C:
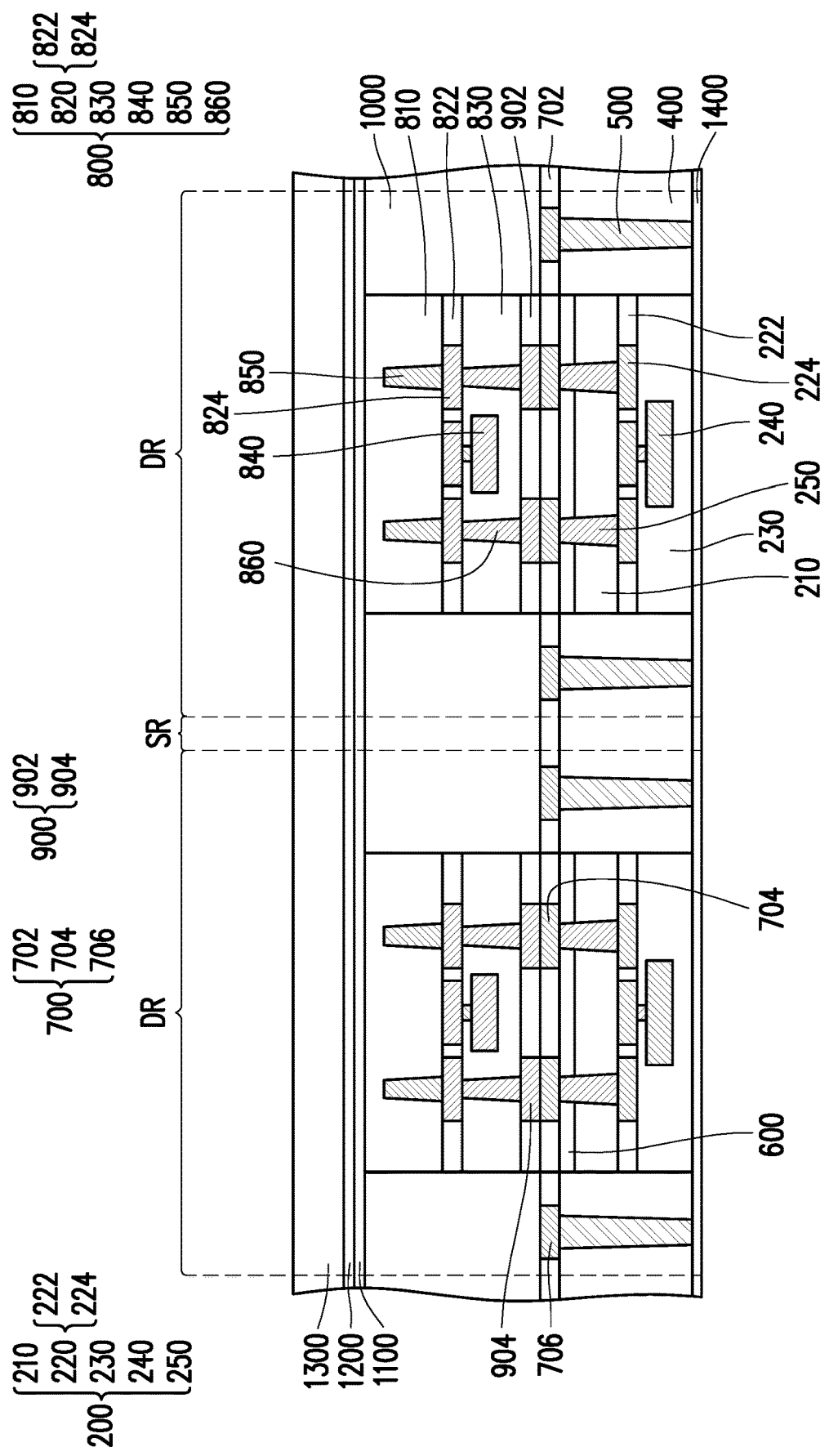
Figure 2D:
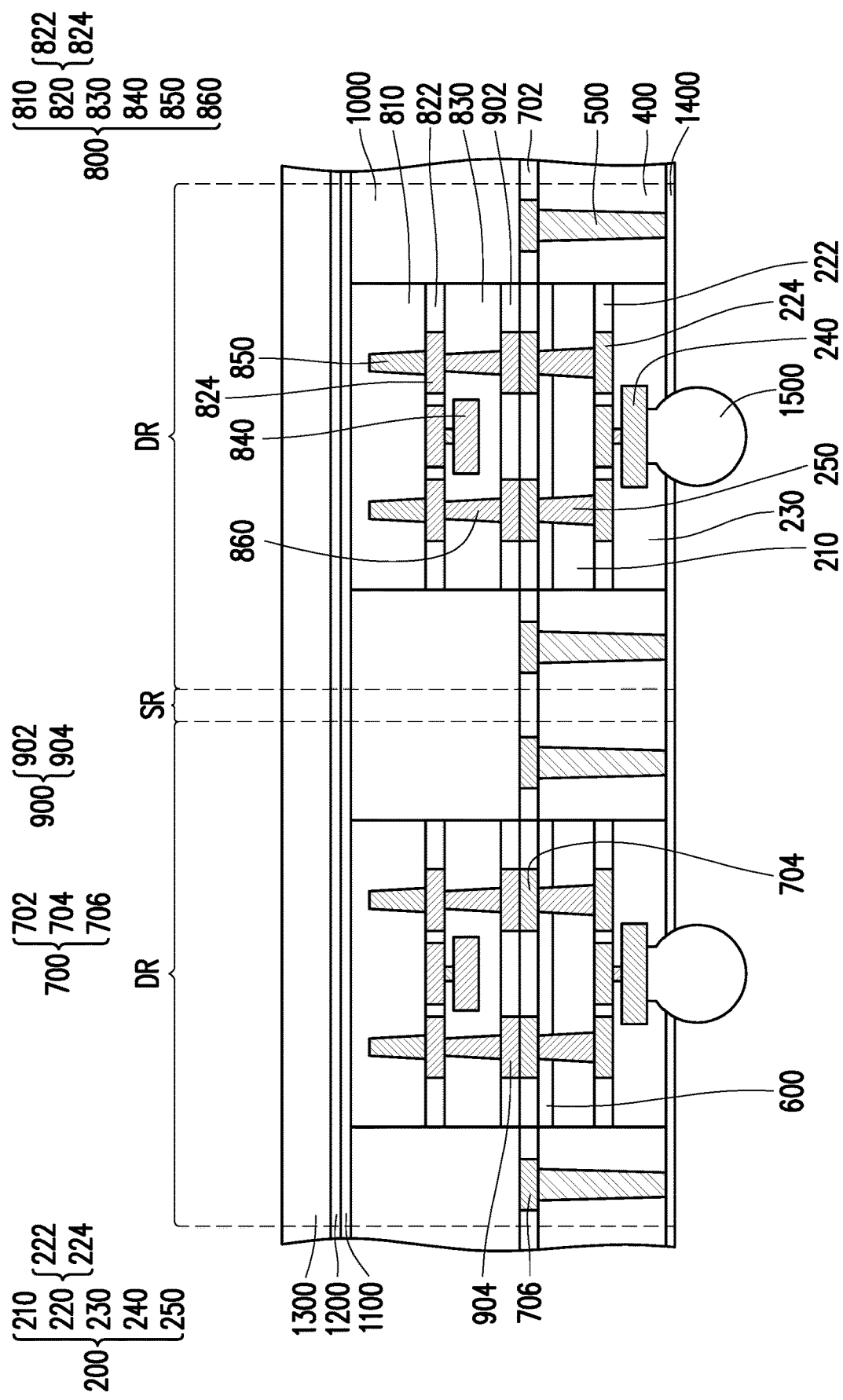

FIG. 2A to FIG. 2E are schematic cross-sectional views illustrating a manufacturing process of a package 20 in accordance with some alternative embodiments of the disclosure. Referring to FIG. 2A, the structure in FIG. 2A is similar to the structure in FIG. 1L, so similar components thereof are denoted by the same reference numeral and the detailed descriptions thereof are omitted herein. In other words, the structure in FIG. 2A may be obtained by performing the steps illustrated in FIG. 1A to FIG. 1L. However, the formation of the dielectric layer 130 is omitted in the manufacturing process of the structure in FIG. 2A. In other words, the differences between the structure in FIG. 2A and the structure in FIG. 1L are that the dielectric layer 130 is omitted and the alignment marks 124 are directly in contact with encapsulant 400 in FIG. 2A.

Figure 2E:
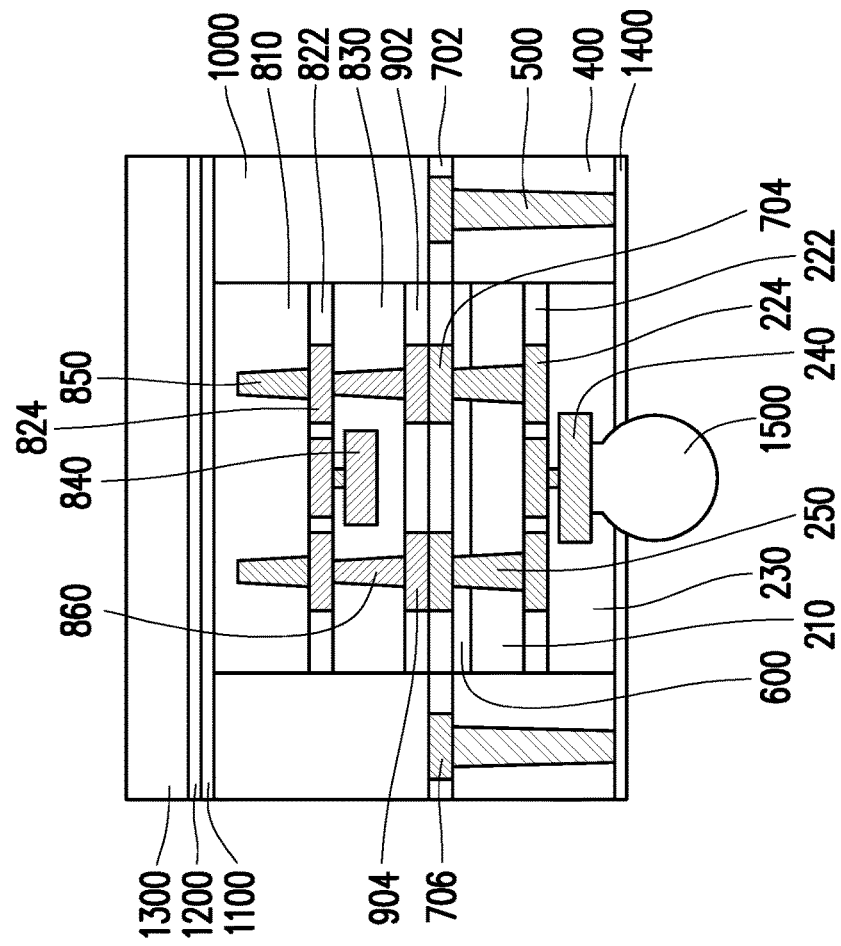

Referring to FIG. 2B to FIG. 2E, the steps in FIG. 2B to FIG. 2E are similar to the steps shown in FIG. 1M to FIG. 1P, so similar components thereof are denoted by the same reference numeral and the detailed descriptions thereof are omitted herein. Referring to FIG. 2E, a plurality of packages 20 is obtained. As illustrated in FIG. 2E, the die 800 is stacked on the die 200. In other words, multiple dies 200 and 800 are integrated into a single package 20. As such, the package 20 may be referred to as a "SOIC package." In some embodiments, the package 20 may be utilized in other modules/applications, such as CoWoS packaging, flip-chip packaging, InFO packaging, fan-out WLP, or the like.

Figure 3A:
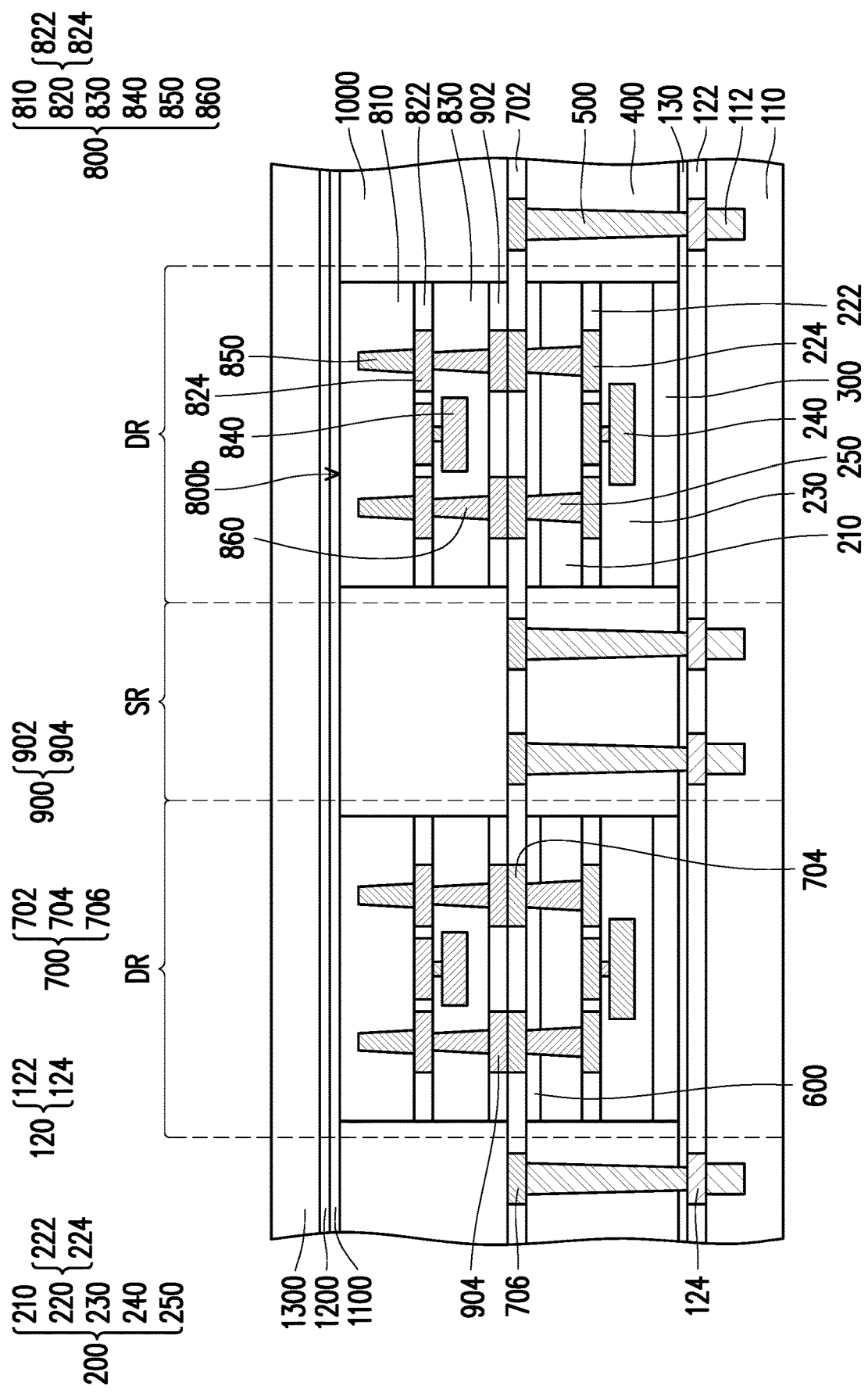
Figure 3B:
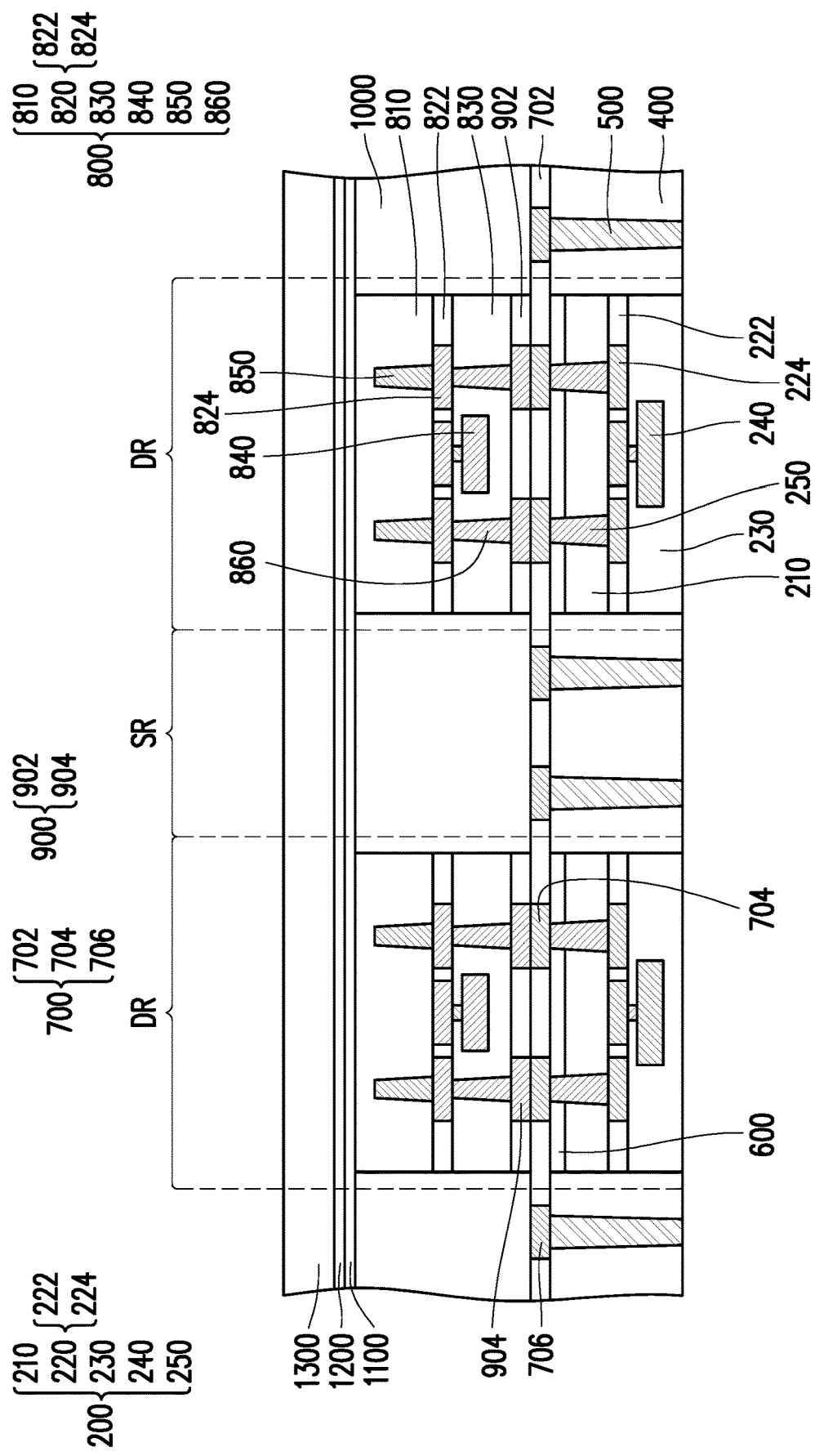
Figure 3C:
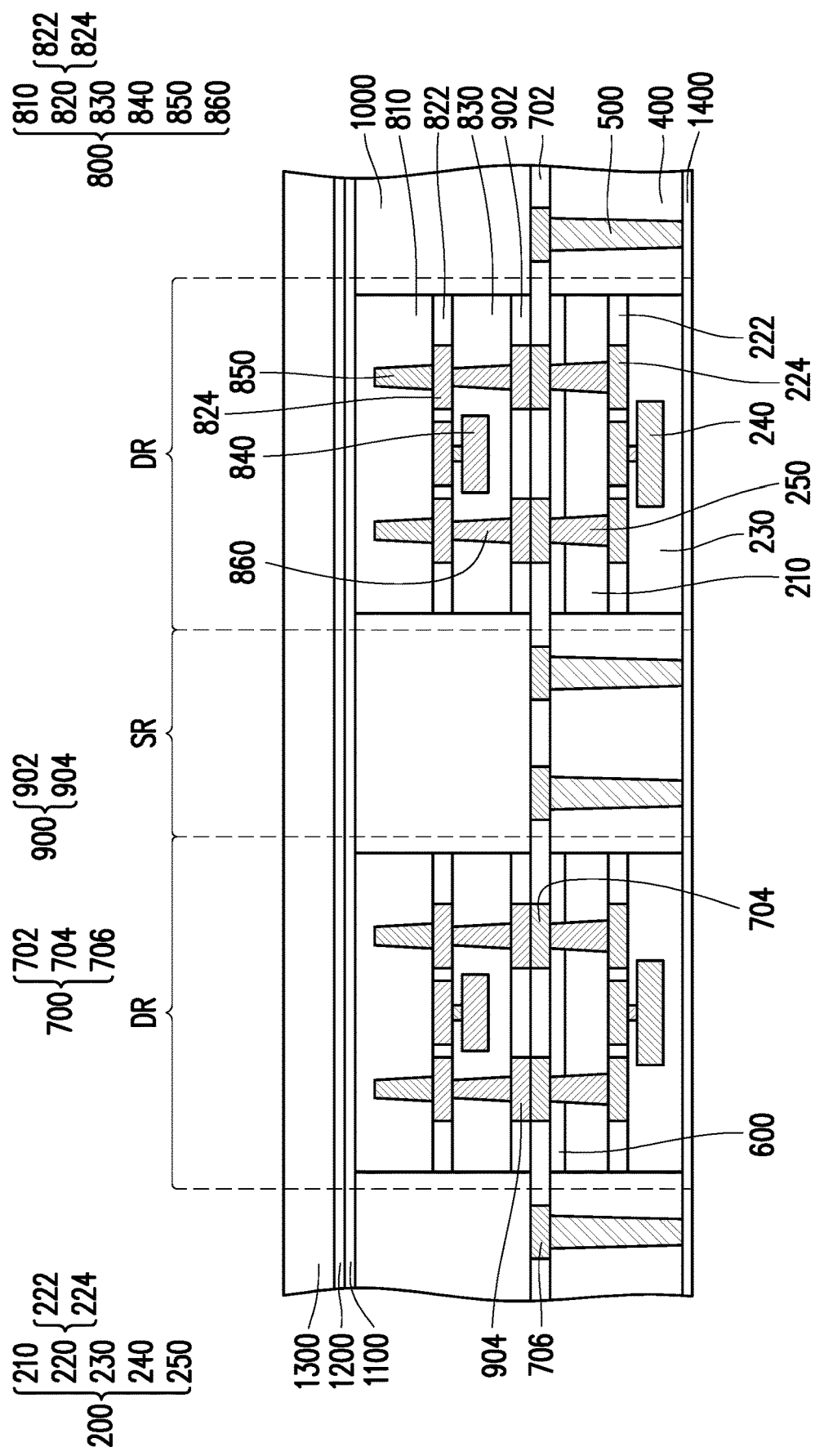

FIG. 3A to FIG. 3E are schematic cross-sectional views illustrating a manufacturing process of a package 30 in accordance with some alternative embodiments of the disclosure. Referring to FIG. 3A, the structure in FIG. 3A is similar to the structure in FIG. 1L, so similar components thereof are denoted by the same reference numeral and the detailed descriptions thereof are omitted herein. In other words, the structure in FIG. 3A may be obtained by performing the steps illustrated in FIG. 1A to FIG. 1L. However, in FIG. 3A, the contact vias 112, the alignment marks 124, the TIVs 500, and the connecting pads 706 are formed in the scribe line regions SR.

Figure 3D:
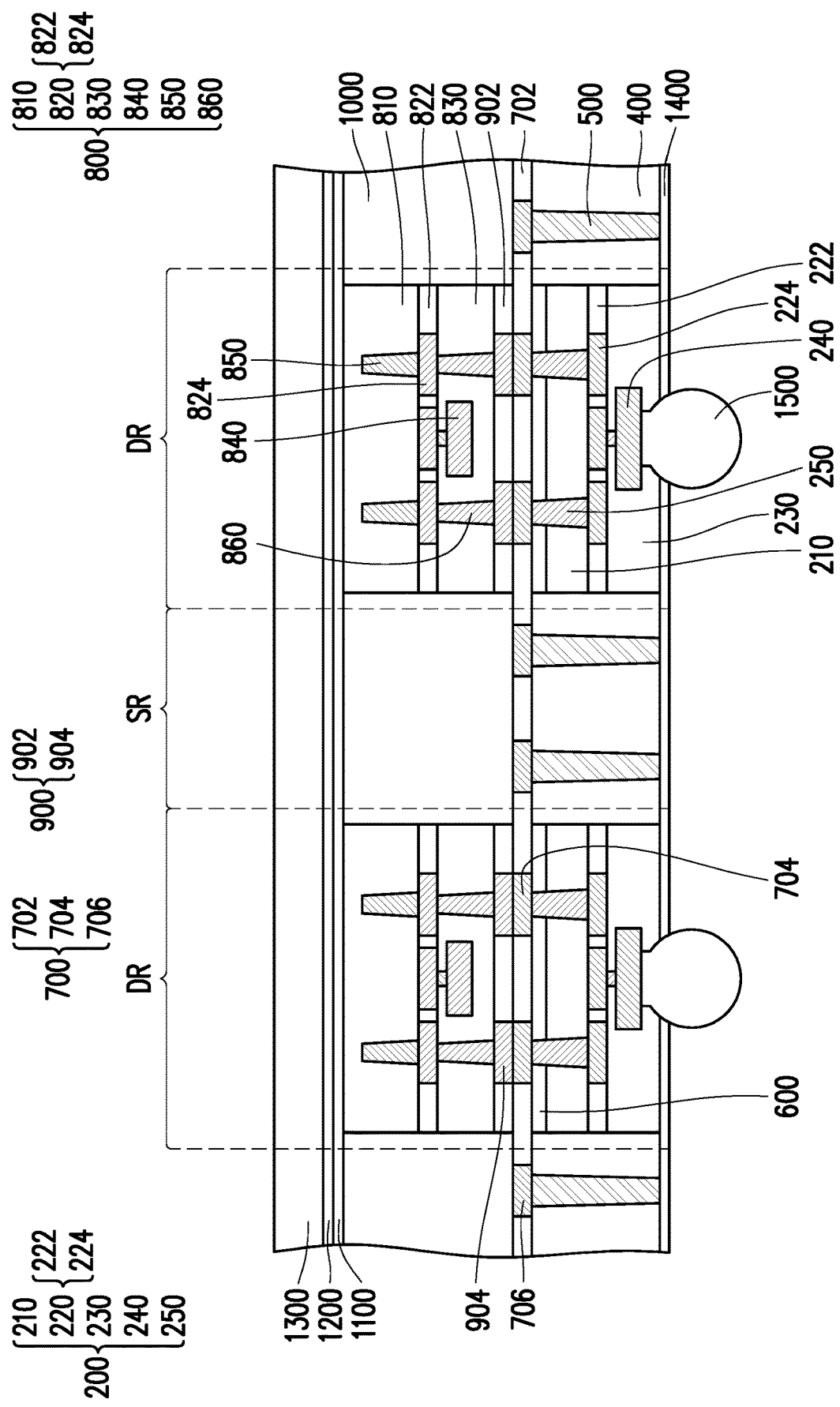
Figure 3E:
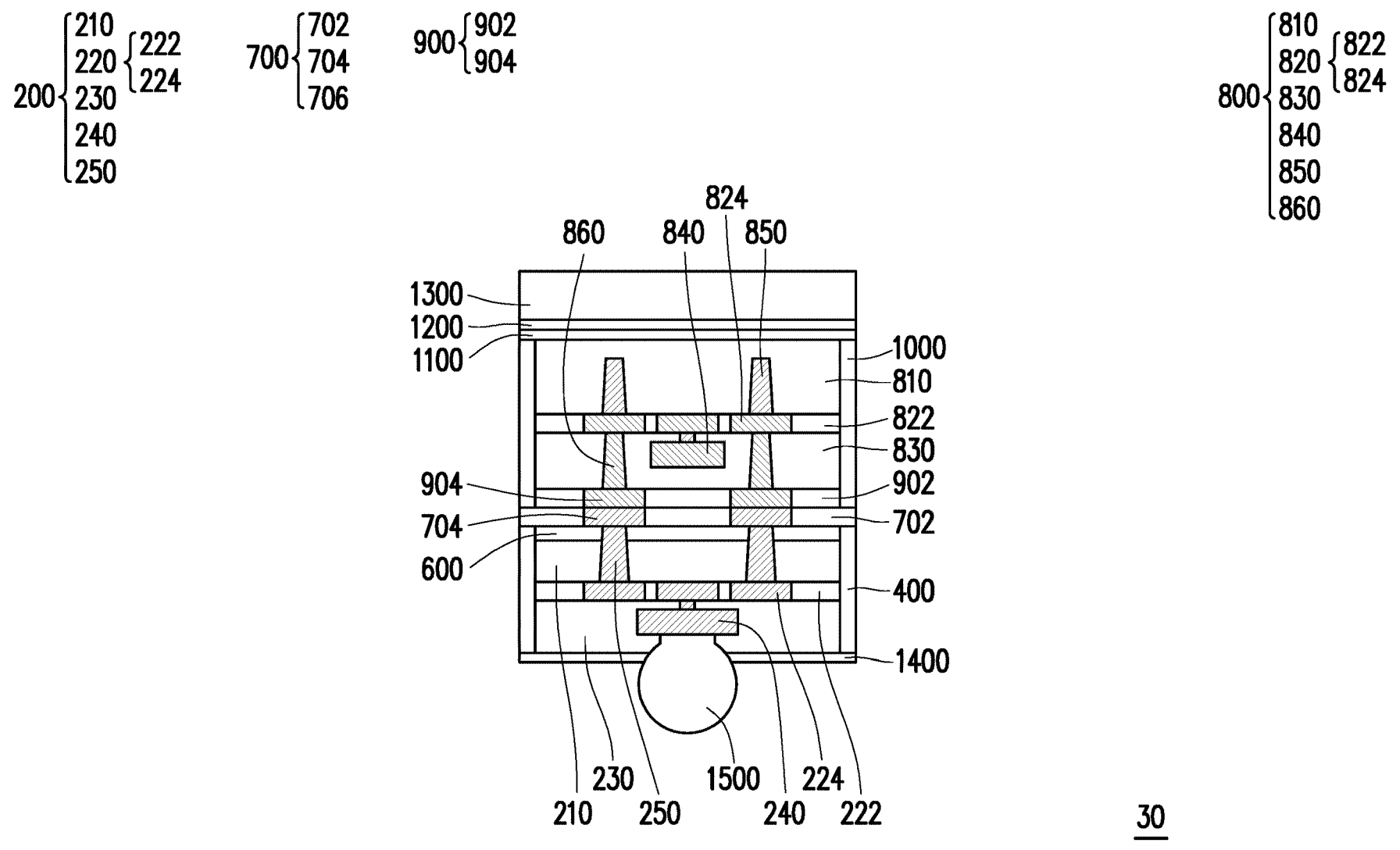

Referring to FIG. 3B to FIG. 3E, the steps in FIG. 3B to FIG. 3E are similar to the steps shown in FIG. 1M to FIG. 1P, so similar components thereof are denoted by the same reference numeral and the detailed descriptions thereof are omitted herein. Referring to FIG. 3D and FIG. 3E, a singulation process is performed on the scribe line regions SR to form a plurality of packages 30. In other words, the TIVs 500 and the connecting pads 706 located in the scribe line regions SR are removed. As illustrated in FIG. 3E, the die 800 is stacked on the die 200. In other words, multiple dies 200 and 800 are integrated into a single package 30. As such, the package 30 may be referred to as a "SOIC package." In some embodiments, the package 30 may be utilized in other modules/applications, such as CoWoS packaging, flip-chip packaging, InFO packaging, fan-out WLP, or the like.

Figure 4A:
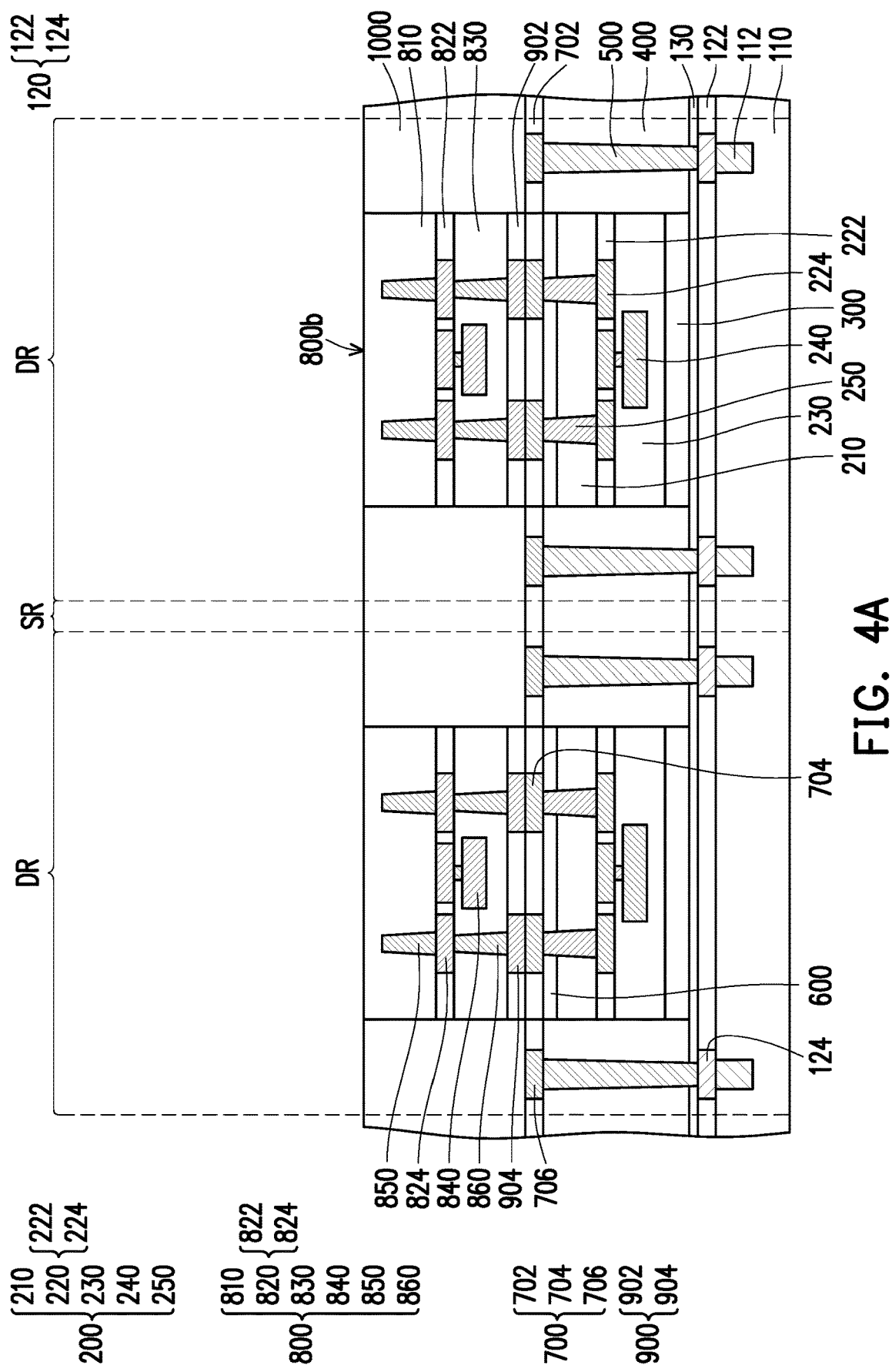
FIG. 4A to FIG. 4M are schematic cross-sectional views illustrating a manufacturing process of a package in accordance with some alternative embodiments of the disclosure.

FIG. 4A to FIG. 4M are schematic cross-sectional views illustrating a manufacturing process of a package 40 in accordance with some alternative embodiments of the disclosure. Referring to FIG. 4A, the structure in FIG. 4A is similar to the structure in FIG. 1K, so similar components thereof are denoted by the same reference numeral and the detailed descriptions thereof are omitted herein. In other words, the structure in FIG. 4A may be obtained by performing the steps illustrated in FIG. 1A to FIG. 1K.

Figure 4B:
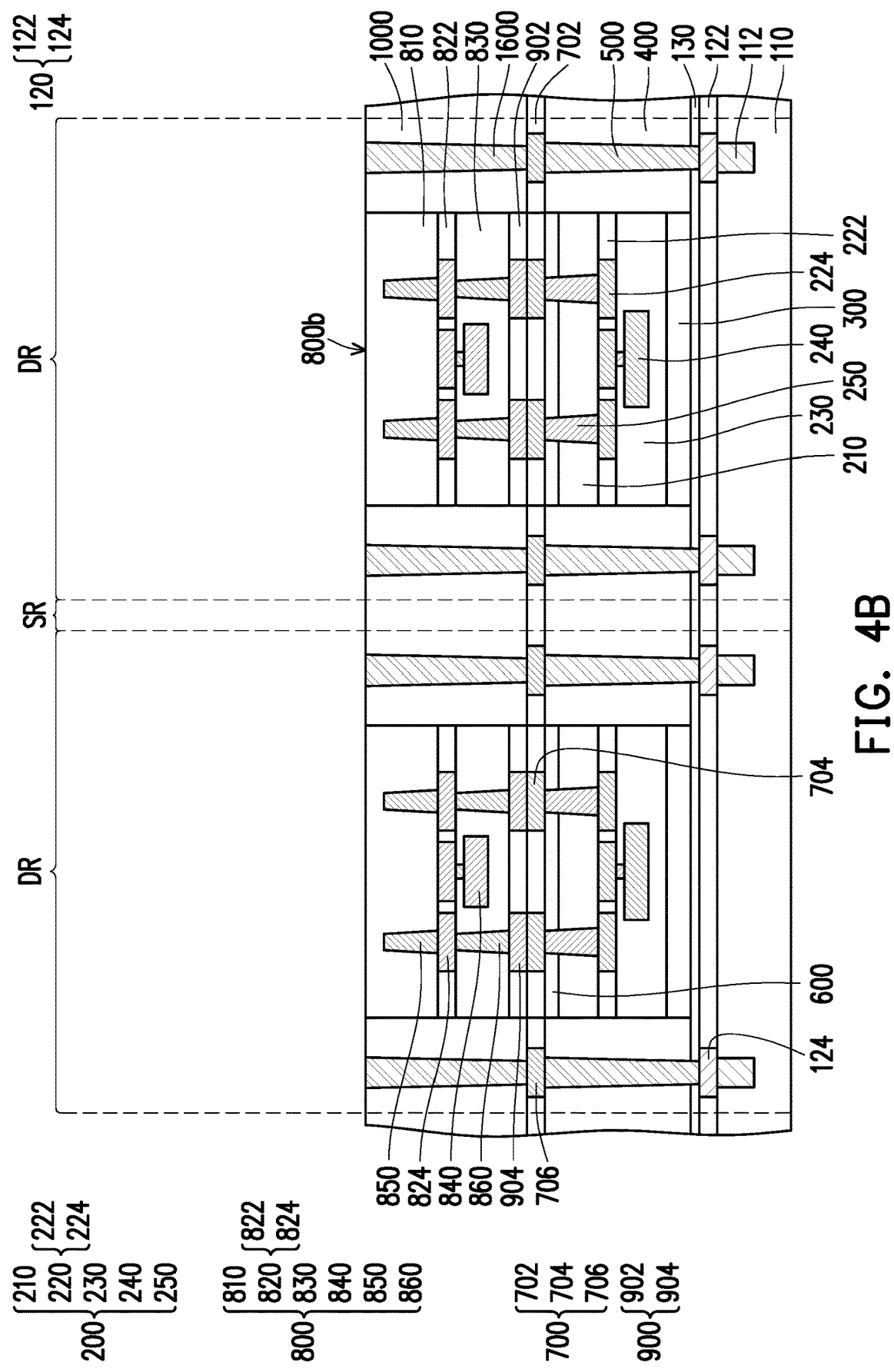

Referring to FIG. 4B, a plurality of TIVs 1600 are formed in the encapsulant 1000. In some embodiments, the TIVs 1600 are formed aside the dies 800. In some embodiments, the TIVs 1600 penetrate through the encapsulant 1000 to be in direct contact with the connecting pads 706. In some embodiments, the TIVs 1600 are electrically connected to the connecting pads 706. In other words, the TIVs 1600 are electrically grounded through the connecting pads 706, the TIVs 500, the alignment marks 124, and the contact vias 112. As illustrated in FIG. 4B, the TIVs 1600 are substantially aligned with the TIVs 500. In some embodiments, a material of the TIVs 1600 includes aluminum, titanium, copper, nickel, tungsten, and/or alloys thereof. In some embodiments, the TIVs 1600 may be formed by the following steps. First, a laser drilling or an etching process is performed on the encapsulant 1000 to form a plurality of openings (not shown). The openings expose at least a portion of each connecting pad 706. Thereafter, a plating process may be performed to fill the openings, so as to form the TIVs 1600.

Figure 4C:
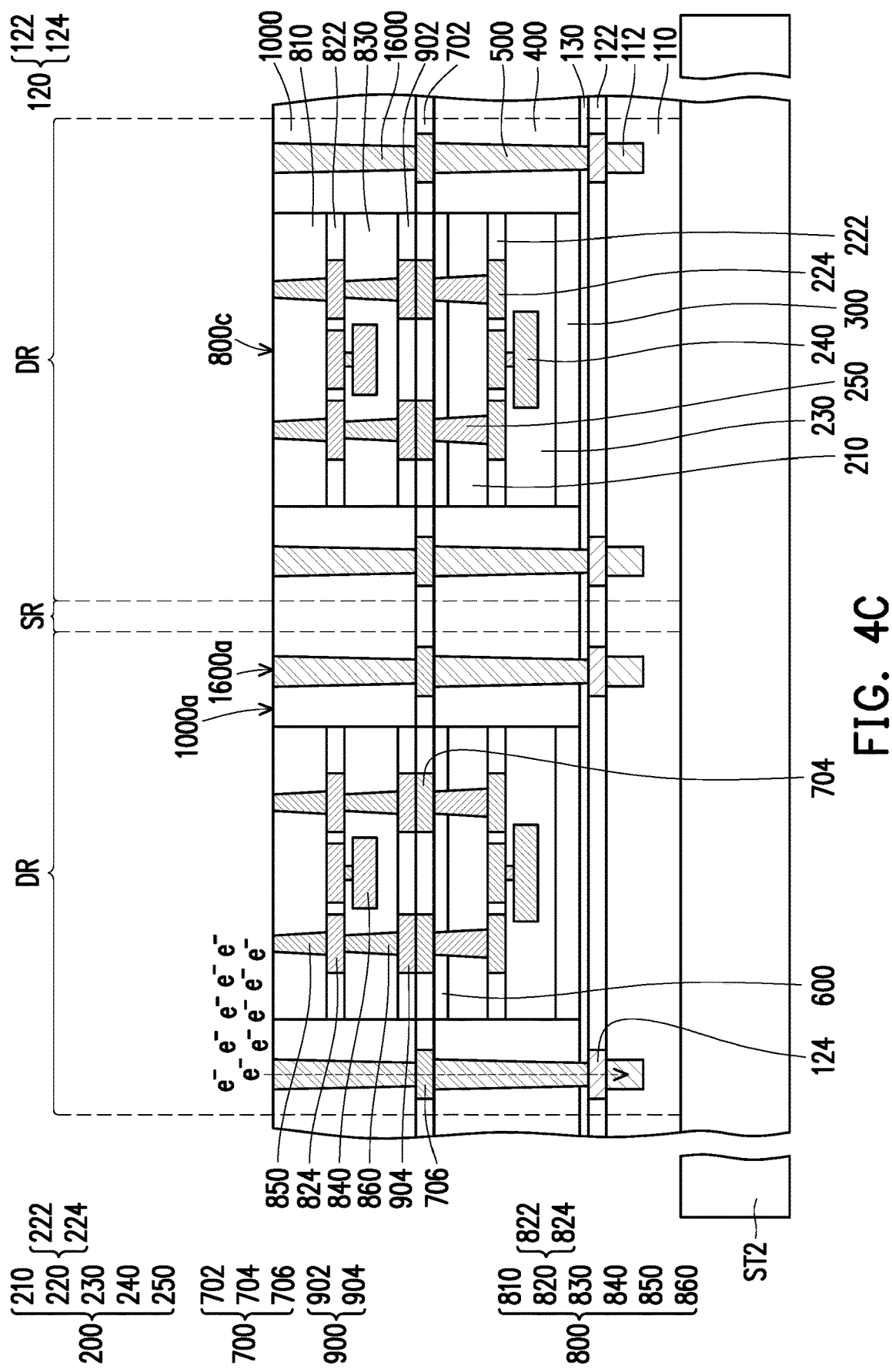

Referring to FIG. 4B and FIG. 4C, the structure illustrated in FIG. 4B is placed on a thinning stage ST2. In some embodiment, the thinning stage ST2 may be electrically connected to a ground. Subsequently, the dies 800, the encapsulant 1000, and the TIVs 1600 are thinned until the TSVs 850 of the dies 800 are exposed. That is, the dies 800 are thinned from the rear surfaces 800b. In some embodiments, the dies 800, the encapsulant 1000, and the TIVs 1600 may be thinned or planarized through a grinding process, such as a mechanical grinding process, a CMP process, or the like. In some embodiments, after the TSVs 850 are exposed, the dies 800, the encapsulant 1000, and the TIVs 1600 may be further thinned to reduce the overall thickness of the dies 800. After the thinning process, rear surfaces 800c of the dies 800 are substantially coplanar with a top surface 1000a of the encapsulant 1000 and top surfaces 1600a of the TIVs 1600. As illustrated in FIG. 4C, after the thinning process, the TSVs 850 penetrate through the semiconductor substrates 810 of the dies 800.

In some embodiments, during the thinning process, electrons may be generated and accumulated at the grinding surface (i.e. the rear surfaces 800c of the dies 800, the top surface 1000a of the encapsulant 1000, and the top surfaces 1600a of the TIVs 1600). The accumulation of the electron would cause corrosion issues to the TSVs 850 and the TIVs 1600. Nevertheless, since the TIVs 1600 are electrically grounded, the TIVs 1600 are able to create a path to deplete the accumulated electrons. In other words, the accumulated electron would be pulled down and travels sequentially through the TIVs 1600, the connecting pads 706, the TIVs 500, and the alignment marks 124 to arrive at the contact vias 112, as illustrated in FIG. 4C. The electrons in the contact vias 112 may be further transfer out of the structure. As such, the issue of corrosion derived from electron accumulation may be resolved.

Figure 4D:
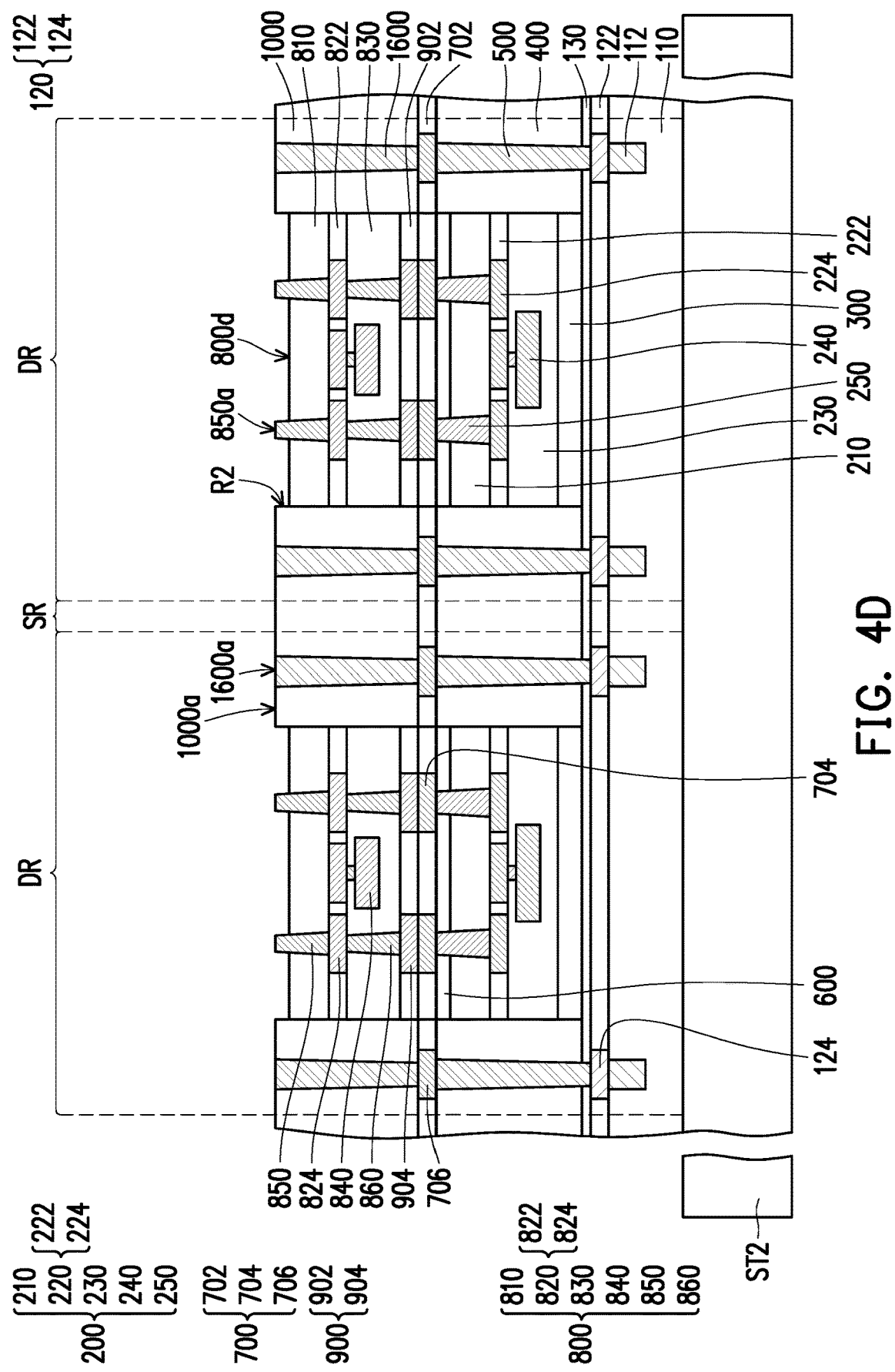

Referring to FIG. 4D, a portion of each die 800 is removed to form a plurality of recesses R2. For example, a portion of the semiconductor substrate 810 of each die 800 is removed to form the recess R2. As illustrated in FIG. 4D, the TSVs 850 are partially located in the recesses R2. In some embodiments, at least a portion of each TSV 850 protrudes from the semiconductor substrates 810 of the dies 800. That is, top surfaces 850a of the TSVs 850, the top surface 1000a of the encapsulant 1000, and the top surfaces 1600a of the TIVs 1600 are located at a level height higher than rear surfaces 800d of the dies 800. In some embodiments, the semiconductor substrates 810 may be partially removed through an etching process. The etching process includes, for example, an isotropic etching process and/or an anisotropic etching process. For example, the semiconductor substrates 810 may be partially removed through a wet etching process, a drying etching process, or a combination thereof.

Figure 4E:
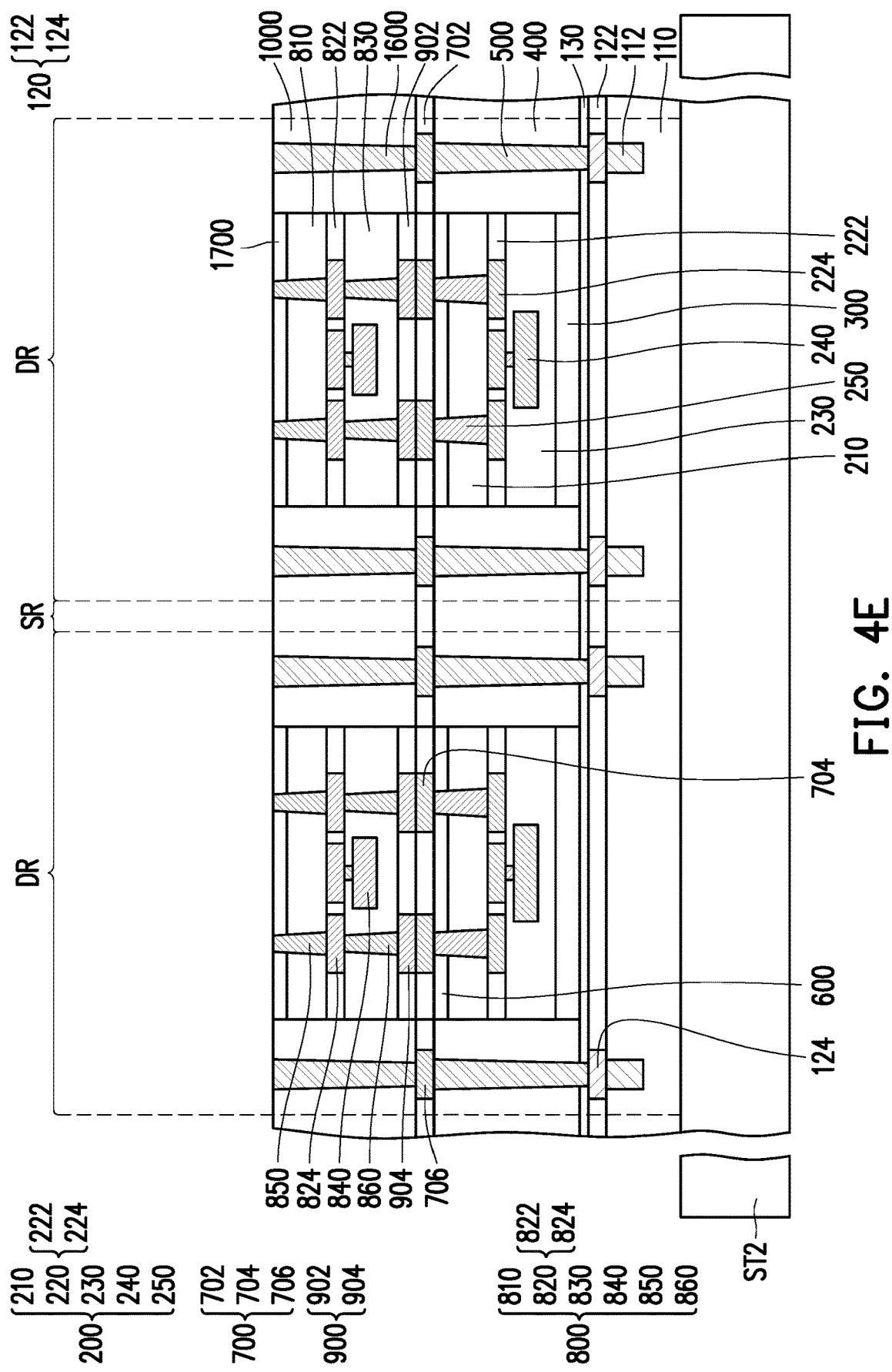

Referring to FIG. 4E, a protection layer 1700 is formed to fill the recesses R2. In some embodiments, the protection layer 1700 includes a molding compound, a molding underfill, or the like. Alternatively, the protection layer 1700 may be made of a polymeric material, such as polyimide, epoxy resin, acrylic resin, phenol resin, BCB, PBO, or other suitable polymer-based dielectric materials. In some embodiments, the protection layer 1700 may include fillers. Alternatively, the protection layer 1700 may be free of fillers. As illustrated in FIG. 4E, the protruding portion of each TSV 850 is laterally encapsulated by the protection layer 1700. In some embodiments, the protection layer 1700 may be formed by the following steps. First, a protection material layer (not shown) is formed in the recesses R2 and over the encapsulant 1000 and the TIVs 1600. Subsequently, a grinding or thinning process is performed on the protection material layer until the TSVs 850 and the TIVs 1600 are revealed. In some embodiments, the thinning process includes, for example, a mechanical grinding process, a CMP process, or the like. Similar to the process shown in FIG. 4C, during the thinning process, electrons may be generated and accumulated at the grinding surface. Again, the electrically grounded TIVs 1600 are able to create a path to deplete the accumulated electrons, so as to resolve the issue of corrosion derived from electron accumulation.

Figure 4F:
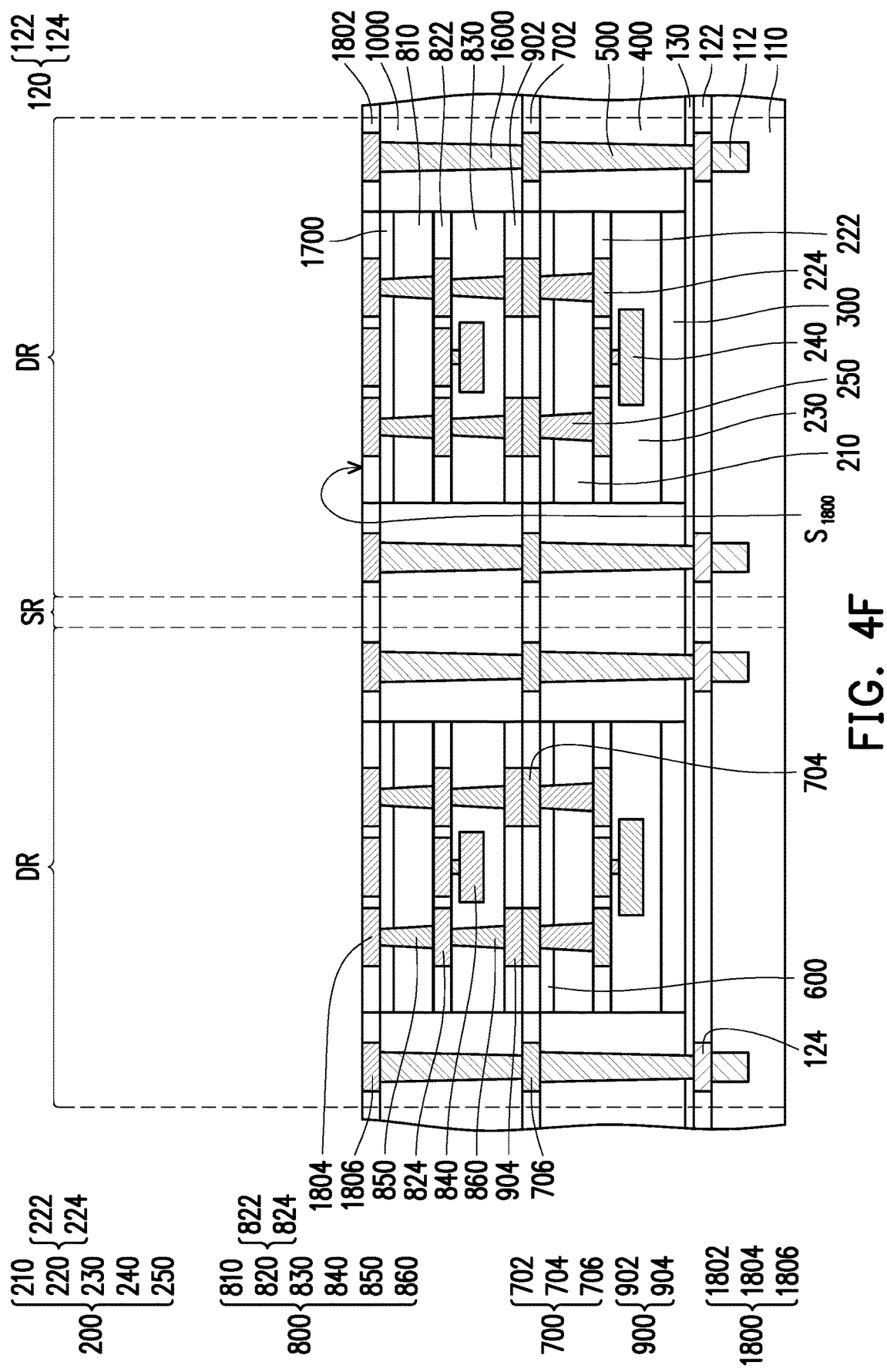

Referring to FIG. 4E and FIG. 4F, the structure is detached from the thinning stage ST2. Thereafter, a bonding layer 1800 is formed over the dies 800, the encapsulant 1000, and the TIVs 1600. In some embodiments, the bonding layer 1800 is formed on the dies 800 opposite to the bonding layer 900. In some embodiments, the bonding layer 1800 includes a dielectric layer 1802, a plurality of bonding pads 1804, and a plurality of connecting pads 1806. In some embodiments, the bonding pads 1804 and the connecting pads 1806 are embedded in the dielectric layer 1802. In some embodiments, the bonding pads 1804 are formed on the TSVs 850 of the dies 800 while the connecting pads 1806 are formed on the TIVs 1600. That is, the bonding pads 1804 are connected to the TSVs 850 and the connecting pads 1806 are connected to the TIVs 1600. For example, the connecting pads 1806 are electrically grounded through the TIVs 1600, the connecting pads 706, the TIVs 500, the alignment marks 124, and the contact vias 112. In some embodiments, the connecting pads 1806 may be optional.

In some embodiments, the dielectric layer 1802, the bonding pads 1804, and the connecting pads 1806 in FIG. 4F are respectively similar to the dielectric layer 702, the bonding pads 704, and the connecting pads 706 in FIG. 1I, so the detailed descriptions thereof are omitted herein. In some embodiments, a top surface of the dielectric layer 1802, top surfaces of the bonding pads 1804, and top surfaces of the connecting pads 1806 may be collectively referred to as a bonding surface $S_{1800}$. As shown in FIG. 4F, the top surface of the dielectric layer 1802, the top surfaces of the bonding pads 1804, and the top surfaces of the connecting pads 1806 are substantially located at the same level height to provide an appropriate bonding surface $S_{1800}$ for hybrid bonding.

Figure 4G:
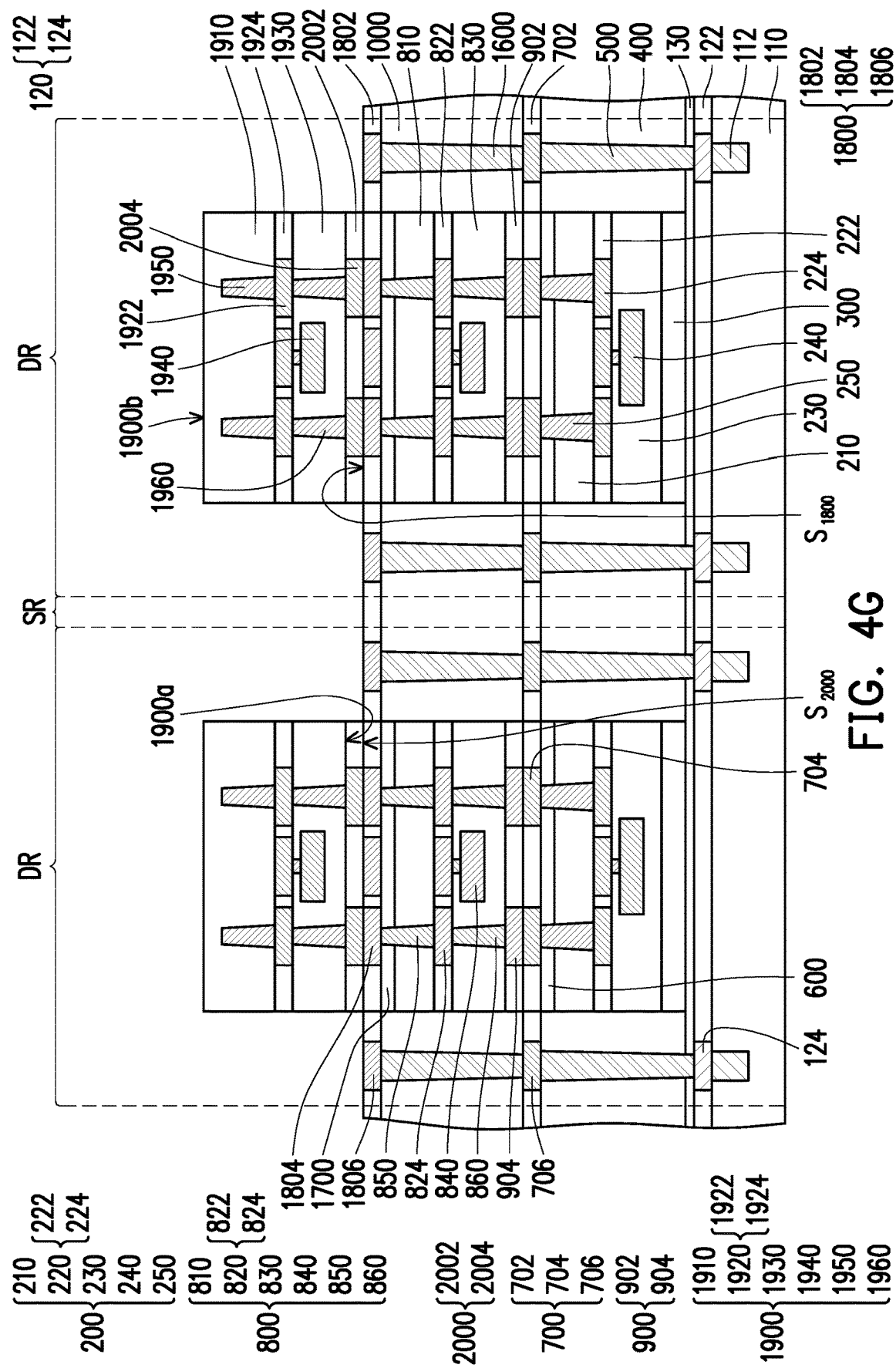

Referring to FIG. 4G, a plurality of dies 1900 are stacked over the dies 800. In some embodiments, each die 1900 includes a semiconductor substrate 1910, an interconnection structure 1920, a passivation layer 1930, a conductive pad 1940, a plurality of TSVs 1950, and a plurality of bonding vias 1960. In some embodiments, the interconnection structure 1920 includes an inter-dielectric layer 1922 and a plurality of conductive patterns 1924. In some embodiments, the semiconductor substrate 1910, the interconnection structure 1920, the passivation layer 1930, the conductive pad 1940, the TSVs 1950, and the bonding vias 1960 in FIG. 4G are respectively similar to the semiconductor substrate 810, the interconnection structure 820, the passivation layer 830, the conductive pads 840, the TSVs 850, and the bonding vias 860 in FIG. 1J, so the detailed descriptions thereof are omitted herein.

In some embodiments, the dies 1900 may be capable of performing storage functions. For example, the dies 1900 may be Dynamic Random Access Memory (DRAM), Resistive Random Access Memory (RRAM), Static Random Access Memory (SRAM), or the like. However, the disclosure is not limited thereto. In some alternative embodiments, the dies 1900 may be Central Process Unit (CPU) dies, Graphic Process Unit (GPU) dies, Field-Programmable Gate Array (FPGA), or the like.

In some embodiments, each die 1900 has an active surface 1900a and a rear surface 1900b opposite to the active surface 1900a. In some embodiments, prior to the placement of the dies 1900, a bonding layer 2000 is formed on the active surface 1900a of each die 1900. For example, the bonding layer 2000 is formed on the passivation layer 1930 and the bonding vias 1960 of the die 1900. In some embodiments, the bonding layer 2000 includes a dielectric layer 2002 and a plurality of bonding pads 2004 embedded in the dielectric layer 2002. In some embodiments, the bonding pads 2004 of the bonding layer 2000 are electrically connected to the bonding vias 1960. That is, the bonding vias 1960 electrically connect the interconnection structure 1920 and the bonding pads 2004 of the bonding layer 2000. The dielectric layer 2002 and the bonding pads 2004 in FIG. 4G are respectively similar to the dielectric layer 902 and the bonding pads 904 in FIG. 1J, so the detailed descriptions thereof are omitted herein.

In some embodiments, a bottom surface of the dielectric layer 2002 and bottom surfaces of the bonding pads 2004 may be collectively referred to as a bonding surface $S_{2000}$. As shown in FIG. 4G, the bottom surface of the dielectric layer 2002 and the bottom surfaces of the bonding pads 2004 are substantially located at the same level height to provide an appropriate bonding surface $S_{2000}$ for hybrid bonding.

As illustrated in FIG. 4G, the dies 1900 are individually placed over the corresponding dies 800 such that each die 1900 is bonded to the corresponding die 800 through the bonding layer 1800 and 2000. For example, the bonding layer 2000 is sandwiched between the bonding layer 1800 and the dies 1900. In some embodiments, the bonding layer 1800 is bonded to the bonding layer 2000 through a hybrid bonding process. The hybrid bonding process in FIG. 4G may be similar to the hybrid bonding process shown in FIG. 1J, so the detailed description thereof is omitted herein.

Figure 4H:
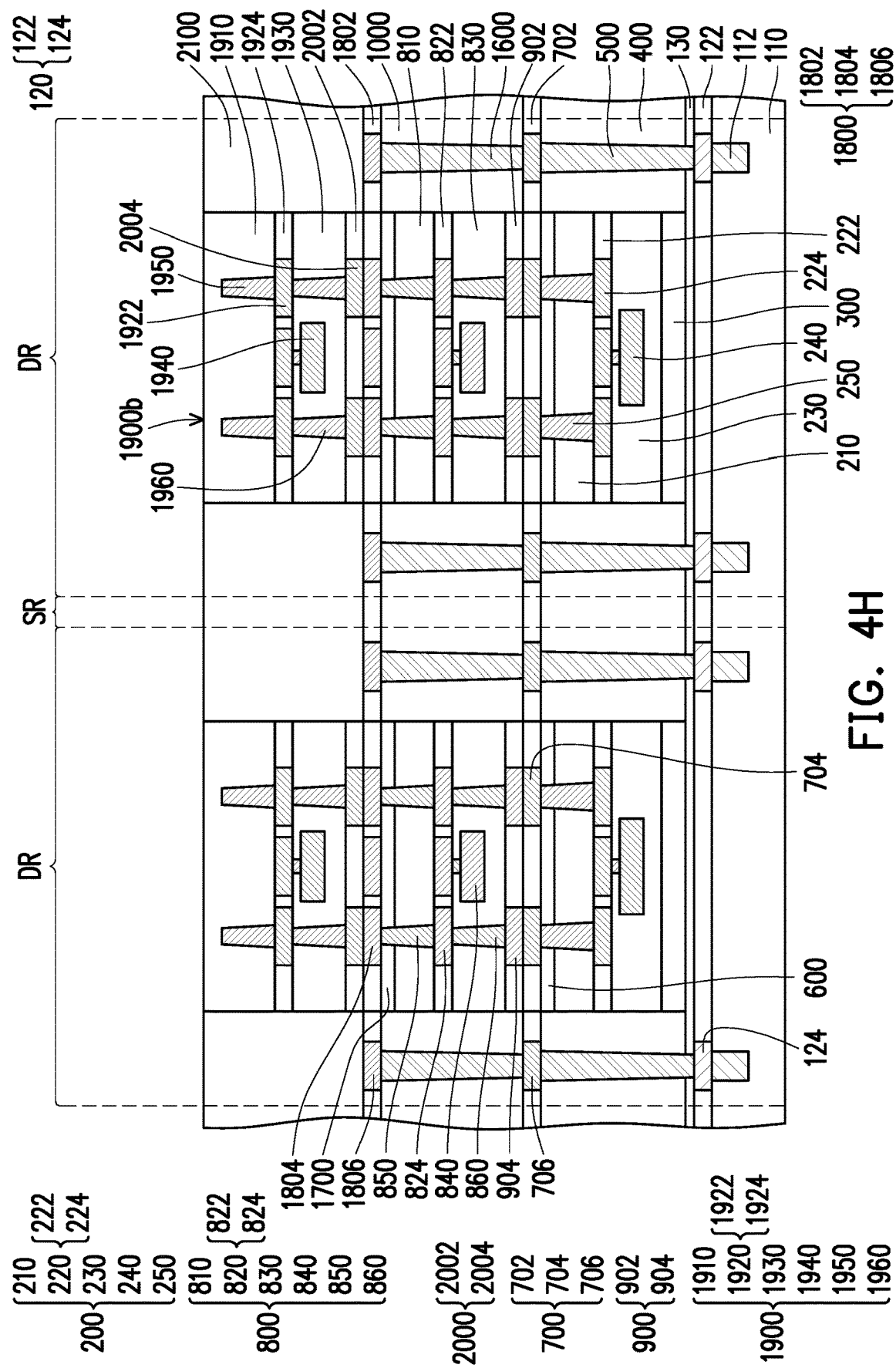

Referring to FIG. 4H, an encapsulant 2100 is formed over the bonding layer 1800 to laterally encapsulate the dies 1900 and the bonding layer 2000. That is, rear surfaces 1900b of the dies 1900 are substantially coplanar with a top surface of the encapsulant 2100 and the encapsulant 2100 covers sidewalls of the dies 1900 and the bonding layers 2000. In some embodiments, the encapsulant 2100 may be referred to as "gap fill oxide." In some embodiments, a material and a formation method of the encapsulant 2100 in FIG. 4H is similar to the encapsulant 1000 in FIG. 1K, so the detailed descriptions thereof is omitted herein.

Figure 4I:
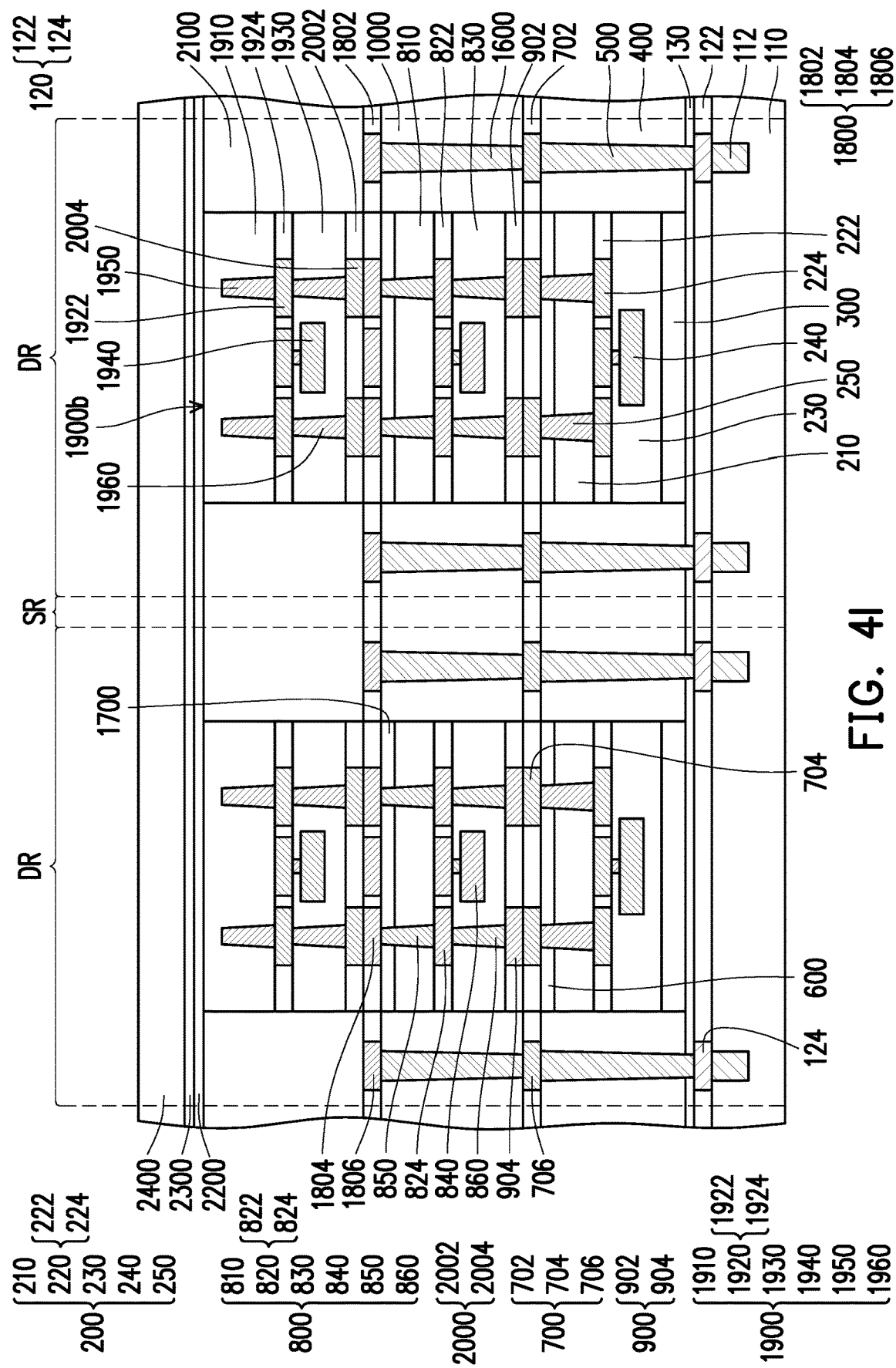

Referring to FIG. 4I, a dielectric layer 2200, a bonding layer 2300, and a carrier substrate 2400 are sequentially formed over the dies 1900 and the encapsulant 2100. In some embodiments, the dielectric layer 2200, the bonding layer 2300, and the carrier substrate 2400 in FIG. 4I are respectively similar to the dielectric layer 1100, the bonding layer 1200, and the carrier substrate 1300 in FIG. 1L, so the detailed descriptions thereof are omitted herein. In some embodiments, since the carrier substrate 2400 is in wafer form the process illustrated in FIG. 4I may be referred to as "wafer-to-wafer bonding."

Figure 4J:
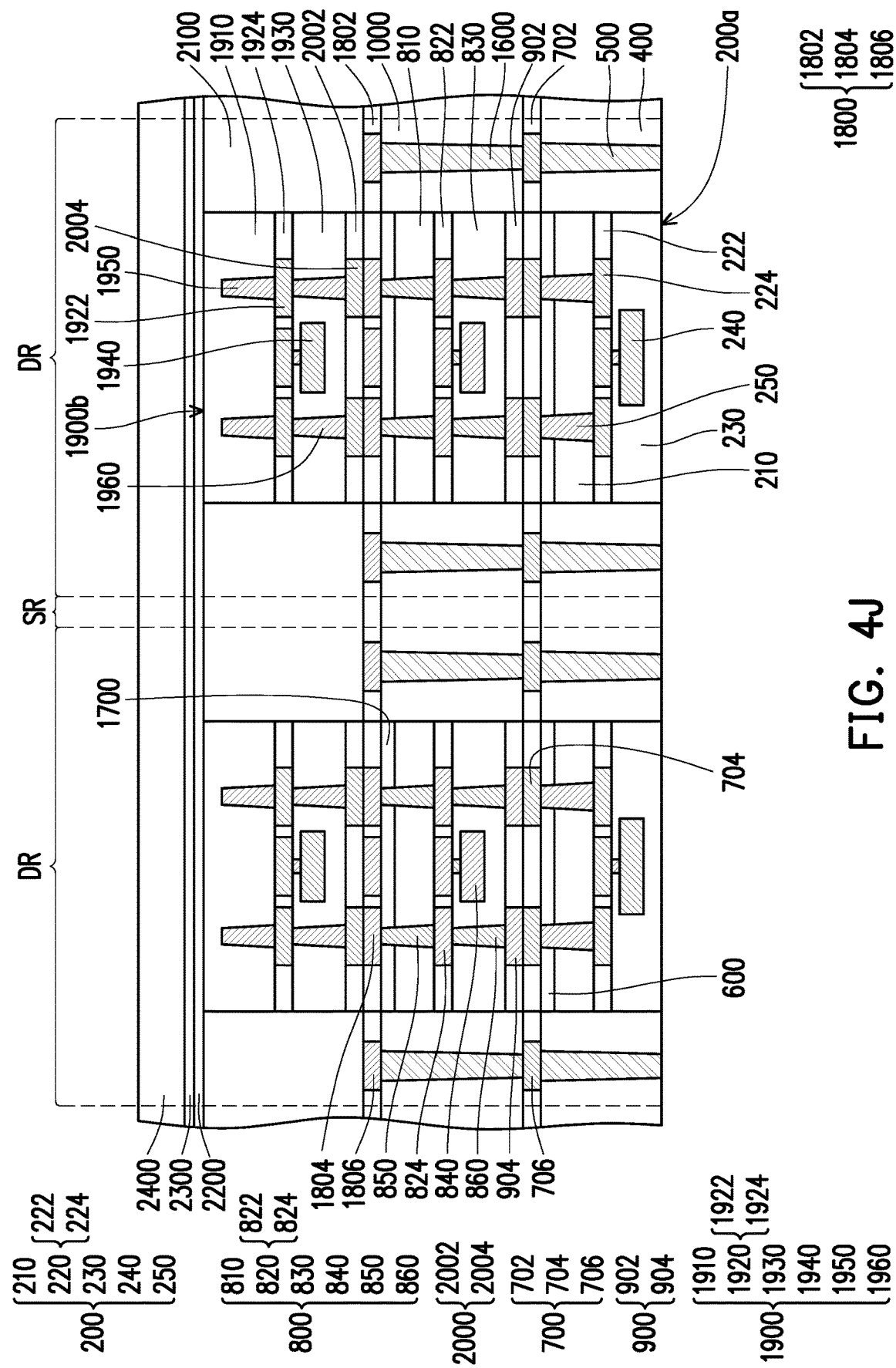

Referring to FIG. 4I and FIG. 4J, the semiconductor substrate 110, the contact vias 112, the alignment layer 120, the dielectric layer 130, the bonding layer 300, a portion of each TIV 500, and a portion of the encapsulant 400 are removed such that the encapsulant 400, the TIVs 500, and the active surface 200a of the die 200 are exposed. In some embodiments, these elements may be removed through a mechanical grinding process, a CMP process, or an etching process. In some embodiments, after the contact vias 112 are removed, the TIVs 500, the connecting pads 706, the TIVs 1600, and the connecting pads 1806 are no longer connected to a ground voltage. That is, after the contact vias 112 are removed, the TIVs 500, the connecting pads 706, the TIVs 1600, and the connecting pads 1806 are electrically floating.

Figure 4K:
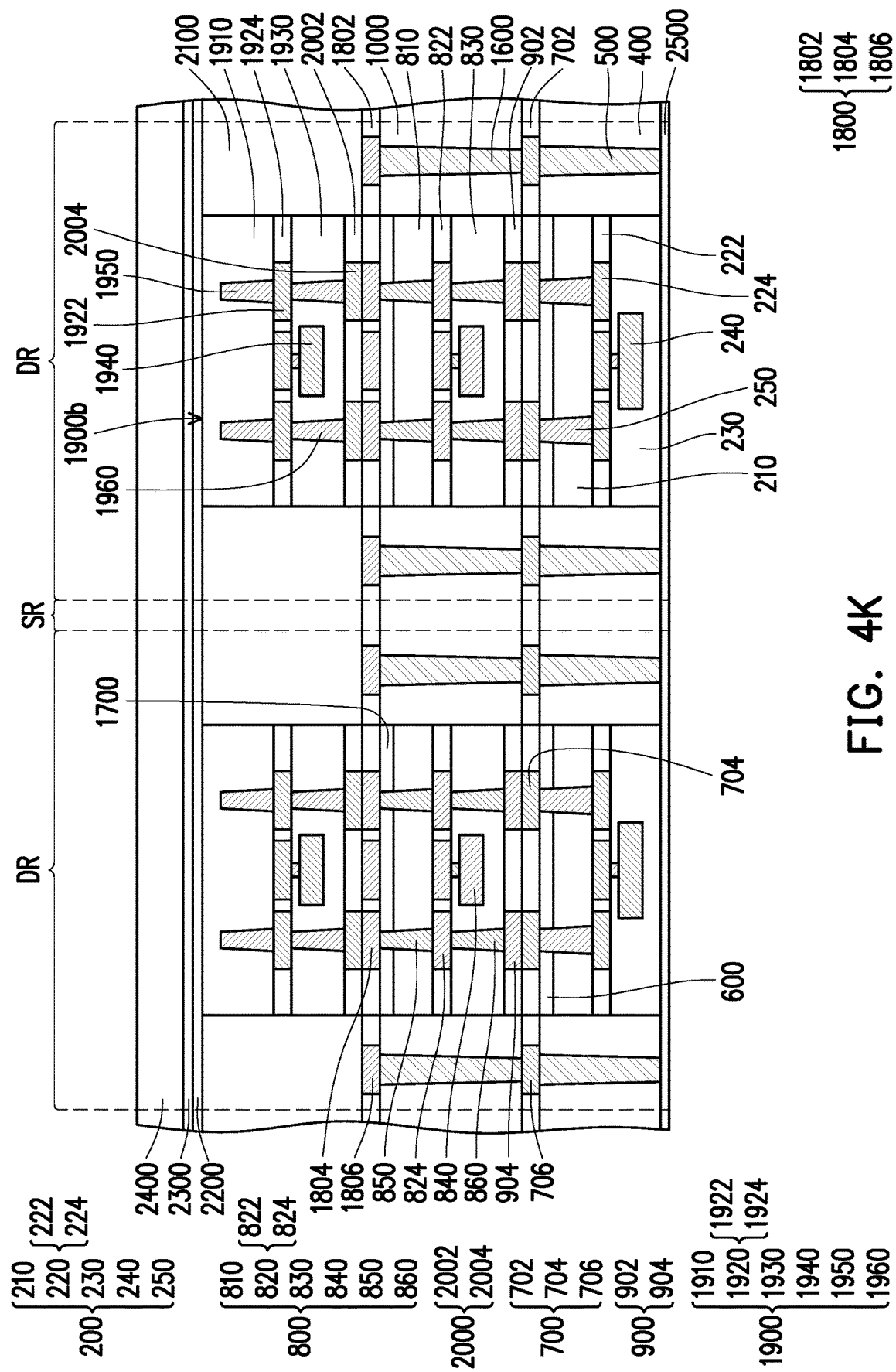

Referring to FIG. 4K, a dielectric layer 2500 is formed over the dies 200, the TIVs 500, and the encapsulant 400. In some embodiments, the dielectric layer 2500 in FIG. 4K is similar to the dielectric layer 1400 in FIG. 1N, so the detailed description thereof is omitted herein.

Figure 4L:
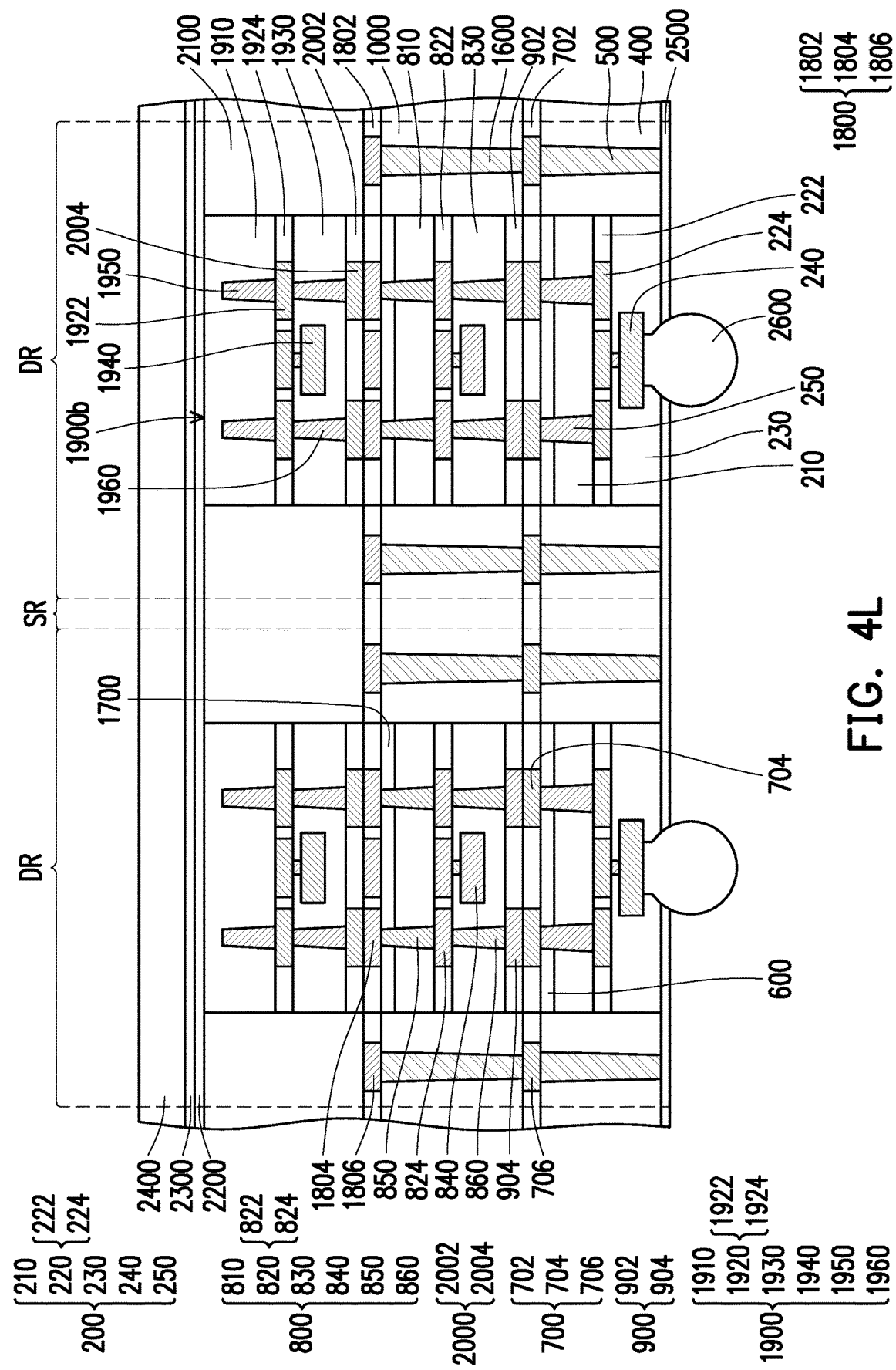

Referring to FIG. 4L, a plurality of conductive terminals 2600 is formed over the dielectric layer 2500. In some embodiments, the conductive terminals 2600 in FIG. 4L are similar to the conductive terminals 1500 in FIG. 1O, so the detailed descriptions thereof are omitted herein.

Figure 4M:
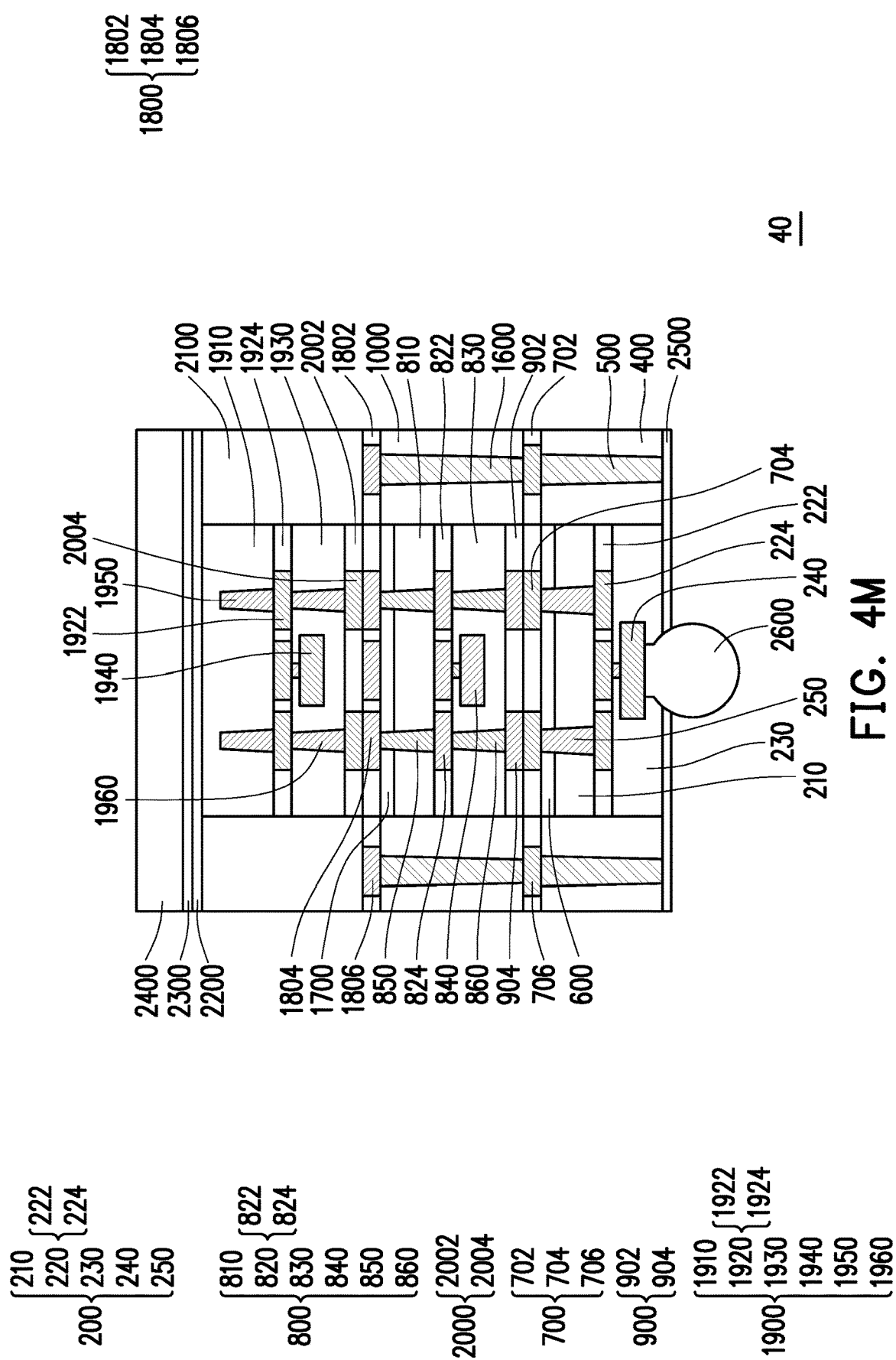

Referring to FIG. 4L and FIG. 4M, a singulation process is performed on the scribe line regions SR to form a plurality of packages 40. In some embodiments, the dicing process or the singulation process typically involves dicing with a rotating blade or a laser beam. In other words, the dicing or singulation process is, for example, a laser cutting process, a mechanical cutting process, or other suitable processes. As illustrated in FIG. 4M, the die 800 is stacked on the die 200 and the die 1900 is stacked on the die 800. In other words, multiple dies 200, 800, and 1900 are integrated into a single package 40. As such, the package 40 may be referred to as a "SOIC package." In some embodiments, the package 40 may be utilized in other modules/applications, such as CoWoS packaging, flip-chip packaging, InFO packaging, fan-out WLP, or the like.

Figure 5A:
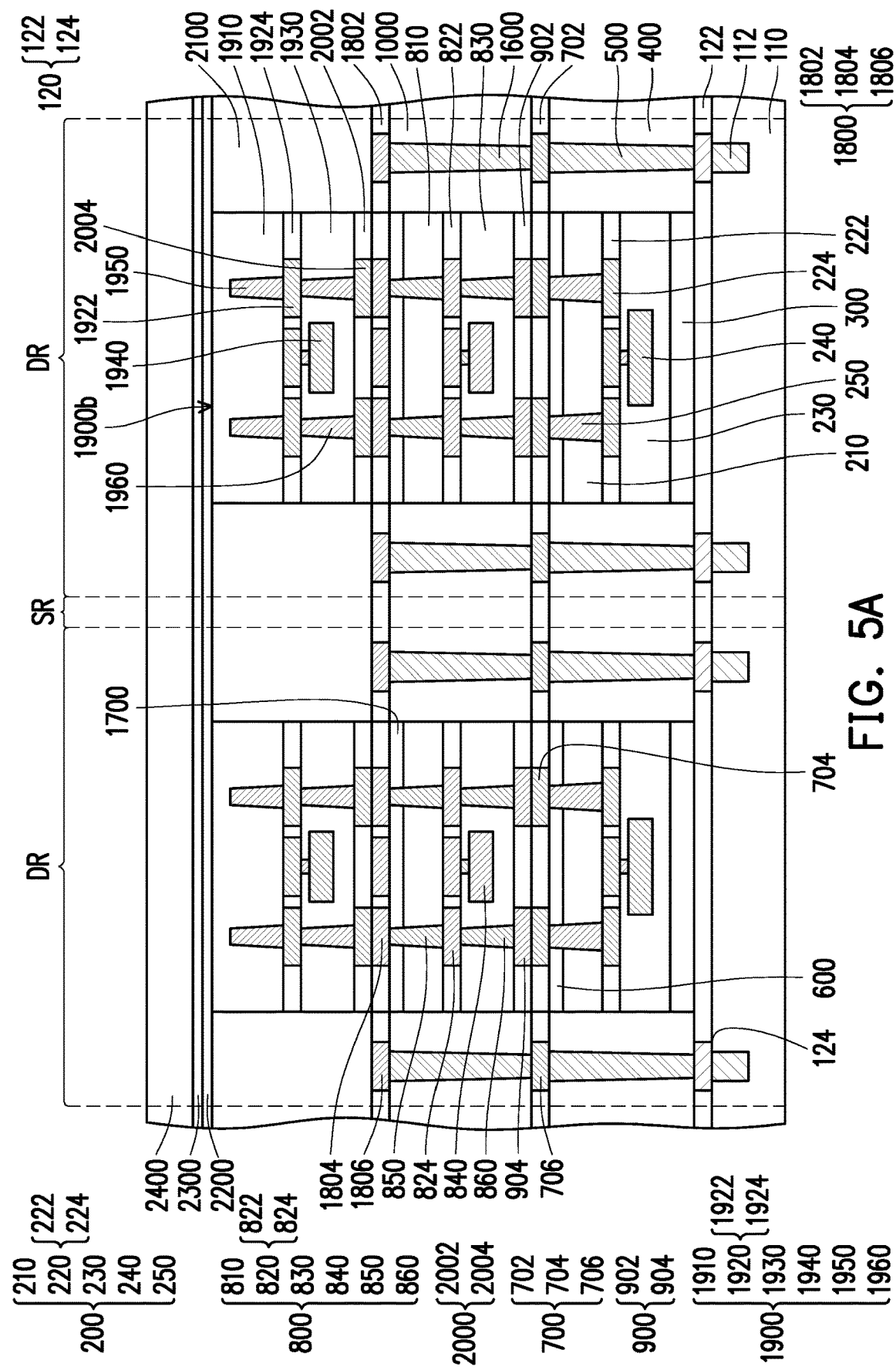
FIG. 5A to FIG. 5E are schematic cross-sectional views illustrating a manufacturing process of a package in accordance with some alternative embodiments of the disclosure.
Figure 5B:
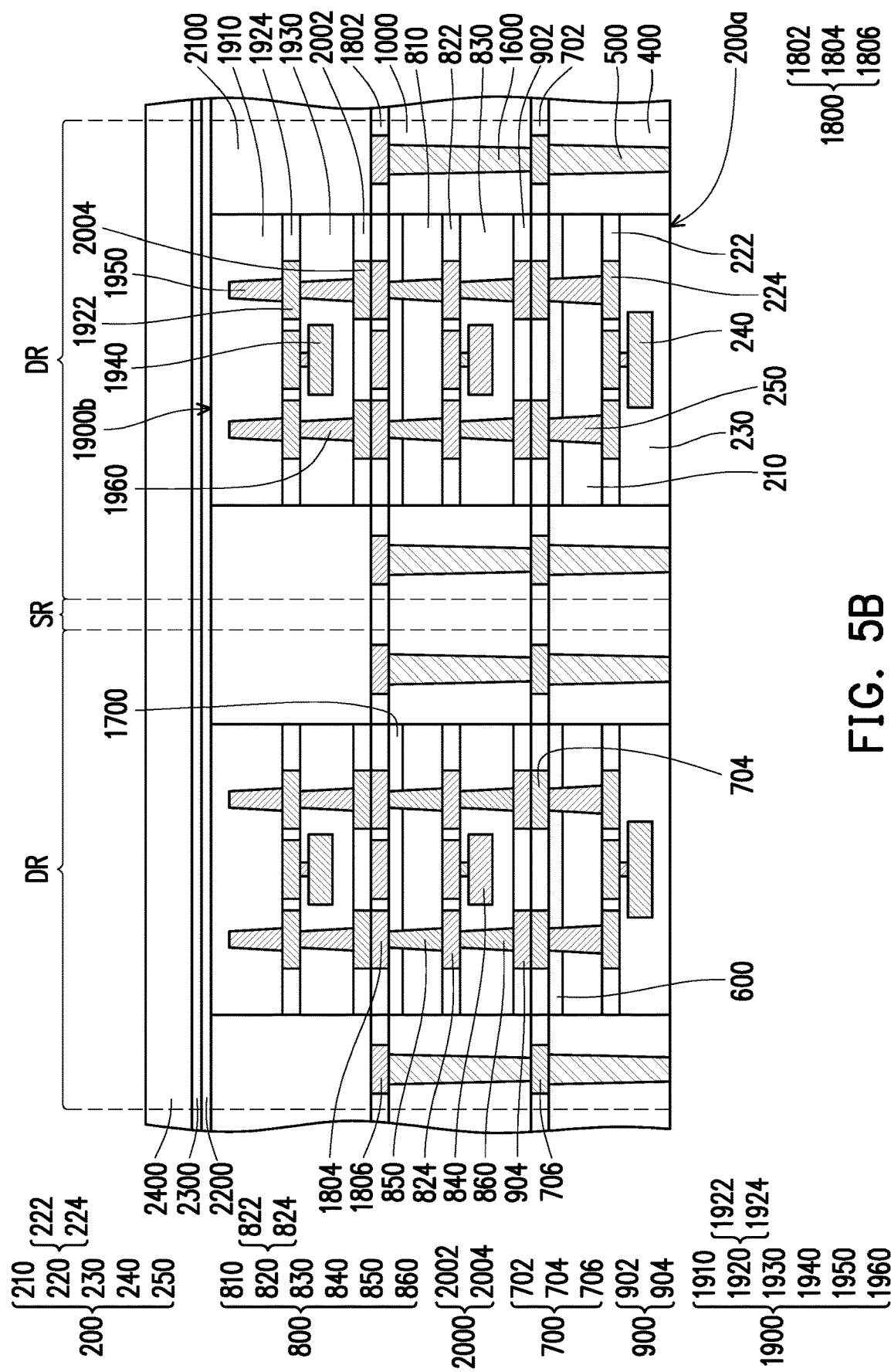
Figure 5C:
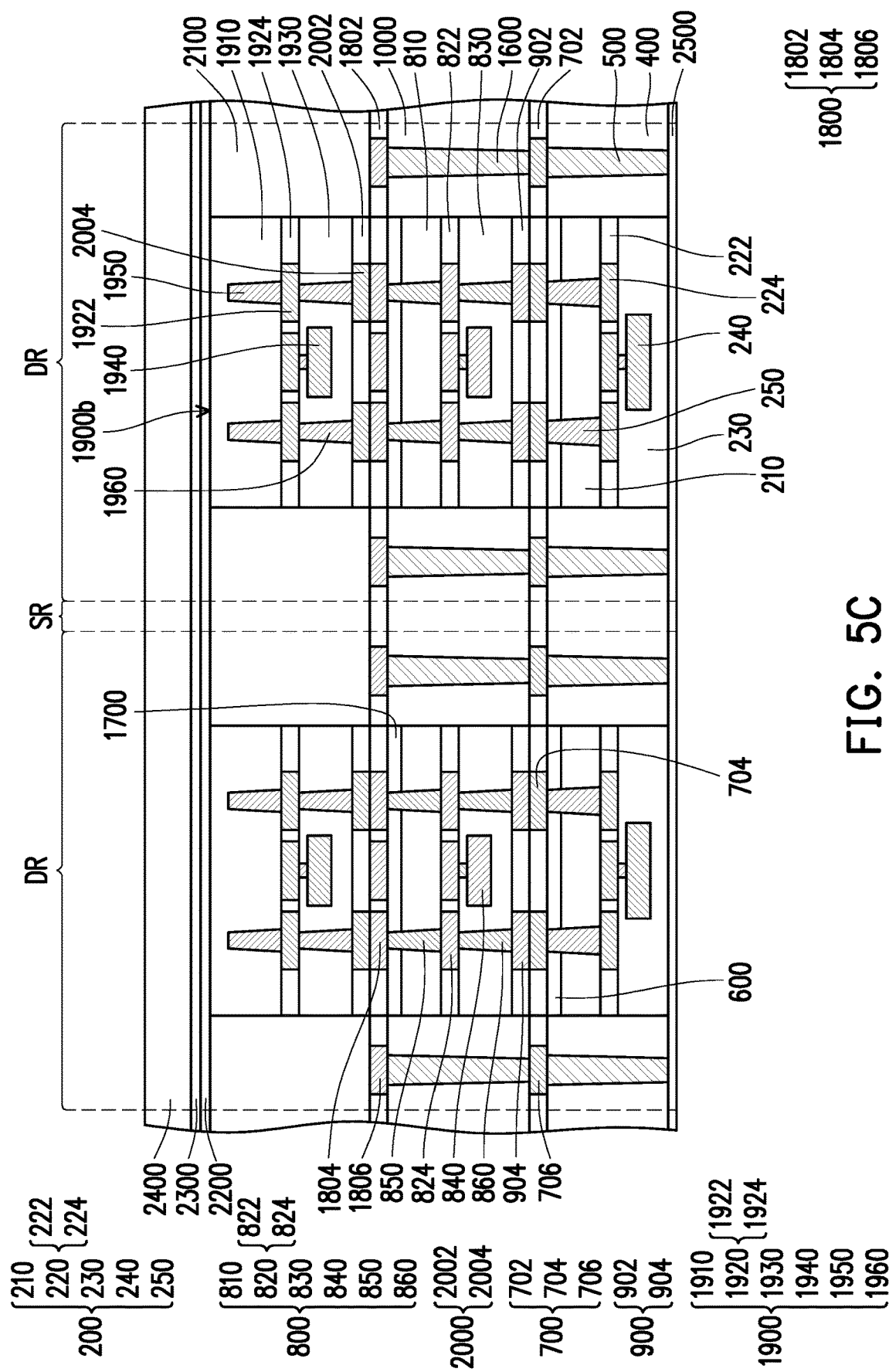
Figure 5D:
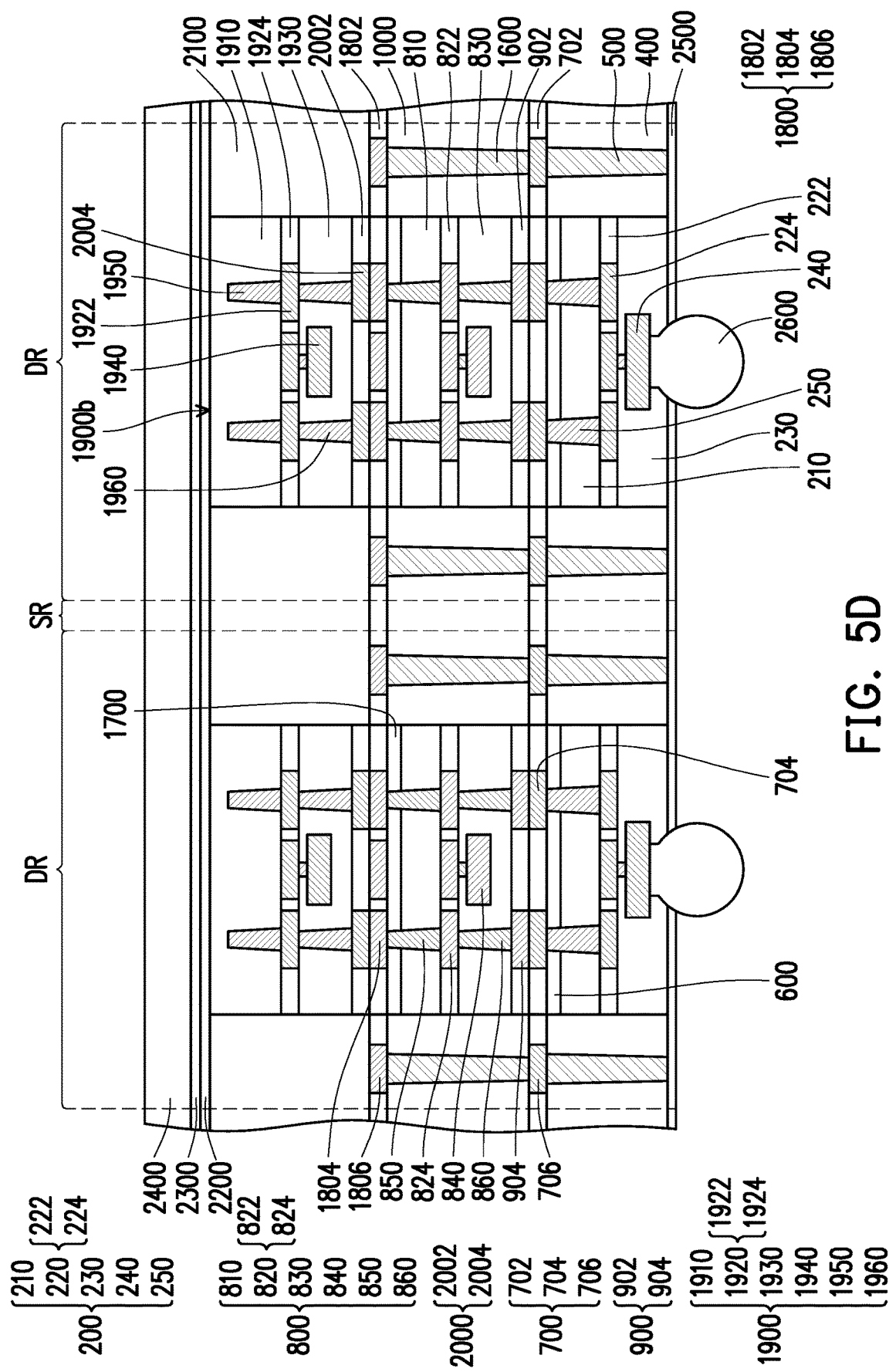

FIG. 5A to FIG. 5E are schematic cross-sectional views illustrating a manufacturing process of a package 50 in accordance with some alternative embodiments of the disclosure. Referring to FIG. 5A, the structure in FIG. 5A is similar to the structure in FIG. 4I, so similar components thereof are denoted by the same reference numeral and the detailed descriptions thereof are omitted herein. In other words, the structure in FIG. 5A may be obtained by performing the steps illustrated in FIG. 4A to FIG. 4I. However, the formation of the dielectric layer 130 is omitted in the manufacturing process of the structure in FIG. 5A. In other words, the differences between the structure in FIG. 5A and the structure in FIG. 4I are that the dielectric layer 130 is omitted and the alignment marks 124 are directly in contact with encapsulant 400 in FIG. 5A.

Figure 5E:
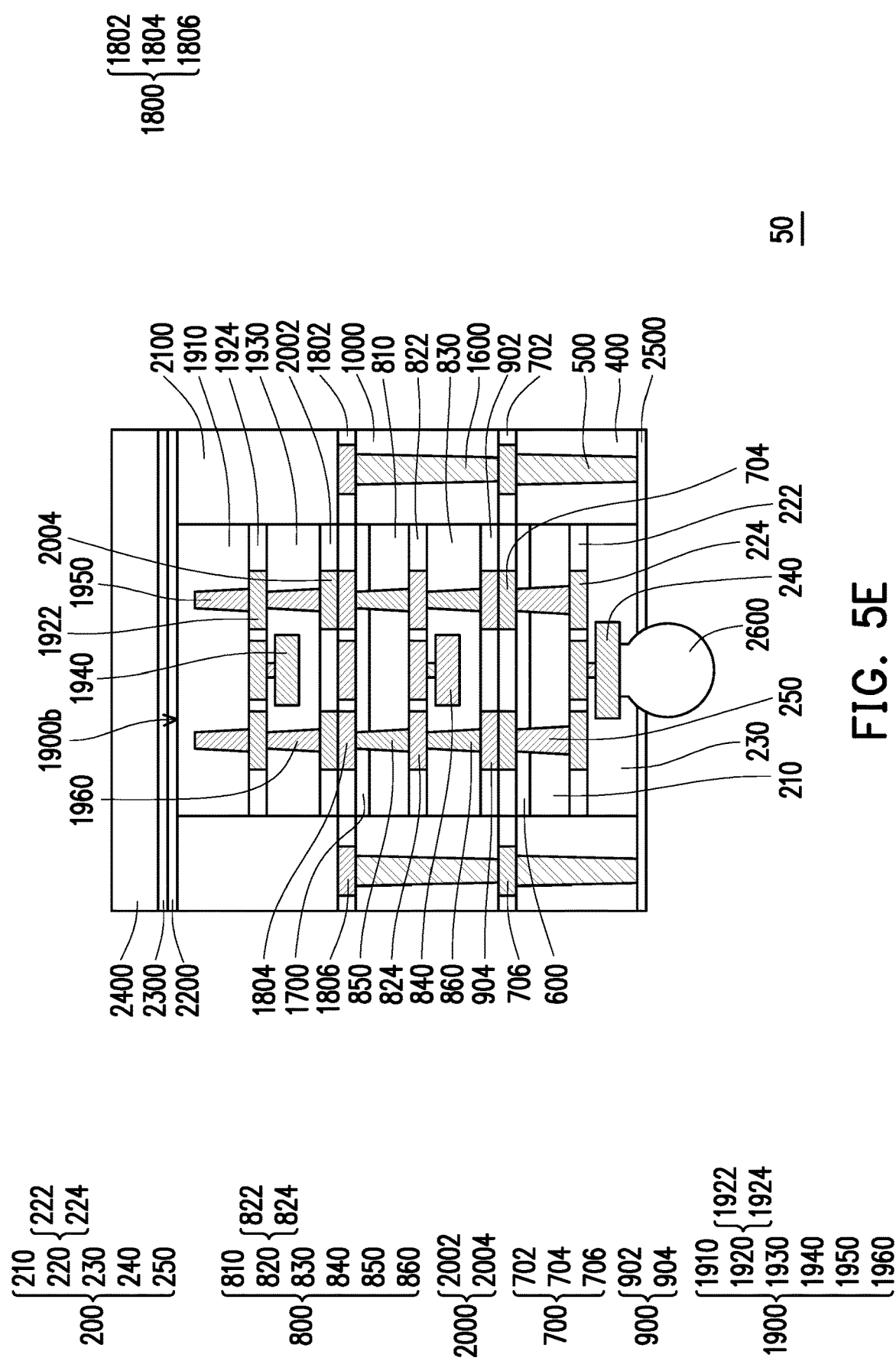

Referring to FIG. 5B to FIG. 5E, the steps in FIG. 5B to FIG. 5E are similar to the steps shown in FIG. 4J to FIG. 4M, so similar components thereof are denoted by the same reference numeral and the detailed descriptions thereof are omitted herein. Referring to FIG. 5E, a plurality of packages 50 is obtained. As illustrated in FIG. 5E, the die 800 is stacked on the die 200 and the die 1900 is stacked on the die 800. In other words, multiple dies 200, 800, and 1900 are integrated into a single package 50. As such, the package 50 may be referred to as a "SOIC package." In some embodiments, the package 50 may be utilized in other modules/applications, such as CoWoS packaging, flip-chip packaging, InFO packaging, fan-out WLP, or the like.

In accordance with some embodiments of the disclosure, a package includes a first die, a second die, a first encapsulant, first through insulating vias (TIV), a second encapsulant, and second TIVs. The second die is stacked on the first die. The first encapsulant laterally encapsulates the first die. The first TIVs are aside the first die. The first TIVs penetrate through the first encapsulant and are electrically floating. The second encapsulant laterally encapsulates the second die. The second TIVs are aside the second die. The second TIVs penetrate through the second encapsulant and are electrically floating. The second TIVs are substantially aligned with the first TIVs.

In accordance with some embodiments of the disclosure, a manufacturing method of a package includes at least the following steps. A semiconductor carrier having contact vais embedded therein is provided. The contact vias are electrically grounded. A first die is placed over the semiconductor carrier. The first die includes a first semiconductor substrate and first through semiconductor vias (TSV) embedded therein. The first die is laterally encapsulated by a first encapsulant. First through insulating vias (TIV) are formed in the first encapsulant. The first TIVs are electrically grounded through the contact vias. The first die, the first encapsulant, and the first TIVs are grinded until the first TSVs of the first die are exposed. A second die is stacked over the first die. The semiconductor carrier is removed.

In accordance with some alternative embodiments of the disclosure, a manufacturing method of a package includes at least the following steps. A semiconductor carrier having contact vias embedded therein is provided. The semiconductor carrier has die regions and scribe line regions located between two adjacent die regions. The contact vias are located in the scribe line regions and are electrically grounded. First dies are placed over the semiconductor carrier in the die regions. Each first die of the first dies includes a semiconductor substrate and through semiconductor vias (TSV) embedded therein. The first dies are laterally encapsulated by a first encapsulant. Through insulating vias (TIV) are formed in the first encapsulant. The TIVs are located in the scribe line regions and are electrically grounded through the contact vias. The first die, the first encapsulant, and the TIVs are grinded until the TSVs of the first dies are exposed. A second die is stacked over the first die. The semiconductor carrier is removed. A singulation process is performed to remove the TIVs located in the scribe line regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A manufacturing method of a package, comprising
providing a semiconductor carrier having contact vias embedded therein, wherein the contact vias are electrically grounded;
placing a first die over the semiconductor carrier, wherein the first die comprises a first semiconductor substrate and first through semiconductor vias (TSV) embedded therein;
laterally encapsulating the first die by a first encapsulant;
forming first through insulating vias (TIV) in the first encapsulant, wherein the first TIVs are electrically grounded through the contact vias;
grinding the first die, the first encapsulant, and the first TIVs until the first TSVs of the first die are exposed;
stacking a second die over the first die; and
removing the semiconductor carrier.

2. The method of claim 1, further comprising:
forming an alignment layer over the semiconductor carrier, wherein the alignment layer comprises alignment marks.

3. The method of claim 2, wherein the alignment marks are formed between and electrically connected to the contact vias and the first TIVs.

4. The method of claim 2, further comprising:
forming a dielectric layer between the alignment layer and the first encapsulant, wherein the first TIVs penetrate through the dielectric layer.

5. The method of claim 1, further comprising:
forming a first bonding layer over the first die, the first encapsulant, and the first TIVs; and
forming a second bonding layer over the second die, wherein the first bonding layer is hybrid bonded to the second bonding layer.

6. The method of claim 5, further comprising:
laterally encapsulating the second die and the second bonding layer by a second encapsulant; and
forming a carrier substrate over the second die and the second encapsulant.

7. The method of claim 1, wherein the second die comprises a second semiconductor substrate and second TSVs embedded therein, and the method further comprises:
laterally encapsulating the second die by a second encapsulant;
forming second TIVs in the second encapsulant, wherein the second TIVs are electrically grounded through the first TIVs and the contact vias;
grinding the second die, the second encapsulant, and the second TIVs until the second TSVs of the second die are exposed.

8. The method of claim 7, further comprising:
bonding a third die to the second die;
laterally encapsulating the third die by a third encapsulant; and
forming a carrier substrate over the third die and the third encapsulant.

9. The method of claim 1, wherein during the grinding of the first die, the first encapsulant, and the first TIVs, electrons generated from the grinding are travelled from a grinding surface to the contact vias through the first TIVs.

10. A manufacturing method of a package, comprising:
providing a semiconductor carrier having contact vias embedded therein, wherein the semiconductor carrier has die regions and scribe line regions located between two adjacent die regions, and the contact vias are located in the scribe line regions and are electrically grounded;
placing first dies over the semiconductor carrier in the die regions, wherein each first die of the first dies comprises a semiconductor substrate and through semiconductor vias (TSV) embedded therein;
laterally encapsulating the first dies by a first encapsulant;
forming through insulating vias (TIV) in the first encapsulant, wherein the TIVs are located in the scribe line regions and are electrically grounded through the contact vias;
grinding the first dies, the first encapsulant, and the TIVs until the TSVs of the first dies are exposed;
stacking a second die over the first die;
removing the semiconductor carrier; and
performing a singulation process to remove the TIVs located in the scribe line regions.

11. The method of claim 10, further comprising:
forming a first bonding layer over the first die, the first encapsulant, and the TIVs; and
forming a second bonding layer over the second die, wherein the first bonding layer is hybrid bonded to the second bonding layer.

12. The method of claim 11, further comprising:
laterally encapsulating the second die and the second bonding layer by a second encapsulant; and
forming a carrier substrate over the second die and the second encapsulant.

13. The method of claim 10, further comprising:
removing a portion of the semiconductor substrate of each first die to form recesses; and
forming a protection layer to fill the recesses.

14. A manufacturing method of a package, comprising
providing a semiconductor carrier having contact vias embedded therein, wherein the contact vias are electrically grounded;
placing a first die over the semiconductor carrier;
laterally encapsulating the first die by a first encapsulant;
forming first through insulating vias (TIV) in the first encapsulant, wherein the first TIVs are electrically grounded through the contact vias;
grinding the first die, the first encapsulant, and the first TIVs to generate electrons on grinding surfaces of the first die, the first encapsulant, and the first TIVs;
allowing the electrons to travel through the first TIVs to reach the contact vias of the semiconductor carrier;
stacking a second die over the first die; and
removing the semiconductor carrier such that the first TIVs are electrically floating.

15. The method of claim 14, further comprising:
forming an alignment layer over the semiconductor carrier, wherein the alignment layer comprises alignment marks.

16. The method of claim 15, wherein the alignment marks are formed between and electrically connected to the contact vias and the first TIVs.

17. The method of claim 15, further comprising:
forming a dielectric layer between the alignment layer and the first encapsulant, wherein the first TIVs penetrate through the dielectric layer.

18. The method of claim 14, further comprising:
forming a first bonding layer over the first die, the first encapsulant, and the first TIVs; and
forming a second bonding layer over the second die, wherein the first bonding layer is hybrid bonded to the second bonding layer.

19. The method of claim 18, further comprising:
laterally encapsulating the second die and the second bonding layer by a second encapsulant; and
forming a carrier substrate over the second die and the second encapsulant.

20. The method of claim 14, wherein the method further comprises:
laterally encapsulating the second die by a second encapsulant;
forming second TIVs in the second encapsulant, wherein the second TIVs are electrically grounded through the first TIVs and the contact vias;
grinding the second die, the second encapsulant, and the second TIVs to generate electrons on grinding surfaces of the second die, the second encapsulant, and the second TIVs; and
allowing the electrons to travel through the second TIVs and the first TIVs to reach the contact vias of the semiconductor carrier.

\* \* \* \* \*